US008481980B2

(12) United States Patent
Shichi et al.

(10) Patent No.: US 8,481,980 B2
(45) Date of Patent: Jul. 9, 2013

(54) ION SOURCE, ION BEAM PROCESSING/OBSERVATION APPARATUS, CHARGED PARTICLE BEAM APPARATUS, AND METHOD FOR OBSERVING CROSS SECTION OF SAMPLE

(75) Inventors: Hiroyasu Shichi, Tokyo (JP); Satoshi Tomimatsu, Kokubunji (JP); Kaoru Umemura, Tokyo (JP); Noriyuki Kaneoka, Hitachinaka (JP); Koji Ishiguro, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 202 days.

(21) Appl. No.: 12/108,037

(22) Filed: Apr. 23, 2008

(65) Prior Publication Data
US 2009/0230299 A1  Sep. 17, 2009

(30) Foreign Application Priority Data

Apr. 23, 2007 (JP) ................................ 2007-113358
Jun. 19, 2007 (JP) ................................ 2007-161691

(51) Int. Cl.
*G21K 5/10* (2006.01)
(52) U.S. Cl.
USPC ... 250/492.21; 250/288; 250/309; 250/492.1; 250/492.3; 315/111.01; 315/111.91
(58) Field of Classification Search
USPC .............. 250/288, 309, 492.1, 492.2, 492.22, 250/492.3; 315/111.01, 111.81, 111.91
See application file for complete search history.

(56) References Cited

U.S. PATENT DOCUMENTS

| | | | | |
|---|---|---|---|---|
| 5,055,696 A | * | 10/1991 | Haraichi et al. | 250/492.2 |
| 5,852,297 A | * | 12/1998 | Ishitani et al. | 250/492.21 |
| 6,781,125 B2 | | 8/2004 | Tokuda et al. | |
| 7,326,942 B2 | | 2/2008 | Shichi et al. | |
| 7,615,764 B2 | * | 11/2009 | Motoi et al. | 250/492.3 |
| 2005/0279952 A1 | * | 12/2005 | Ishitani et al. | 250/492.21 |
| 2006/0065854 A1 | | 3/2006 | Shichi et al. | |
| 2006/0093754 A1 | * | 5/2006 | Krueger et al. | 427/523 |
| 2006/0284115 A1 | | 12/2006 | Kaneoka et al. | |
| 2009/0321634 A1 | * | 12/2009 | Khursheed | 250/307 |
| 2012/0119086 A1 | * | 5/2012 | Shichi et al. | 250/309 |

FOREIGN PATENT DOCUMENTS

| | | |
|---|---|---|
| DE | 37 05 361 A1 | 8/1988 |
| DE | 10 2004 052 580 A1 | 5/2006 |
| EP | 1 936 653 A1 | 6/2008 |
| JP | 59-9500 U | 1/1984 |
| JP | 2-62039 | 3/1990 |

(Continued)

*Primary Examiner* — Michael Maskell
(74) *Attorney, Agent, or Firm* — Mattingly & Malur, PC

(57) ABSTRACT

An ion beam machining and observation method relevant to a technique of cross sectional observation of an electronic component, through which a sample is machined by using an ion beam and a charged particle beam processor capable of reducing the time it takes to fill up a processed hole with a high degree of flatness at the filled area. The observation device is capable of switching the kind of gas ion beam used for machining a sample with the kind of a gas ion beam used for observing the sample. To implement the switch between the kind of a gas ion beam used for sample machining and the kind of a gas ion beam used for sample observation, at least two gas introduction systems are used, each system having a gas cylinder a gas tube, a gas volume control valve, and a stop valve.

11 Claims, 38 Drawing Sheets

FOREIGN PATENT DOCUMENTS

| | | |
|---|---|---|
| JP | 7-312190 A | 11/1995 |
| JP | 2002-150990 | 5/2002 |
| JP | 2004-040129 | 2/2004 |
| JP | 2006-139917 A | 6/2006 |
| JP | 2007-250371 | 9/2007 |
| WO | 99/05506 | 2/1999 |

* cited by examiner (a)  (c)  (b)

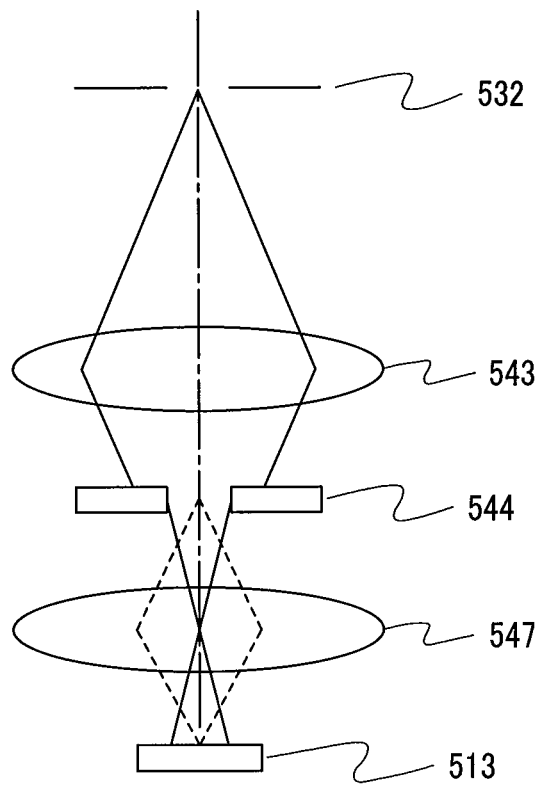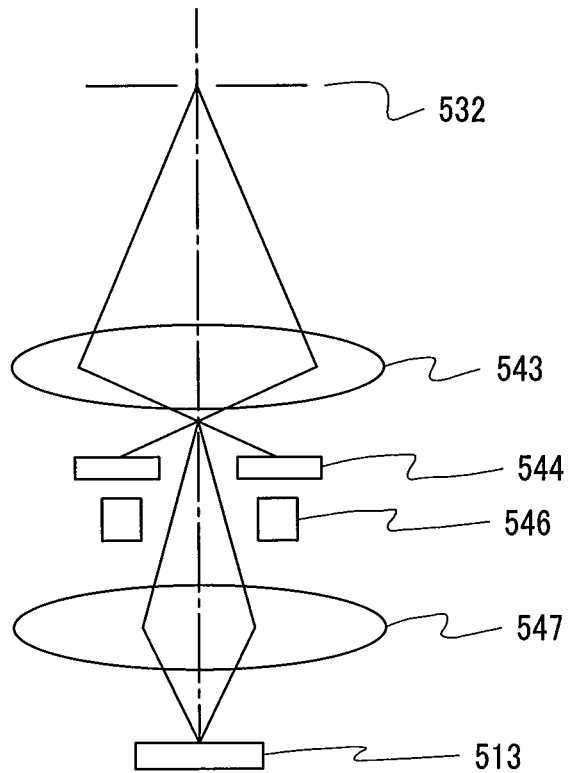

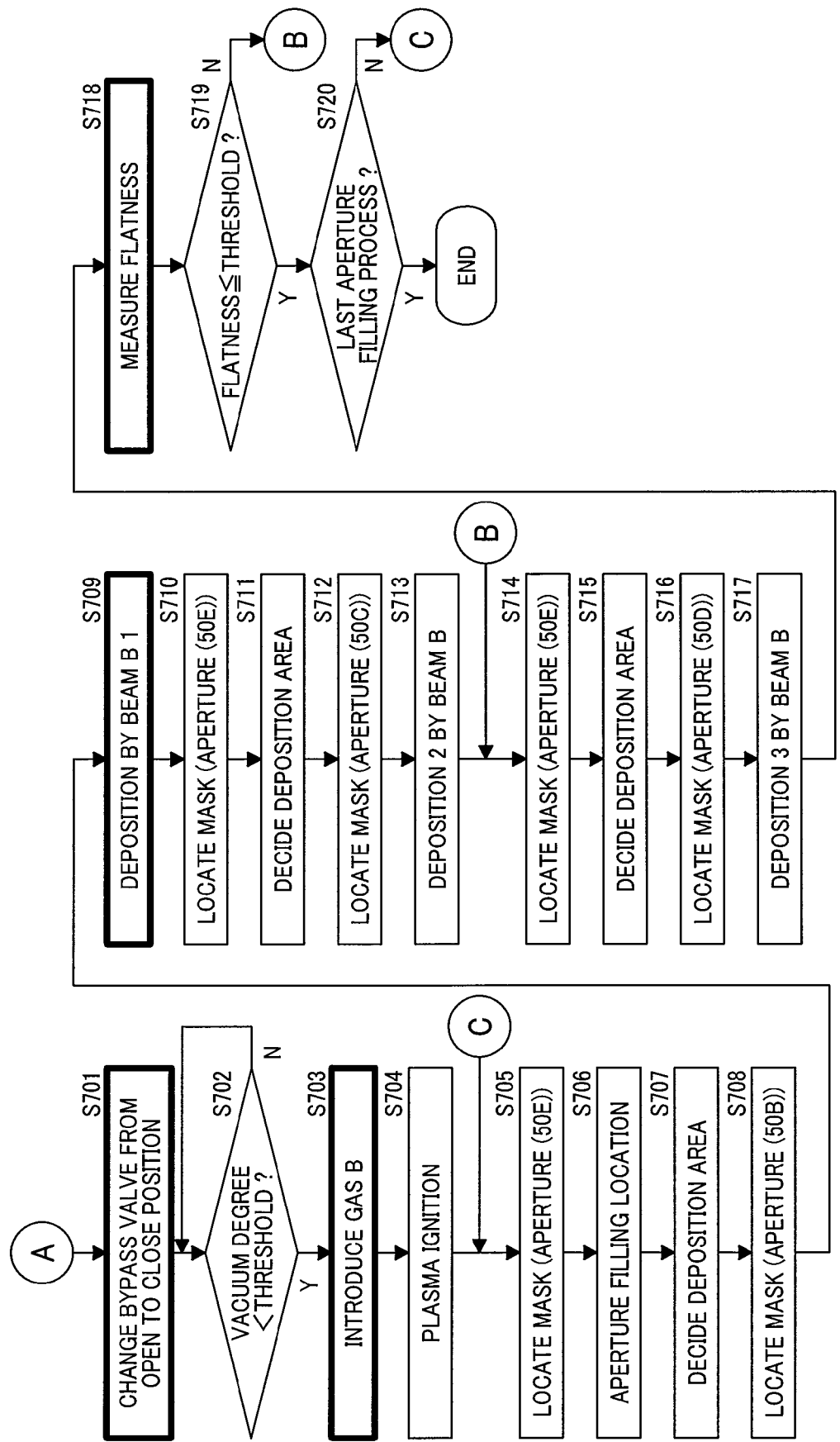

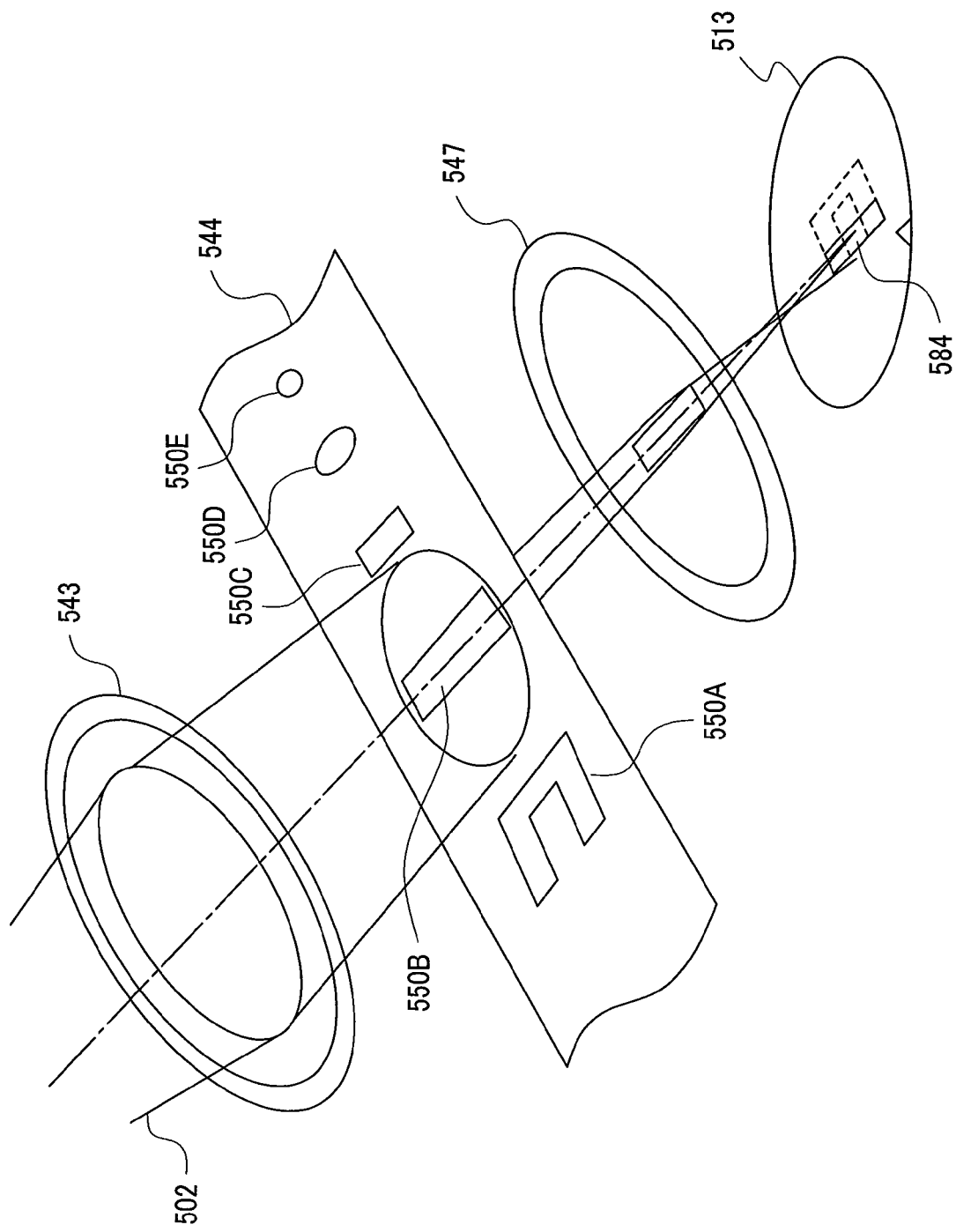

ION SOURCE, ION BEAM PROCESSING/OBSERVATION APPARATUS, CHARGED PARTICLE BEAM APPARATUS, AND METHOD FOR OBSERVING CROSS SECTION OF SAMPLE

CLAIM OF PRIORITY

The present invention claims priority from Japanese application JP 2007-113358 filed on Apr. 23, 2007 and JP 2007-161691 filed on Jun. 19, 2007, the contents of which are hereby incorporated by reference into this application.

BACKGROUND OF THE INVENTION

The present invention relates to an inspection and analysis technique for use in an electronic component such as semiconductor devices including a semiconductor memory, a microprocessor, a semiconductor laser, etc., and as a magnetic head; and, more particularly, to a technique of machining (or processing) and observation of the cross section of a sample by an ion beam.

High manufacturing yield is an important requisite for the manufacture of electronic components, such as semiconductor devices, e.g., semiconductor memories typically represented as dynamic random access memories (DRAMs), microprocessors and semiconductor lasers, and magnetic heads. This is because a fall of the product yield is directly linked to lower corporate profits. Therefore, early detection of and countermeasures to deal with defects, foreign matter and poor machining are indeed major issues to be resolved.

For example, electronic component manufacturing plants have put much effort on discovery of defects by careful inspection, and analysis of their causes. In actual electronic component manufacturing processes using wafers, the wafers in the course of machining are examined, the cause of abnormalities such as defects and foreign matter in circuit patterns is investigated, and methods to deal with them are considered.

Typically, high resolution scanning electron microscope (hereinafter abbreviated as SEM) is used to observe an abnormal spot on a sample. A composite FIB (Focused Ion Beam)-SEM is also currently used. The FIB-SEM machine irradiates FIB to form a square hole into a desired spot, and allows one to observe its cross section by SEM.

For instance, Japanese Patent Application Laid-Open No. 2002-150990 discloses a square hole for the observation and analysis of a defect or a foreign matter, in which an aperture is formed by using an FIB in the vicinity of an abnormal spot in a sample and cross section of the square hole is observed by SEM.

Moreover, International Patent Application Publication No. WO99/05506 discloses a technique for extracting a micro sample for TEM observation from a bulk sample by using an FIB and a probe.

Also, one example of ion beam processor related techniques in Japanese Patent Application Laid-Open No. 2-062039 discloses that reactive gas cylinders of plural kinds of gases are connected to an ionization chamber through valves, such that a reactive gas corresponding to the material of a layer to be processed of a sample is switched and supplied when a reactive etching process is executed locally in an ion beam irradiation unit.

In addition, Japanese Patent Application Laid-Open No. 2004-40129 discloses a technique for filling up a processed hole of a wafer from which a micro sample is extracted and returning the wafer to the production line.

SUMMARY OF THE INVENTION

However, the technique for machining a sample by using an ion beam to form a cross section and observing the cross section by SEM (or TEM) necessarily uses both the FIB irradiation system and the SEM irradiation system (or the TEM irradiation system). Therefore, a device thereof has a complicated structure and is difficult to control. This consequently causes device prices to increase. Spatial interference between nearby lenses is another problem as they are positioned to let ion beam and electron beam irradiate the same spot on a sample. This problem cannot be resolved without suffering from performance degradation of each beam.

It is certainly possible to use only one of them for sample observation. For example, the ion beam, not the electron beam, may irradiate the sample to be observed. However, if the same kind of ion used for machining is used for observation again, the sample surface is cut away, making it difficult to observe a desired cross section of the sample. Unfortunately, a new technique for sample machining and observation by ion beam has not been developed yet.

In addition, flatness level at a filled processed hole needs to be suppressed to at least a submicron level. Meanwhile, because the hole fill volume is a large value at an equivalent level to the processed hole volume, it takes a long period of time (from several minutes to several tens of minutes) to fill up the hole, and the amount of time it takes to return the wafer to a production line occupies a large portion of a series of processes.

In view of the foregoing problems, it is, therefore, an object of the present invention to provide an ion beam machining and observation method relevant to a technique of cross sectional observation of an electronic component, through which a sample is machined by using an ion beam withdrawn from the same ion source and one can observe a machined portion of the sample. Another object of the present invention is to provide a charged particle beam processor capable of reducing the time it takes to fill up a processed hole yet ensuring a high degree of flatness at a filled hole area.

To achieve the above objects, there is provided a cross sectional observation device, which does not use an electron beam for the observation but irradiates at least two kinds of gas ions with different mass numbers onto a sample and which is capable of switching the kind of a gas ion beam used for machining a sample with the kind of a gas ion beam used for observing the sample.

An ion source for realizing the switch between the kind of a gas ion beam used for sample machining and the kind of a gas ion beam used for sample observation includes at least two gas introduction systems, each system having a gas cylinder, a gas tube, a gas volume control valve, and a stop valve. The gas volume control valve of each system can set up gas pressure conditions for a vacuum chamber, and the stop valve of each system serves to switch the kind of gas being introduced into the vacuum chamber.

Particularly, when the ion beam machining and observation device of the present invention irradiates a gas ion beam to process a sample, it projects a hole shape of an aperture mask inside an ion beam irradiation column into a sample shape, such that a high-speed machining can be possible.

Moreover, to reduce the amount of a sample being cut out at the time of cross sectional observation, the ion beam machining and observation device of the present invention includes a mechanism for mass-separating a gas ion beam emitted from an ion source, and executes a control operation to prevent an ion having a relatively large mass number from reaching the sample when it irradiates an ion having a relatively small mass number.

A method of machining and observing cross section of a sample includes the steps of: irradiating an ion having a relatively large mass number to form a roughly vertical cross section to the surface of a sample; and irradiating an ion having a relatively small mass number onto the cross section for observation thereof.

Therefore, the present invention addresses the deficiencies of the related art by providing a device suitable for cross sectional observation, which does not use an electron beam as in the art but uses an ion beam with a mass number smaller than that of an ion beam irradiated for cross sectional machining.

The following will now go through the list of characteristic embodiments of the present invention.

(1) An ion source of the present invention includes a vacuum chamber and a gas supply mechanism to introduce gas into the vacuum chamber, wherein gas ions are produced in the vacuum chamber, and the gas supply mechanism includes at least two gas introduction systems, each system having a gas cylinder, a gas tube, a gas volume control valve, and a stop valve, the gas volume control valve of each system being capable of setting up gas pressure conditions for a vacuum chamber, and the stop valve of each system being capable of switching the kind of gas being introduced into the vacuum chamber.

Preferably, the ion source with the above structure generates gas ions by gas discharge, and includes a control device having a function to memorize two or more gas discharge voltages and capable of switching the gas discharge voltages. Here, the kind of gas is switched with the help of the stop valve and a switching operation of the discharge voltages.

In the ion source with the above structure, one of the gas introduction systems supplies any one of argon gas, xenon, krypton gas, neon gas, oxygen gas, and nitrogen gas, while the other gas introduction system supplies either hydrogen gas or helium gas.

(2) An ion beam machining and observation device of the present invention includes an ion source including a vacuum chamber and a gas supply mechanism to introduce gas into the vacuum chamber and generating gas ions in the vacuum chamber; a sample chamber for keeping a sample; and an ion beam irradiation column connected to the vacuum chamber to extract an ion beam from the ion source, and irradiate the ion beam onto the sample, wherein the gas supply mechanism includes at least two gas introduction systems, each system having a gas cylinder, a gas tube, a gas volume control valve, and a stop valve, the gas volume control valve of each system being capable of setting up gas pressure conditions for a vacuum chamber, and the stop valve of each system being capable of switching the kind of gas being introduced into the vacuum chamber and switching between the kind of a gas ion beam used for machining the sample and the kind of a gas ion beam used for observing the sample.

In the ion beam machining and observation device with the above structure, the ion source generates gas ions by gas discharge, and has a control device having a function to memorize at least two or more gas discharge voltages and capable of switching the gas discharge voltages. Here, the kind of the gas ion beam is switched with the help of the stop valve and a switching operation of the discharge voltages.

Preferably, when the ion beam machining and observation device with the above structure irradiates a gas ion beam to process a sample, it projects a hole shape of a mask installed in the ion beam irradiation column into a sample.

Preferably, when the ion beam machining and observation device with the above structure irradiates a gas ion beam to observe the sample, it converges an ion beam emitted from the ion source onto a sample in a dot-like pattern.

(3) Another ion beam machining and observation device of the present invention includes an ion source capable of generating at least two kinds of gas ions having different mass numbers, and an ion beam irradiation column for emitting a gas ion beam from the ion source and irradiating the gas ion beam onto a sample, wherein the ion beam irradiation column includes a mechanism for mass-separating the gas ion beam emitted from the ion source so that, among the mass separated gas ions, an ion with a relatively large mass number is used for machining a sample cross section while an ion with a relatively small mass number is used for observing the cross section of the sample, and the ion with a relatively large mass number is controlled not to reach the sample when the ion with a relatively small mass number is irradiated onto the sample.

In the ion beam machining and observation device with the above structure, the ion source can introduce two or more kinds of gas at the same time.

In the ion beam machining and observation device with the above structure, the ion beam irradiation column includes at least two kinds of masks having an aperture to define the shape of the gas ion beam, and a plate having the aperture used for irradiating the gas with the relatively large mass number is thicker than a plate having the aperture used for irradiating the gas with the relatively small mass number.

In the ion beam machining and observation device with the above structure, the ion having a relatively large mass number is a gas ion containing at least one kind among argon, xenon, krypton, neon, oxygen, and nitrogen, while the ion having a relatively small mass number is either a hydrogen gas ion or a helium gas ion, or a mixed gas ion.

(4) Still another ion beam machining and observation device of the present invention includes an ion source including a vacuum chamber and a gas supply mechanism to introduce gas into the vacuum chamber and generating gas ions in the vacuum chamber by gas discharge; and an ion beam irradiation column extracting a gas ion beam from the ion source, and irradiating the gas ion beam onto a sample, wherein the gas supply mechanism includes at least two gas introduction systems, one gas introduction system for supplying a first gas and the other gas introduction system for supplying a second gas, and each gas introduction system including a switching means for switching the kind of gas to be supplied from the gas introduction system to the vacuum chamber according to whether the gas ion beam is used for sample machining or sample observation.

In the ion beam machining and observation device with the above structure, the switching means includes a control device having a function to memorize at least two or more gas discharge voltages and capable of switching the gas discharge voltages. As such, the kind of the gas is switched based on a switching operation of the discharge voltages.

In the ion beam machining and observation device with the above structure, the first gas contains at least any one of argon, xenon, krypton, neon, oxygen, and nitrogen, while the second gas is either hydrogen gas or helium gas, or mixed gas.

(5) A sample cross section observation method of the present invention, where a gas ion beam emitted from an ion source capable of generating at least two or more kinds of gas ions with different mass numbers is irradiated onto a sample, includes the steps of: irradiating a gas ion having a relatively large mass number among at least the two or more kinds of gas ions, so as to form a roughly vertical cross section to the surface of a sample; and irradiating a gas ion having a relatively small mass number onto the cross section to be observed.

In the sample cross section observation method demonstrated above, for cross sectional observation the ion with a relatively small mass number is irradiated at a lower current than a maximum current used for irradiating the ion with a relatively large mass number.

The sample cross section observation method demonstrated above includes the steps of: simultaneously generating at least two kinds of gas ions by the ion source; mass-separating at least the two kinds of gas ions with different mass number from each other and irradiating a gas ion beam having a relatively large mass number onto a sample to process a roughly vertical cross section to the sample surface; and changing mass-separating conditions to irradiate a gas ion beam having a relatively small mass number onto the cross section to be observed.

In the sample cross section observation method demonstrated above, the ion having a relatively large mass number is a gas ion containing at least any one of argon, xenon, krypton, neon, oxygen, and nitrogen, while the ion having a relatively small mass number is either a hydrogen gas ion or a helium gas ion, or a mixed gas ion.

Another aspect of the present invention provides a charged particle beam device including: a charged particle beam generating source; a charged particle beam optical system for focusing and irradiating a charged particle beam onto a sample; a holder for keeping the sample; and a gas gun, wherein a material gas of a charged particle beam used for extracting a micro-sample piece is switched with a material gas used for a volume layer including a hole fill processing following the extraction of a micro-sample piece.

Therefore, the ion beam machining and observation technique according to the present invention can be advantageously used for observing a cross section of an electronic component such as semiconductor devices including a semiconductor memory, a microprocessor, a semiconductor laser, etc., and a magnetic head, by using ion beams extracted from the same ion source to process a sample and to observe a machined portion of the sample. Moreover, the present invention technique is capable of reducing the amount of time it takes to fill up a processed hole, while ensuring a high degree of flatness at a filled hole area.

BRIEF DESCRIPTION OF THE DRAWINGS

FIG. 16A shows an ion beam in a projection mode;

FIG. 16B shows an ion beam in an observation mode;

FIGS. 19A and 19B illustrate a flow chart describing a sequence of procedures starting from extracting a defect and a sample to returning the sample with the defect extracted to the line;

FIG. 27 shows part of the machining optical system shown in FIG. 13 including a linear projection beam;

FIG. 36, which comprises

FIG. 37, which comprises

FIG. 38, which comprises

FIG. 39, which comprises

DESCRIPTION OF SPECIFIC EMBODIMENTS

Hereinafter, preferred embodiments of the present invention will be set forth in detail with reference to the accompanying drawings so that those skilled in the art can easily carry out the invention.

Embodiment 1

Figure 1:
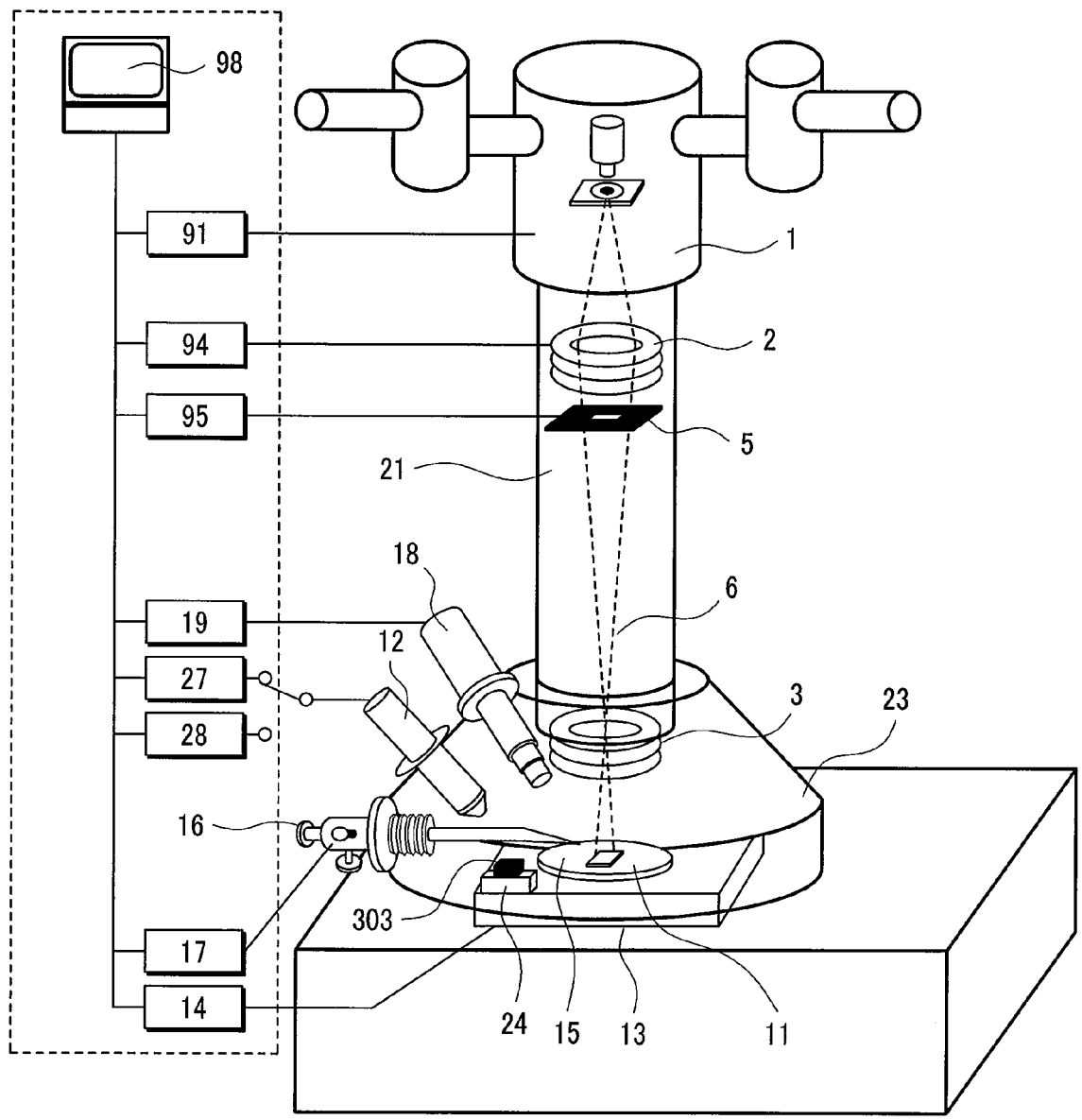
FIG. 1 is a drawing to explain the configuration of an ion beam machining and observation device used for machining, according to a first embodiment of the present invention.

FIG. 1 illustrates an ion beam machining and observation device according to one embodiment of the present invention. Particularly, the device of this embodiment is capable of irradiating two kinds of gas ions onto a sample by using a duoplasmatron 1 as a plasma ion source. In general, brightness of the plasma ion source is lower than brightness of a liquid metal ion source such as Ga by at least 2 to 3 orders of magnitude. Therefore, in case of this embodiment a stencil mask 5 having a predetermined shape aperture is inserted into the mid course of an ion beam irradiation system inside an ion beam column 21, and the aperture shape is projected onto a sample to obtain a projected beam for use. Preferably, inert gases or the kind of an element like oxygen and nitrogen may be chosen as the kind of the ion for the ion source such that electrical properties of a device are not affected thereby, and defects are much less likely to occur even when a completely machined wafer by using an ion beam is returned to the production line.

A vacuum sample chamber 23 is disposed in the lower part of the ion beam column 21, and a first sample stage 13 on which a sample 11 is placed, a secondary particle detector 12, and a precursor gas dispenser 18 are housed in the vacuum sample chamber 23. The device of this embodiment also includes a probe 15 for delivering a sample piece extracted from the sample 11 on the first sample stage 13 by using ion beam machining, a manipulator 16 for driving the probe 15, and a second sample stage 24 on which a micro sample 303 is placed. Needless to say, inside the ion beam column 21 is maintained under vacuum.

A control section for the ion beam machining and observation device is constituted by a duoplasmatron controller 91, a lens controller 94, a stencil mask controller 95, a first sample stage controller 14, a manipulator controller 17, a controller for precursor gas dispenser 19, secondary particle detector controllers 27 and 28, and a central processing unit 98.

Among them, the central processing unit 98 has a display to provide an image generated based on a detection signal provided from the secondary particle detector 12, or information inputted by information input means.

Here, the first sample stage 13 is provided with a linear transposition mechanism which transposes it in two orthogonal directions in a sample mounting plane, a linear transposition mechanism which transposes it in a vertical direction to the sample mounting plane, a rotation mechanism which rotates it in the sample mounting plane, and an inclination function of varying an irradiation angle of an ion beam onto a sample by rotating around an inclined axis, and these controls are all performed by the first sample stage controller 14, under a command from the central processing unit 98. Because the second sample stage 24 is positioned on the first sample stage 13, the linear movement in two orthogonal directions in the sample mounting plane, the linear movement in a vertical direction to the sample mounting plane, the rotation in the sample mounting plane, and the inclination resulted from the rotation around the inclination axis are made possible by moving, rotating, and inclining the first sample stage 13.

Figure 2:
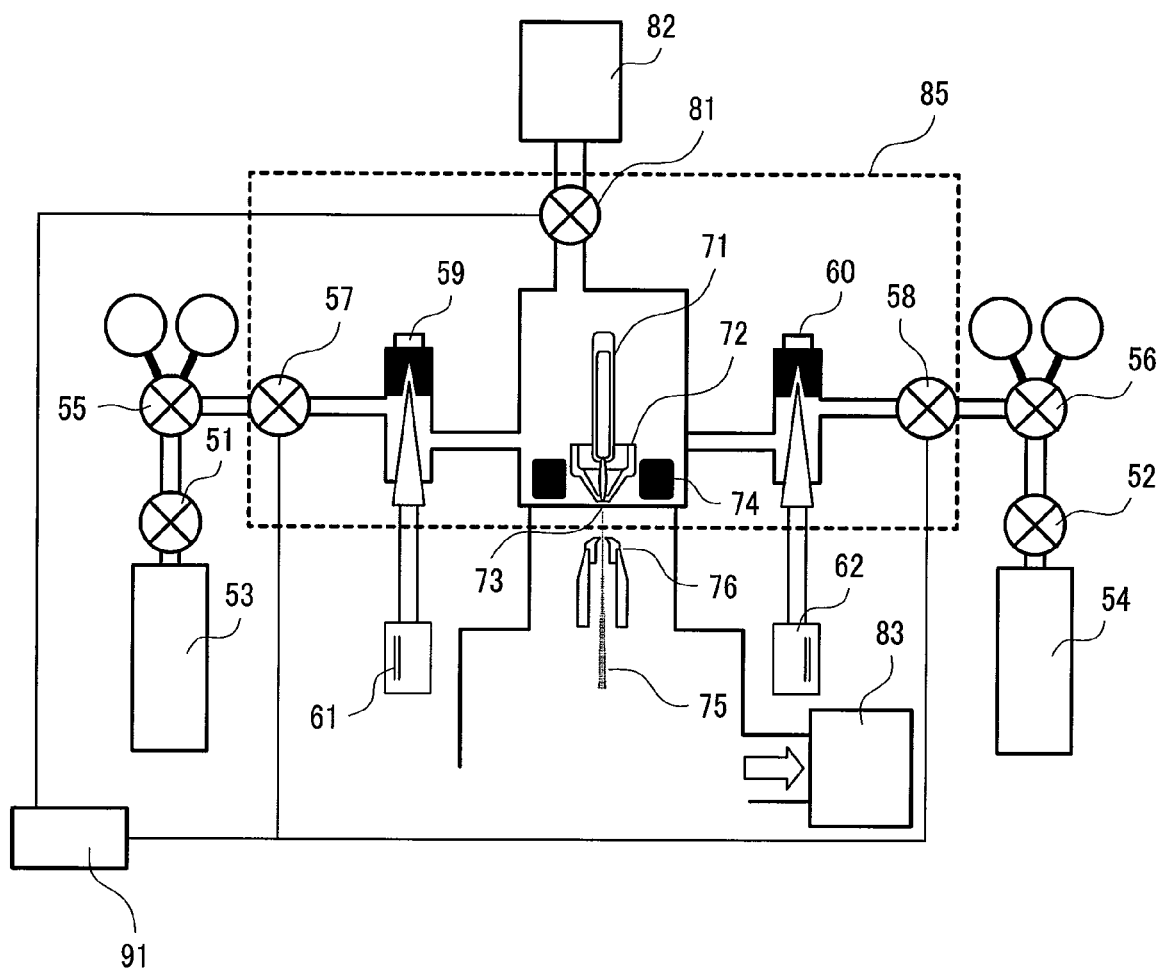
FIG. 2 is a drawing to explain the configuration of an ion source, according to the first embodiment of the present invention.

FIG. 2 is a detailed view of an ion source having a gas supply mechanism according to the present invention. The gas supply mechanism includes two systems, each system being constituted by a gas cylinder 53 or 54 having a cylinder valve 51 or 52, a pressure regulator valve 55 or 56, a stop valve 57 or 58, and a needle valve 59 or 60 to regulate a small amount of gas volume. The first gas cylinder 53 in one system is filled up at high pressure with any one of argon, xenon, krypton, neon, oxygen, and nitrogen. The second gas cylinder 54 on the other side is filled up with helium or hydrogen at high pressure. The duoplasmatron is composed of a cathode 71, an intermediate electrode 72, an anode 73, a magnet 74, etc. In this embodiment it is assumed that the first gas cylinder is filled up with xenon, and the second gas cylinder is filled up with hydrogen.

The operation of the ion source will now be described. An operator opens the cylinder valve 51 of the xenon cylinder, and adjusts an internal pressure of the gas tube using the pressure regulator valve 55. Next, the operator opens the stop valve 57 functioning as a gas supply opening/closing valve for sake of the ion source. Lastly, the operator adjusts the gas volume flow rate to the ion source by using the needle valve 59. For instance, the adjustment is made to let the vacuum level of the ion source be several Pa, so that a gas discharge is generated when a voltage of approximately 1 kV is impressed between the cathode 71 and the anode 73. Xenon ions are then extracted from this discharge plasma through an anode hole. That is to say, an ion beam 75 is emitted in a direction of an extractor electrode 76 having earth potential by applying a high voltage of 20 kV to the ion source. In addition, a voltage of 20 kV (the ion source voltage) is applied to the block surrounded by the dotted line 85 in FIG. 2. To maximize the amount of a xenon ion beam, the operator adjusts the gas volume flow rate with the needle valve 59, and adjusts the discharge voltage as well. With a needle valve adjustment knob 61 being fixed, the discharge voltage is memorized in the (duoplasmatron) controller 91.

Next, the operator closes the stop valve and releases the application of the discharge voltage to stop the xenon discharge. Next, the operator opens a bypass valve 81 to exhaust xenon in the ion source by a vacuum pump 82. The ion source column is also exhausted by a vacuum pump 83.

Similarly, for hydrogen gas, the operator opens a hydrogen cylinder valve 52, adjusts the internal pressure of the gas tube with the pressure regulator valve 56, and opens the stop valve 58. Lastly, the operator manipulates the needle valve 60 to adjust the gas volume flow rate in the ion source and cause a gas discharge. As in done in the case of xenon, the operator maximizes the amount of a hydrogen ion beam by adjusting the gas volume flow rate with the needle valve 60, and adjusting the discharge voltage as well. With a needle valve adjustment knob 62 being fixed, the discharge voltage is memorized in the controller 91 for duoplasmatron.

Likewise, to switch the hydrogen beam to the xenon beam, the operator closes the stop valve 58 and releases the application of the discharge voltage to stop the hydrogen discharge. Then the operator opens the bypass valve 81 to exhaust hydrogen in the ion source. In order to generate xenon ions, the operator opens the stop valve 57 of xenon and switches to the discharge voltage being memorized. Therefore, switching of gas is accomplished by operating the stop valve and switching of the discharge, while leaving the respective needle valves in their positions.

In general, xenon and hydrogen are different in terms of the amount of gas that should be present in the ion source in order to maximize the emission amount of ion beams. Also, it is known that the needle valve for use in adjustment of a very low gas volume flow rate is poor in reproducibility. Thus, in case that only one needle value is available to switch the kind of gas, the operator must adjust the needle valve for every switching operation and it is not easy either to do the gas switching speedily. However, this embodiment realizes a speedy gas switching by installing two kinds of independent, discrete gas supply systems under optimum conditions in advance.

In addition, these gas switching operations can be manipulated mainly by the central processing unit 98. In detail, the central processing unit 98 shows on its display kinds of gases, an image of gas switch, button(s), etc. Therefore, when the operator selects the kind of a desired gas or the switch shown on the display, and the gas switching operation is executed automatically.

The following will now explain the operation of the ion beam irradiation system. The operation of the ion beam irradiation system is controlled by commands from the central processing unit 98. First, a condenser lens 2 converges a xenon ion beam emitted from the duoplasmatron 1 (i.e. an ion source) to near the center of an objective lens 3. That is, a voltage being applied to an electrode of the condenser lens 2 is set to a precalculated value provided by the central processing unit 98 in advance to satisfy the condition. The xenon ion beam passes through a stencil mask 5 having a rectangular hole. The objective lens 3 is controlled such that the stencil mask 5 can be projected onto a sample. Again, a voltage being applied to the electrode of the objective lens 3 is set to a precalculated value provided by the central processing unit 98 in advance to satisfy the condition. In result, a rectangular shaped ion beam is irradiated onto the sample. Since the shaped beam is utilized, it is possible to irradiate a high current beam of approximately 100 nA onto the sample. The shaped ion beam is continuously irradiated to form a rectangular hole at the sample. Formation of the rectangular hole is finished such that the hole has a sufficient depth, i.e. deeper than the depth designated for observation, and is roughly perpendicular to the sample surface.

Figure 3:
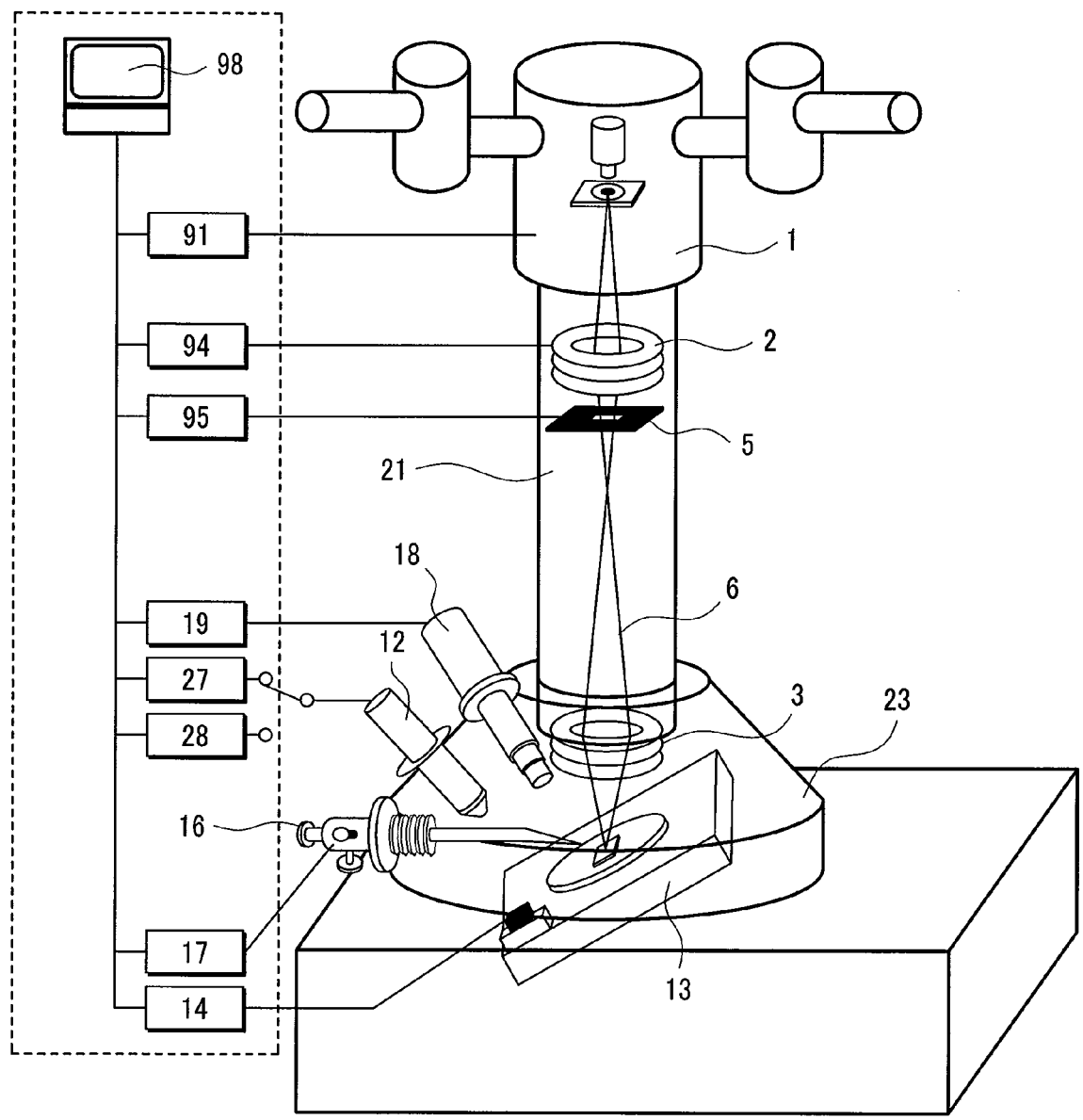
FIG. 3 is a drawing to explain the configuration of an ion beam machining and observation device used for observation, according to the first embodiment of the present invention.

Next, the sample stage controller inclines the first sample stage 13 as shown in FIG. 3, allowing the operator to observe the sample cross section formed by using an ion beam from the ion beam irradiation system. Also, the ion source is operated in order of the above-described procedure to switch xenon to hydrogen. Voltage conditions for the condenser lens 2 and the objective lens 3 are also changed, and an anode hole of the ion source is used as a light source. In this way, an ion beam of a smaller size is projected onto the sample. Accordingly, a micro dot-shaped beam as small as a several millionth of the anode hole diameter can be obtained on the sample. Even though a current used in this case is as small as several pA, the beam diameter can be decreased down to several tens of nanometers. This micro ion beam scanned on the sample surface enables to obtain a detailed observation image. In other words, the sample can be observed with higher resolution by using a smaller converged ion beam current than the shaped ion beam current used for machining.

Traditionally, when a xenon ion beam, which had been already used for machining, is used again for observation, the surface of a sample is likely to be cut out and this consequently makes it harder to have a detailed observation of the sample. On the contrary, the present invention uses a hydrogen ion beam to reduce the amount of a sample being cut out, allowing a detailed observation for the operator.

Further, the observation in use of a hydrogen ion beam helps the operator to observe not only the cross section of a sample, but also the structure of the sample surface, foreign matter, and defects.

To obtain a sample image, this embodiment suggests that an ion source should be projected onto a sample to form a dot-like hydrogen ion beam of a smaller size and the ion beam should be scanned on the sample. But it is also possible to adopt a mechanism for limiting a mask hole size on the stencil mask and scanning the shaped (or projected) beam, which has been projected through the hole, over the sample. In this case, the lens voltage does not need to change for machining and observation, a beam irradiation axis does not get dislocated, and the control operation on the device becomes quite stable.

The mechanism for limiting the size of the mask hole may have a stencil mask structure having a built-in small diameter hole, or a structure which superimposes a fine aperture on a stencil mask. When the stencil mask is irradiated by an ion beam, a mask hole may for example be enlarged or a plate thickness of the mask can be reduced by sputtering, eventually deforming the hole shape. Therefore, it is preferable to use a stencil mask with a thick plate. Meanwhile, it is usually difficult to bore a micro hole in a thick plate. As such, when an ion with a relatively large mass number, e.g., xenon, is used for machining, a mask having a relatively thick plate is used, while an aperture having a small plate thickness is used for hydrogen with a small sputtering rate compared with xenon. Accordingly, it becomes possible to form an even smaller hole at the aperture, and a micro beam thusly obtained allows a high-resolution observation.

This embodiment employed the duoplasmatron as an ion source, but the same effects are obtained by using a plasma ion source using microwaves, an inductively coupled plasma ion source, a multi-cusp type ion source, a gas field ion source, and so on.

The secondary electron detector may detect not only secondary electrons but also reflection electrons or secondary ions. The secondary electron detector controllers are configured with two systems 27 and 28. The secondary electron detector controller 27 on one side amplifies a signal from the detector by direct current amplification. The secondary electron detector controller 28 on the other side counts pulses of a signal from the detector to measure strength of the signal. In the latter case, since detected particles are counted directly, it is possible to remove noises of the detector and increase the detection sensitivity. Traditionally, a sufficient amount of ion beams or electron beams was irradiated onto a sample, so there was no need to count signal pulses. However, in case of irradiating a fine (or micro)-hydrogen ion beam, lower ion current is used, so the detector controller 28 which measures signal strength by counting pulses becomes effective in such case. Accordingly, the operator is able to observe the sample with higher resolution than that of the traditional method. Meanwhile, there is a counting limit of 1 million pulses per second, and pulse counting is not possible in high current conditions above picoampere current levels. Thus, two controllers may be switched according to current magnitude of an ion beam being irradiated. It is another option to monitor current of charged particles being irradiated onto a sample, thereby automatically switching the two controllers by the central processing unit 98.

Moreover, machining by an ion beam, the probe 15 at a front end of the manipulator 16, and an ion beam assisted deposition layer may be used to extract a micro sample 303 from a sample 11 and place it at the second stage 24. The micro sample can be prepared to a membrane suitably for TEM samples. A procedure associated with this will be explained later in sequential order in Embodiment 2.

As explained so far, the ion beam machining and observation device and the machining/observation method of this embodiment made it possible to process a sample cross section by using a xenon projected ion beam and observe the cross section by using a micro-hydrogen ion beam. That is, once an abnormal spot such as a defect or foreign matter in a semiconductor circuit pattern is prepared to a cross section sample, one can observe the cross section of the defect or foreign matter and analyze their causes.

Especially this embodiment performs a highly accurate machining by using a projected ion beam. Even if an ion source may have low brightness, the cross section machining can be done within a short period of time by increasing the beam current and improving the machining precision. This means that an ion beam of gaseous elements such as an inert gas, oxygen or nitrogen, which do not much affect the sample properties, may be used in replacement of Ga, which is very likely to cause defects in the manufacturing process of a semiconductor device. Therefore, for improving the semiconductor device manufacturing yield, there is provided a novel inspection and analysis method, which can form a cross section by an ion beam without contaminating a wafer with metals such as Ga, yet allowing an operator to observe the cross section without splitting a wafer. With this method, wafers do not need to be discarded due to testing, and defects are not generated even if wafers from which samples for inspection are removed are returned to the process. Also, wafers can be tested without being split, new defects are not created and expensive wafers are not going to be wasted. Consequently, the manufacturing yield of semiconductor devices can be improved.

Embodiment 2

Unlike the ion beam machining and observation device discussed in Embodiment 1 where ion beam irradiation systems are arranged in a perpendicular direction, an ion beam machining and observation device of this embodiment has ion beam irradiation systems arranged in a direction inclined from the perpendicular direction, and a stage plane is fixed in a horizontal direction.

Moreover, the device of this embodiment includes a mass divider installed midway in the ion beam path to get rid of ions of large mass numbers when ions of relatively small mass numbers are irradiated.

This embodiment will also explain a means for preparing a TEM (Transmission Electron Microscope) sample by extracting a micro sample from a sample.

This embodiment also uses a mask aperture shaped ion beam projected on a sample.

Figure 4:
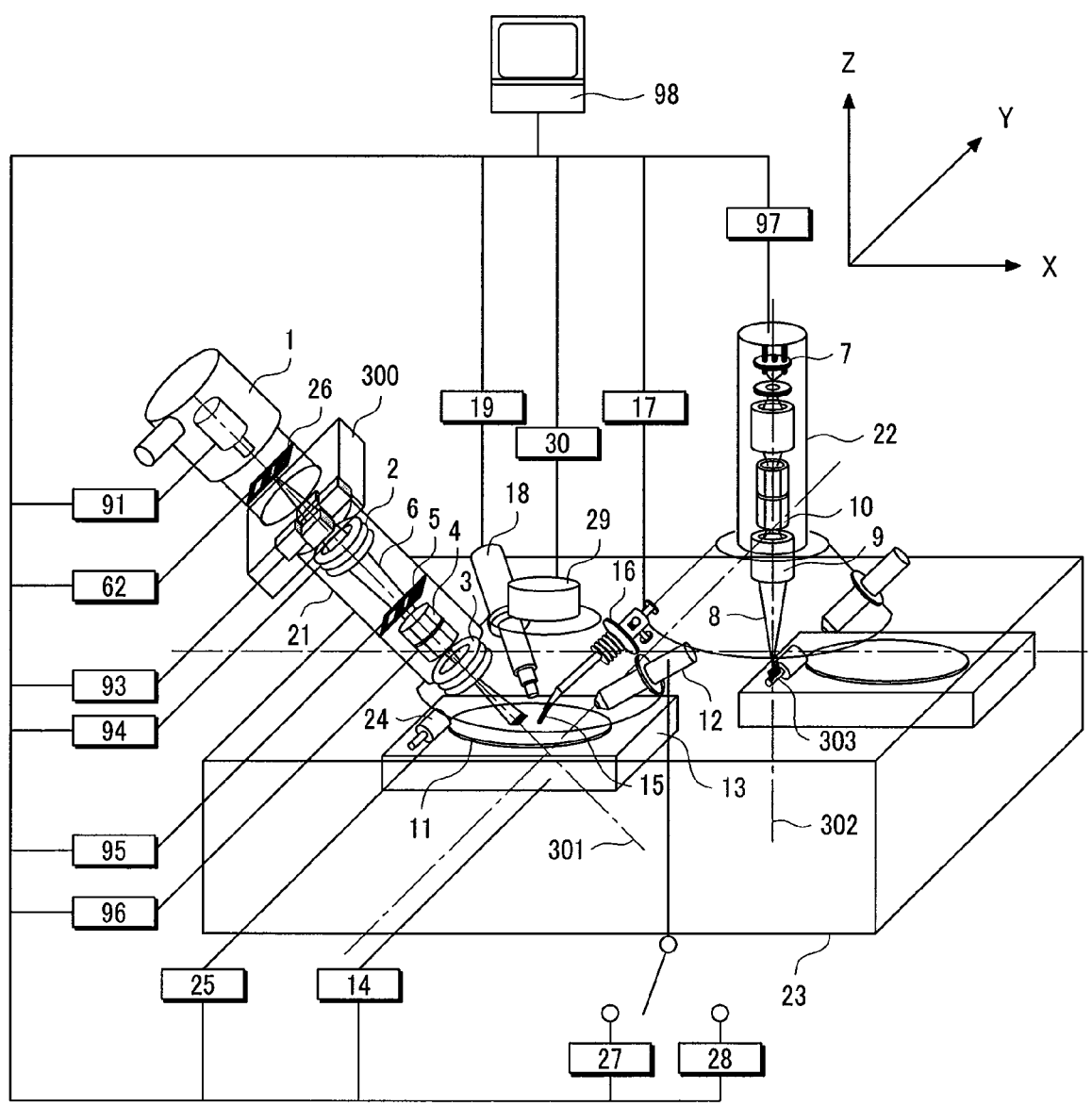
FIG. 4 is a drawing to explain an ion beam machining and observation device, according to a second embodiment of the present invention.

FIG. 4 illustrates an ion beam machining and observation device of this embodiment. The ion beam machining and observation device includes a duoplasmatron 1, which is an ion source, emitting gas ions such as argon, neon, xenon, krypton, oxygen, nitrogen, helium, hydrogen, a mass spectrometry 300, an ion source limiting aperture 26, a condenser lens 2, an objective lens 3, an ion beam scanning deflector 4, a stencil mask 5, and an electron beam column 21 for housing these elements. The mass spectrometry 300 in this embodiment is a so-called ExB mass separator which provides an electric field and a magnetic field respectively being perpendicular to an ion beam, the electric field and the magnetic field being in a mutually perpendicular relationship. Although this embodiment used a permanent magnet, it may also use an electro-magnet. Only the magnetic field may be associated with mass separation.

The device is provided with an electron beam irradiation system constituted by an electron gun 7, an electron lens 9 for converging an electron beam 8 emitted from the electron gun 7, an electron beam scanning deflector 10, and an electron beam column (SEM column) 22 for housing these elements. A vacuum sample chamber 23 is disposed in the lower part of the ion beam column 21 and the SEM column 22, and a first sample stage 13 on which a sample 11 is placed, a secondary particle detector 12, and a precursor gas dispenser 18 are housed in the vacuum sample chamber 23. Moreover, the device includes a probe 15 for delivering a sample piece extracted from the sample on the first sample stage by using ion beam machining, a manipulator 16 for driving the probe 15, and a second sample stage 24 on which a micro sample 303 is placed. Needless to say, inside the ion beam column 21 is maintained under vacuum. Here, both the node (irradiation spot) of an ion beam on the sample and the node of an electron beam on the sample are aberrant from the center of the sample mounting surface, and are located at different positions. That is, an ion beam irradiation axis 301 and an electron beam irradiation axis 302 do not cross with each other.

A control section for this device the ion beam machining and observation device is constituted by a duoplasmatron controller 91, a mass separator controller 62, an ion source aperture controller 93, a lens controller 94, a stencil mask controller 95, an ion beam scanning deflector controller 96, a first sample stage controller 14, a second sample stage controller 25, a manipulator controller 17, a controller for precursor gas dispenser 18, secondary electron detector controllers 27 and 28, an electron beam irradiation controller 97, and a central processing unit 98. Among them, the central processing unit 98 has a display to provide an image generated based on a detection signal provided from the secondary particle detector 12, or information inputted by information input means. Reference numeral 30 in the drawing designates a sample height sensor controller 30 to control a sample height sensor 29.

Figure 5:
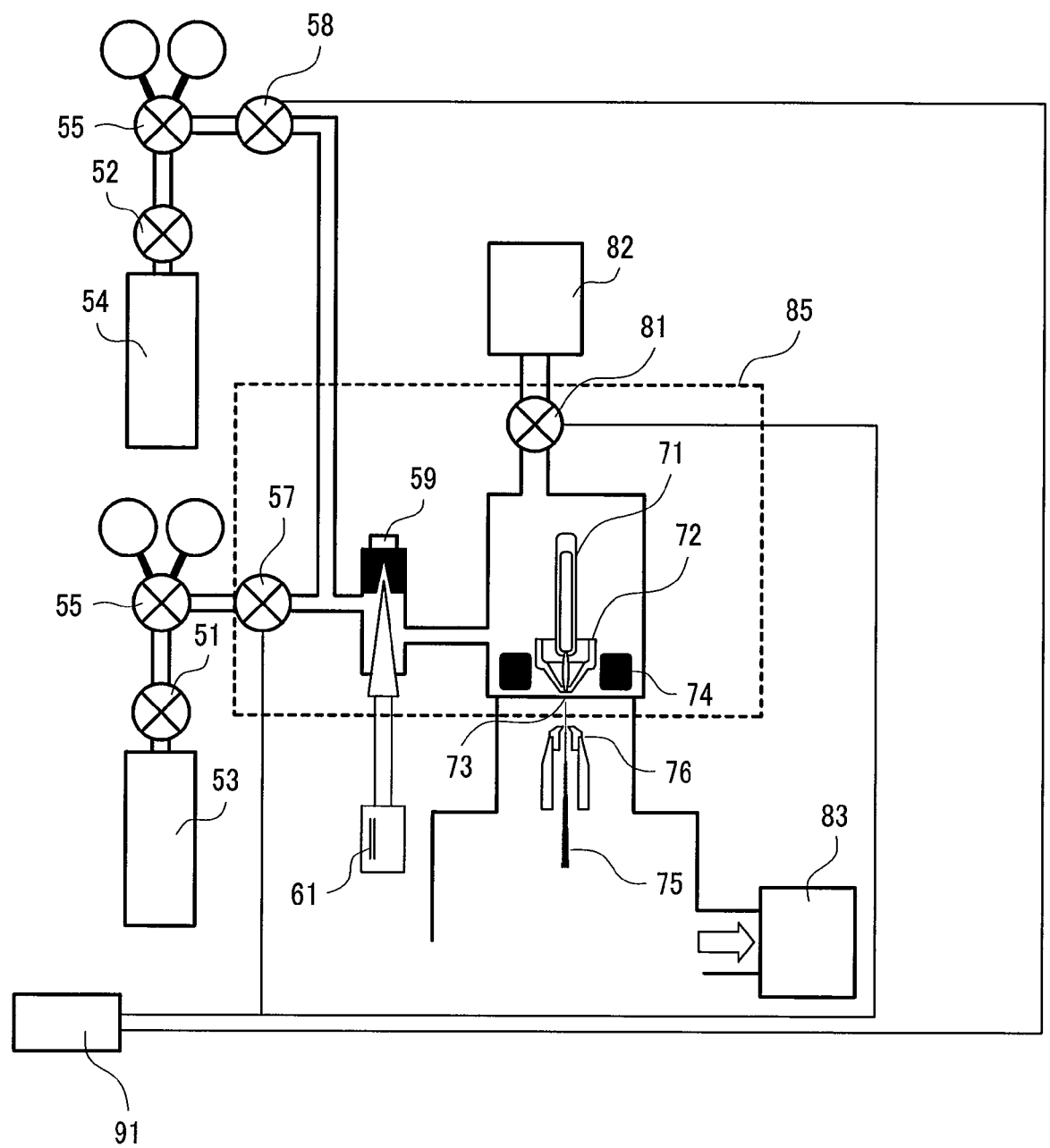
FIG. 5 is a drawing to explain the configuration of an ion source, according to the second embodiment of the present invention.

FIG. 5 shows an ion source having a gas supply mechanism used for this embodiment. The gas supply mechanism includes two kinds of gas cylinders 53 and 54, each having a cylinder valve 51 or 52, pressure regulator valves 55 and 56 for the respective cylinders, stop valves 57 and 58 for respective gas systems, and a needle valve 59 to regulate a small amount of gas volume. The first gas cylinder 53 is filled up at high pressure with any one of argon, xenon, krypton, neon, oxygen, and nitrogen. The second gas cylinder 54 on the other side is filled up with helium or hydrogen at high pressure. In this embodiment it is assumed that the first gas cylinder is filled up with argon, and the second gas cylinder is filled up with helium.

The operation of the ion source will now be described. An operator opens the cylinder valve 51 of the argon cylinder 53, and adjusts an internal pressure of the gas tube using the pressure regulator valve 55. Next, the operator opens the stop valve 57 functioning as a gas supply opening/closing valve for sake of the ion source. Lastly, the operator adjusts the gas volume flow rate to the ion source by using the needle valve 59. For instance, the adjustment is made to let the vacuum level of the ion source be several Pa, so that a gas discharge is generated when a voltage of approximately 1 kV is impressed between a cathode 71 and an anode 73. Argon ions are then extracted from this discharge plasma through an anode hole. In addition, a voltage of 20 kV (the ion source voltage) is applied to the block surrounded by the dotted line 85 in FIG. 5. To maximize the amount of an ion beam 75, the operator adjusts the gas volume flow rate with the needle valve 59, and adjusts the discharge voltage as well. With a needle valve adjustment knob 61 being fixed, the discharge voltage is memorized in the controller 91 for duoplasmatron.

Next, the operator closes the stop valve 57 and releases the application of the discharge voltage to stop the argon discharge. Next, the operator opens a bypass valve 81 to exhaust argon in the ion source by a vacuum pump 82. The ion source column is also exhausted by a vacuum pump 83.

Similarly, for helium gas, the operator opens a helium cylinder valve 52, adjusts the internal pressure of the gas tube with the pressure regulator valve 56, and opens the stop valve 58. Meanwhile, the needle valve 59 should remain fixed. The gas volume flow into the ion source is adjusted by a secondary pressure of the pressure regulator valve 56 to thereby generate a gas discharge. Again for the helium, the operator maximizes the amount of a helium ion beam by adjusting the gas volume flow rate, and adjusting the discharge voltage as well. The discharge voltage is memorized in the (duoplasmatron) controller 91.

Next, to switch from a helium beam to an argon beam, the operator closes the stop valve 58 and releases the application of the discharge voltage to stop the helium discharge. Then the operator opens the bypass valve 81 to exhaust helium in the ion source. In order to generate argon ions, the operator opens the stop valve 57 of argon and switches to the discharge voltage being memorized. Therefore, switching of gas is accomplished by operating the stop valve and switching of the discharge, while leaving the needle valve 59 in its set position.

In general, argon and helium are different in terms of the amount of gas that should be present in the ion source in order to maximize the emission amount of ion beams. Although this embodiment using one needle valve for gas switching may not have a high precision for regulating the gas volume flow rate compared with the device of Embodiment 1 having a dual-system gas supply mechanism, since it uses only one needle valve, its overall structure becomes simple.

The following will now explain the operation of the ion beam irradiation system. First, an argon ion beam is extracted from the duoplasmatron 1. The mass separator 300 is actuated to make the argon ion beam pass through it. The function of the mass separator is performed when the mass separator controller operates on a command from the central processing unit. The argon ion beam having passed through the mass separator (or mass analyzer) 300 is converged near the center of the objective lens 3 by the condenser lens 2. That is, a voltage being applied to an electrode of the condenser lens 2 is set to a precalculated value provided by the central processing unit 98 in advance to satisfy the condition. The argon ion beam passes through the stencil mask 5 having a rectangular hole. The objective lens 3 is controlled such that the stencil mask 5 can be projected onto a sample. Again, a voltage being applied to the objective lens 3 is set to a precalculated value provided by the central processing unit 98 in advance to satisfy the condition. In result, a rectangular shaped ion beam is irradiated onto the sample. Since the shaped beam is utilized, it is possible to irradiate a high current beam of approximately 100 nA onto the sample. The shaped ion beam is continuously irradiated to form a rectangular hole at the sample. Formation of the rectangular hole is finished such that the hole has a sufficient depth, i.e. deeper than the depth designated for observation, and is roughly perpendicular to the sample surface.

Figure 6:
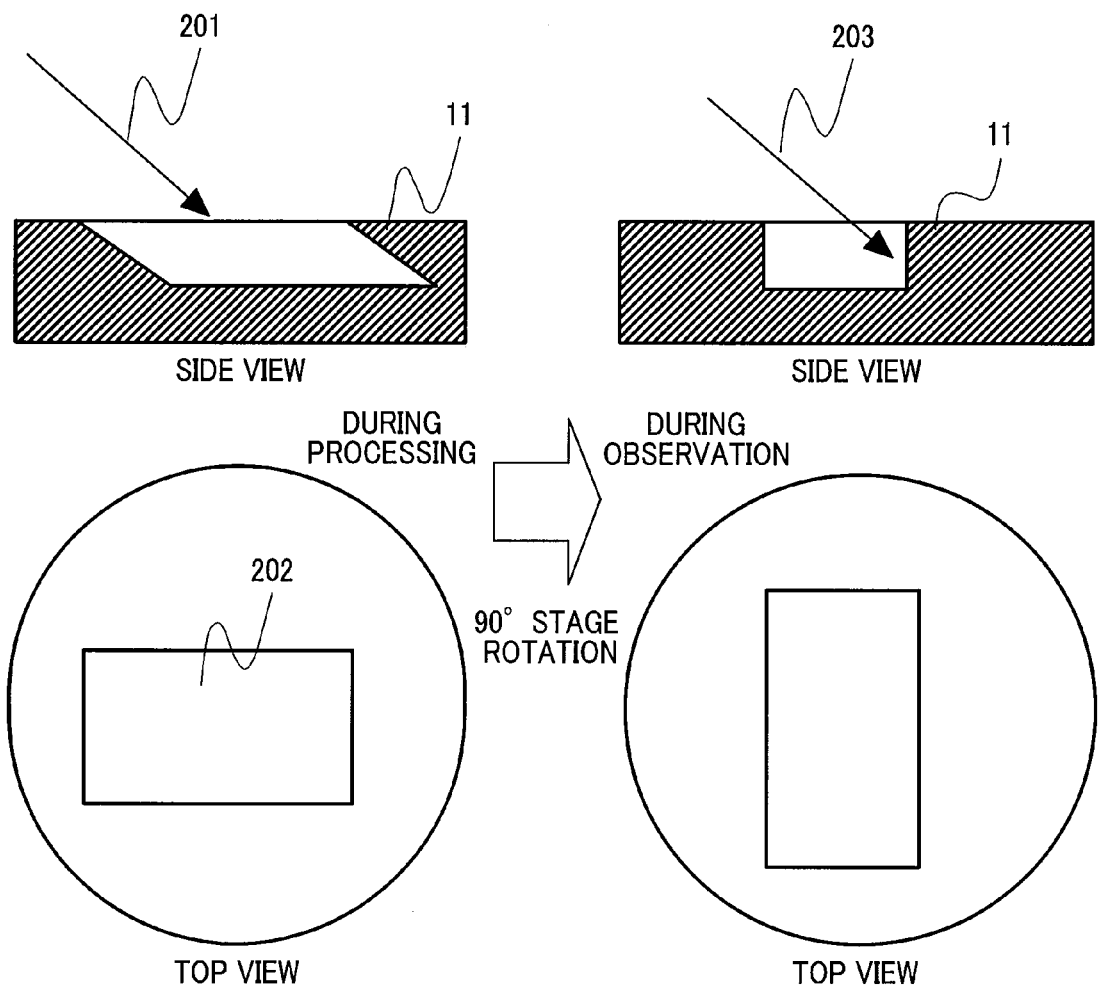
FIG. 6 is a drawing to explain the observation of a cross section by using stage rotation, according to the second embodiment of the present invention.

Next, the sample stage controller rotates the first sample stage 13 by 90 degrees as shown in FIG. 6, allowing the operator to observe the sample cross section formed by using an ion beam from the ion beam irradiation system. FIG. 6 respectively shows a side view and top view of the cross section of a sample that is machined and observed by using an ion beam. In detail, the left side of FIG. 6 shows that a rectangular hole 202 is formed by irradiating an argon ion beam 201 onto a sample 11 from an inclined direction, and the right side of FIG. 6 shows a sample cross section rotated by 90 degrees.

The ion source is operated in order of the above-described procedure to switch from argon to helium, and the mass analyzer (or mass separator) 300 is actuated to make a helium ion beam pass through it. Voltage conditions for the condenser lens 2 and the objective lens 3 of the ion beam are also changed, and an anode hole of the ion source is used as a light source. In this way, an ion beam of a smaller size is projected onto the sample by the condenser lens and the objective lens. Accordingly, a micro dot-shaped beam as small as a several millionth of the anode hole diameter can be obtained on the sample. Even though a current used in this case is as small as several pA, the beam diameter can be decreased down to several tens of nanometers. By irradiating and scanning this micro helium ion beam 203 onto a vertical cross section of the sample as shown in the right side of FIG. 6, a detailed observation image of the cross section can be obtained. In other words, the sample can be observed with higher resolution by using a smaller converged ion beam current during observation than the shaped (projected) ion beam current used during processing.

When the mass analyzer is not used, sometimes remaining argon in the ion source is ionized and irradiated onto the sample. These argon ions cut out the sample surface, making it harder to observe the sample. On the contrary, the present invention uses only helium ions for observation by the mass analyzer to reduce the amount of the sample being cut out, so that the operator may have a detailed observation of the sample.

The observation function in use of a helium ion beam helps the operator to observe not only the cross section of a sample, but also the structure of the sample surface, foreign matter, and defects.

Needless to say, the ion source with the dual-system gas supply mechanism depicted in FIG. 2 exerts the same effects when incorporated into the device of this embodiment. Moreover, argon and helium gases may be introduced simultaneously into the ion source, or mixed gas of argon with helium prepared in advance may be introduced to generate argon and helium ions at the same time. Even in this case, an argon ion beam is not irradiated onto the sample, while a helium ion beam is being irradiated. It is not necessarily easy to increase the ion current to a maximum for each of those two kinds of ions, but the mass analyzer takes exclusive responsibility of switching the kind of ions.

The operation of the electron beam irradiation system will now be explained. An electron beam 8 emitted from the electron gun 7 is converged by the electron lens 9, and irradiated onto the sample 11. At this time, the electron beam scanning deflector 10 irradiates the electron beam 8 over the sample surface while scanning it, and the secondary particle detector 12 detects secondary electrons emitted from the sample surface, and changes the intensity of them to image brightness to help the operator to observe the sample. According to this sample observation function by electron beam, the operator can observe abnormal spots such as defects and foreign matter in circuit patterns formed on the sample. Especially, the structural feature of this device having an electron beam irradiated in a direction perpendicular to the sample is advantageous for getting information on abnormalities of a large hole with a high ratio of depth to diameter.

Although the observation function by electron beam of this device is originally for observing a cross section of defects or foreign matter of a sample, it can also be used for discovering a machining endpoint by observing the cross section of an electron microscope membrane sample. That is, this device is built to enable the operator to observe the sample cross section by using an ion beam as well as an electron beam. In general, an observation image by an ion beam is characterized or advantageous by its high element contrast, while an observation image by an electron beam is characterized or advantageous by its high spatial resolution. Therefore, the sample observation through the device of this embodiment can benefit from both sides.

As aforementioned, both the node (irradiation spot) of an ion beam on the sample and the node of an electron beam on the sample are aberrant from the center of the sample mounting surface, and are located at different positions. This gives an enough space to place the objective lenses near the sample, without getting interfered spatially with each other, so that work distance of each objective lens can be shortened. In other words, the ion beam and the electron beam are excellent in micromachining or high current performance.

Figure 7A:
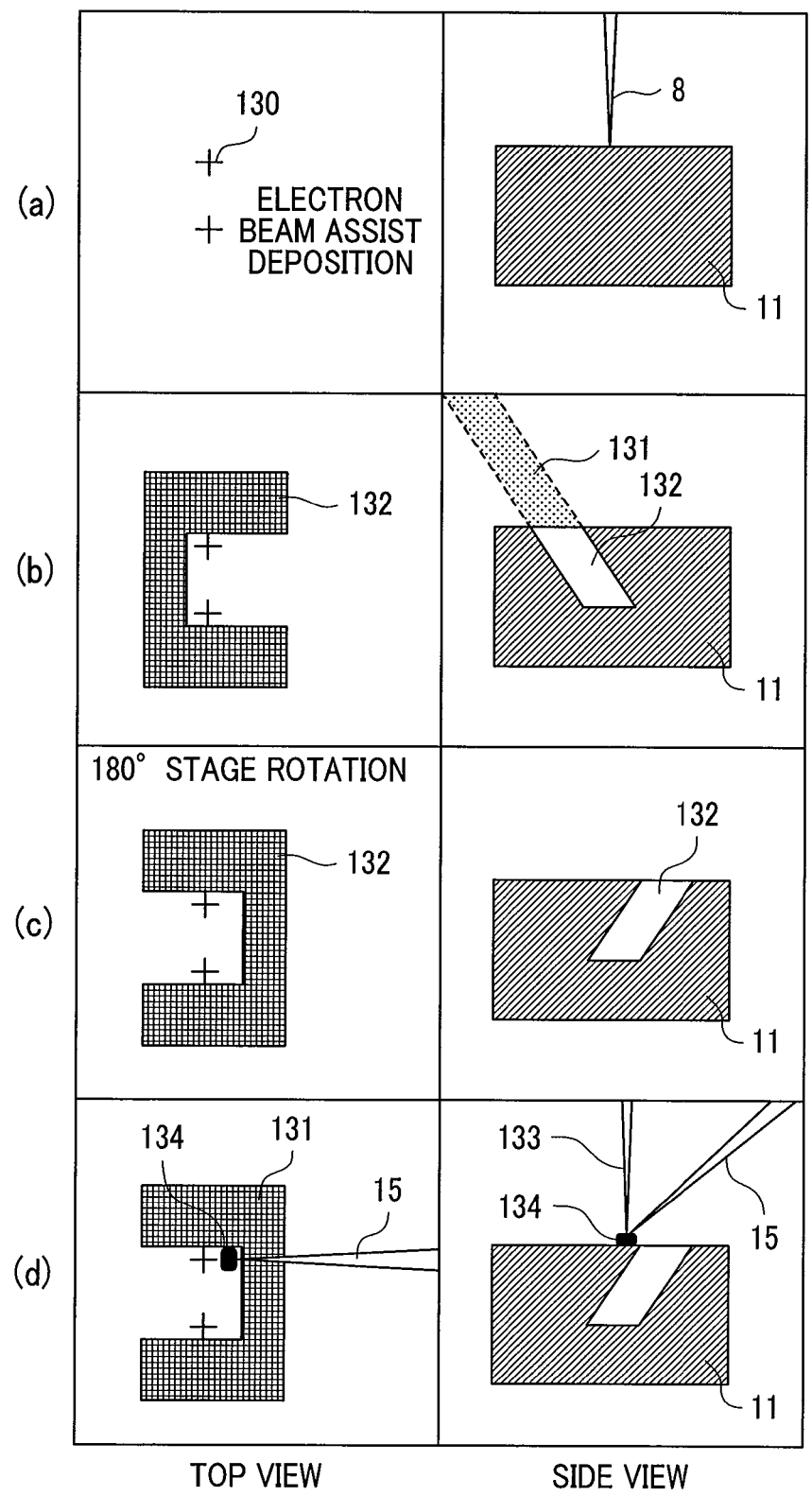
FIG. 7A explains a flow (a) through (d) of extracting a micro sample from a sample, according to the second embodiment of the present invention.
Figure 7B:
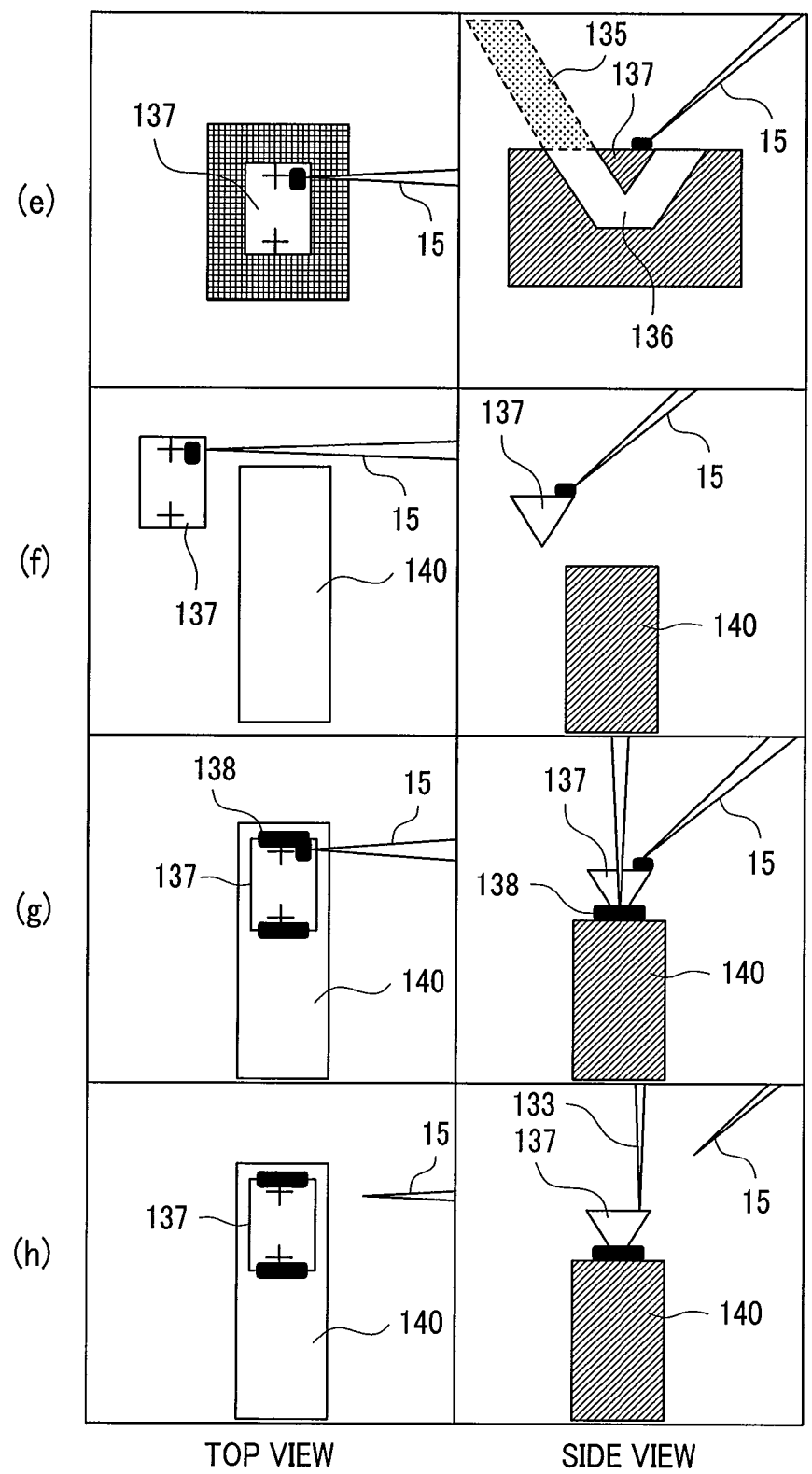
FIG. 7B explains a flow (e) through (h) of extracting a micro sample from a sample, according to the second embodiment of the present invention.

FIG. 7A and FIG. 7B respectively illustrate a sequential procedure for extracting a micro sample from a sample on the first stage by using a projected ion beam. Drawings on the left hand side in FIGS. 7A and 7B are top views of a sample, and drawings on the right hand side in FIGS. 7A and 7B are side views of a sample. Since the device for this procedure uses a projected ion beam of micron-size, it is not necessarily recommended to mark a machining position by using an ion beam. For this reason, the device uses an electron beam of nano-size.

First of all, the first sample stage 13 is transposed so that an electron beam can be irradiated onto a sample region from which a micro sample is extracted. Referring (a) in FIG. 7A, a deposition gas is fed from the precursor gas dispenser 18 and an electron beam 8 is irradiated. A deposition layer is thereby formed on the surface of a sample 11 in preparation of two end marks 130 that pinpoints an observation cross section. That is, the operator specifies the observation positions with marks while watching the image of the same on the screen of the display of the central processing unit 85. As the processor uses a micro-size projected ion beam in cooperation with an electron beam, nano-order marking became possible.

Next, the first sample stage 13 is transposed so that a first projected ion beam 131 of argon can be irradiated near the marks. Here, a stencil mask is transformed into a hole shape illustrated in FIG. 8(*a*). In doing so, a current of approximately 200 nA is obtained. Therefore, as shown at (b) of FIG. 7A, the first projected ion beam 131 of argon is irradiated until two marks are enclosed inside, and a first projected hole 132 (a projected hole A) of about 15 μm in depth is formed.

Figure 8:
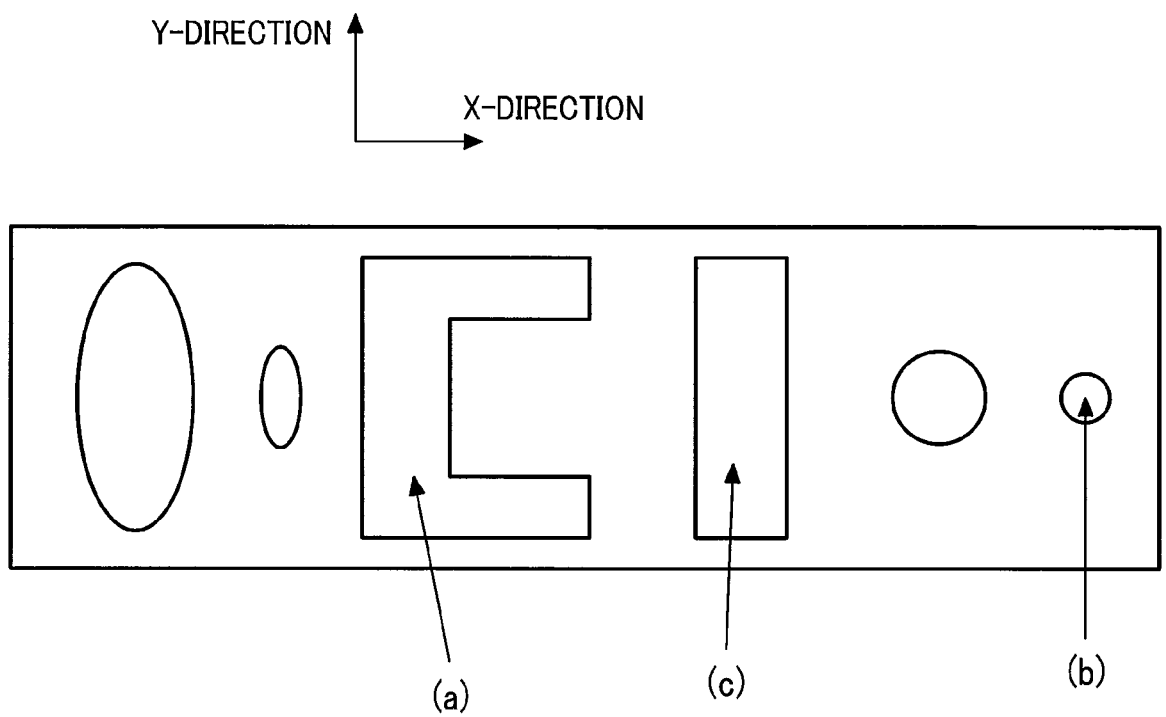
FIG. 8 illustrates shapes of apertures formed in a stencil mask.

Next, the kind of ion beam is switched from argon to helium, and the stencil mask is transformed into a circular hole as shown in FIG. 8(*b*). At this time, the cross section of the beam becomes roughly circular. However, the cross section of the beam on the sample is elliptical because the ion beam is inclined against the sample, but when the ion beam is scanned across the sample, the operator can observe the sample. The switching operation is executed on a switching command the device operator has inputted through an information input means, or in response to a switching control signal transmitted from the central machining device to the mask control mechanism.

Referring to (c) of FIG. 7A, the sample stage controller rotates the sample by about 180 degrees using the vertical axis to the sample surface as a rotation axis. When an elliptical helium ion beam is irradiated onto the sample, secondary electrons are generated from the sample and a secondary electron image is thereby formed. This secondary electron image goes through image processing to thereby recognize an initially formed hole. Referring to (d) of FIG. 7A, while watching the secondary electron image obtained by the irradiation of an helium ion beam 133, the device operator transposes a probe 15 by operating the probe controller so that the end of the sample to be extracted comes in contact with a probe at the tip of a transport means.

Using the helium ion beam instead of the argon ion beam, the damage level of the probe due to the ion irradiation is very low. To fix the probe to the sample to be extracted, the ion beam is scanned while a deposition gas is led to flow out into an area including the tip of the probe. In so doing, a deposition layer 134 is formed in the ion beam irradiation area, and the probe and the sample to be extracted are connected.

Next, the kind of ion beam is switched from helium to argon, and the stencil mask is also adjusted in advance to let the sample irradiation position of a projected beam 135 having the shape shown in FIG. 8(*c*) be set by a circular beam. At (e) of FIG. 7B, the ion beam controller is operated to control the ion beam irradiation position based on the sample shape information obtained by irradiating an elliptical beam, and a second projected ion beam 135 is irradiated until two marks together with the first projected beam are enclosed inside, and a second projected hole 136 (a projected hole B) of about 15 μm in depth is formed. This projected hole B intersects with the first projected hole A formed by the first projected ion beam. Through the steps (a) of FIG. 7A through (e) of FIG. 7B, a wedge-shaped micro sample 137 having a triangular cross section, including the marks, is held in the probe.

Next, the kind of ion beam is switched from argon to helium, and the stencil mask is transformed into a circular hole as shown in FIG. 8(*b*). As shown in (f) of FIG. 7B, while watching a secondary electron image obtained by irradiating an ion beam, the device operator manipulates the probe controller to move the probe position, and the extracted micro sample 137, being in contact with the tip of the probe, is transposed to a sample holder 140 on the second stage. At (g) of FIG. 7B, a helium ion beam is then irradiated onto a contact area between the micro sample 137 and the sample holder 140, in the presence of a deposition gas being introduced. A deposition layer 138 is thereby formed in the ion beam irradiation area, and the micro sample 137 is connected to the sample holder 140.

Next, referring to (h) of FIG. 7B, the kind of ion beam is switched from helium to argon, and the argon ion beam irradiation and sputtering are carried out to remove the deposition layer which bridges the probe and the micro sample. In result, the probe 15 is separated from the micro sample 137.

One of structural features of the ion beam device of this embodiment is that the ion beam column is inclined against the sample. Thanks to this structure, the sample stage does not need to be inclined but be rotated only to extract a micro sample by using an ion beam.

In addition, the device includes the probe 15 to transport the micro sample 137 which has been extracted from the sample 11 on the first sample stage 13 by ion beam machining, and the second sample stage 24 on which the micro sample is placed, and has an inclination function such that the device operator is able to vary the irradiation angle of an ion beam onto the micro sample when the second sample stage rotates around an inclination axis.

Using the inclination nature of the second sample stage, the operator may arrange the cross section of a sample to face the perpendicular direction against a helium ion beam. In so doing, the operator may have a detailed cross sectional observation from the vertical direction. That is, the device is operated to enable the cross section cutting work by an argon ion beam and the observation by a helium ion beam, and the device operator can obtain three-dimensional information from the sample by repeating cross section cutting work and the observation. Further, a three-dimensional image can be built based on a number of two-dimensional observed images.

Next, for the production of an electron microscope sample, three kinds of stencil mask holes prepared to decrease the beam current in the order roughing, intermediate machining and finishing are switched one after another to reduce the sample thickness. Finally, a thin finish is done to produce a wall with an observation area having a thickness of about 100 nm or less to give an electron microscope sample. As a result of the aforesaid machining, a TEM observation area is created. So far, an example has been described where the operator controls the device using the input unit of the central processing unit, but it is also possible to provide a storage means such as a memory in the central processing unit, and store all the process control conditions as a control sequence such that sampling can be fully automated.

After membrane machining is performed as described above, the micro sample is introduced into the TEM sample chamber. In TEM observation, one can observe cross sections of defects or foreign matter with higher resolution than in SEM observation, and analyze the cause of those defects in more detail from the observation results.

Although this embodiment used an argon ion beam for machining, it is evident that the same effects can be obtained by using nitrogen, oxygen, neon, xenon, krypton, etc. Especially in case of the argon beam, the ratio of its isotopes with mass number 40 is as high as 99.6%, so there is a small decrease in current even after mass separation. Moreover, this embodiment used a helium ion beam for observation, but it is evident that the same effects can be obtained by using hydrogen. Especially in case of the helium beam, its molecular ion is small and the ratio of ion with mass number 4 (4He) is high, so there is a small decrease in current even after mass separation.

In this embodiment, the duoplasmatron was used as an ion source, but the same effects are obtained by using a plasma ion source using microwaves, an inductively coupled plasma ion source, a multi-cusp type ion source, a gas field ion source, and so on.

The device of this embodiment has a transmitted-ion detector 1201 to detect hydrogen ions having transmitted the sample, and allows the operator to obtain a so-called scanning transmission ion microscopy image and to observe a sample with high spatial resolution.

In addition to the effects and benefits of Embodiment 1, the ion beam machining and observation device and method, and a micro sample production method of this embodiment have other effects and benefits. Namely, the irradiation of an ion with relatively large mass number can be avoided at the time of irradiating a helium ion beam, and since the argon ion can be exhausted and substituted to the helium ion beam within a shorter period of time, the total amount of time it takes for ion beam switching can be reduced. Moreover, ions of impurities such as metal ions which are generated by the ion source are removed from the mass separator, and do not reach the sample. In this manner, the sample is not contaminated with impurities, and the device manufacturing yield is not decreased.

Embodiment 3

Figure 9:
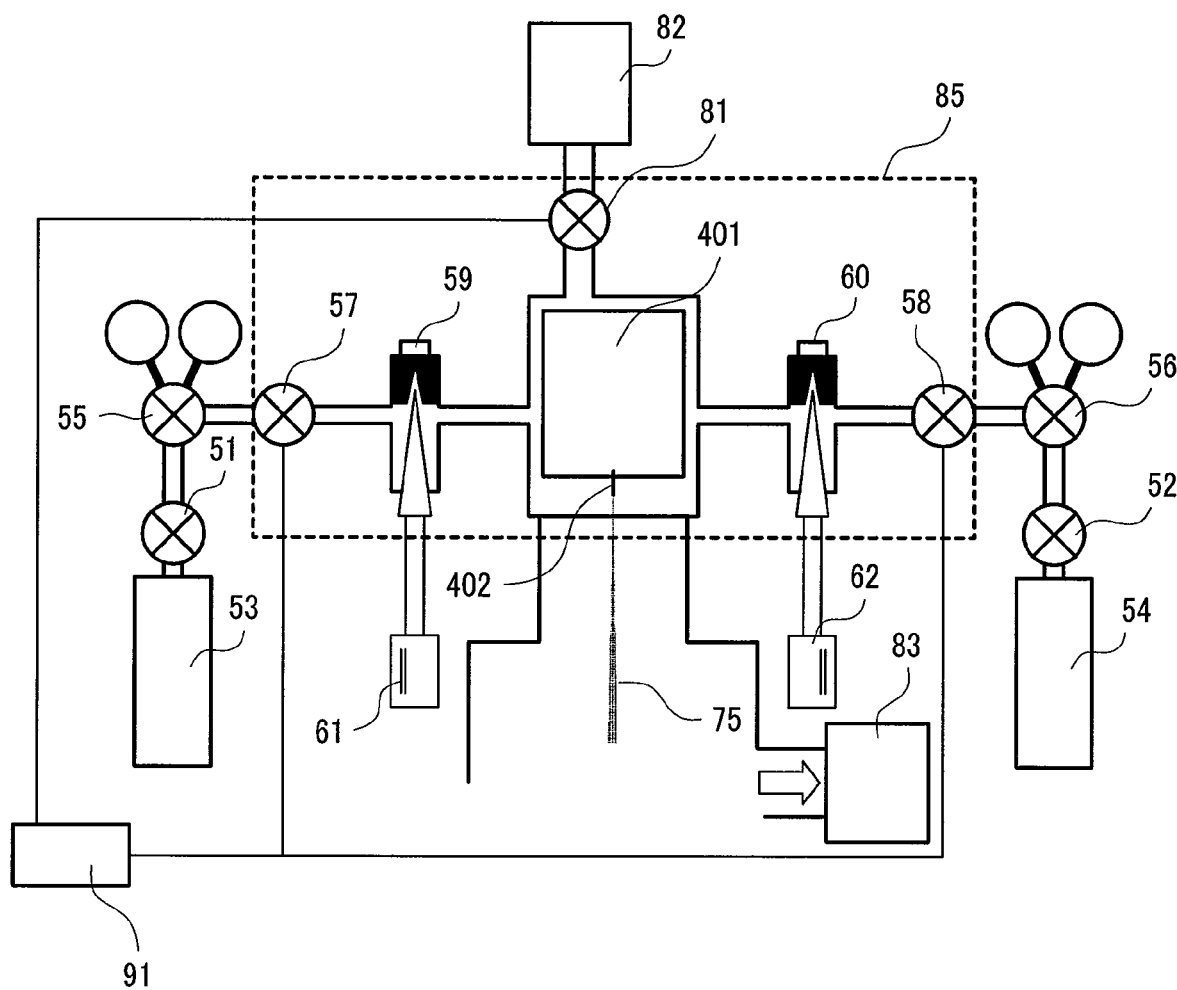
FIG. 9 is a drawing to explain the configuration of a gas field ion source, according to a third embodiment of the present invention.

FIG. 9 illustrates an embodiment of using a gas field ion source as an ion source. The configuration of the gas supply mechanism of this embodiment is identical to that of the system explained in Embodiment 1. Therefore, the description on its operation will be omitted in this embodiment.

In this ion source, the apex of an ion emitter tip 402 made of tungsten is machined sharply and cooled to several tens of K by a freezer 401. A gas is also cooled and a strong electric field is applied to the ion emitter tip 402, to thereby extract an ion beam from near the emitter tip.

Figure 10:
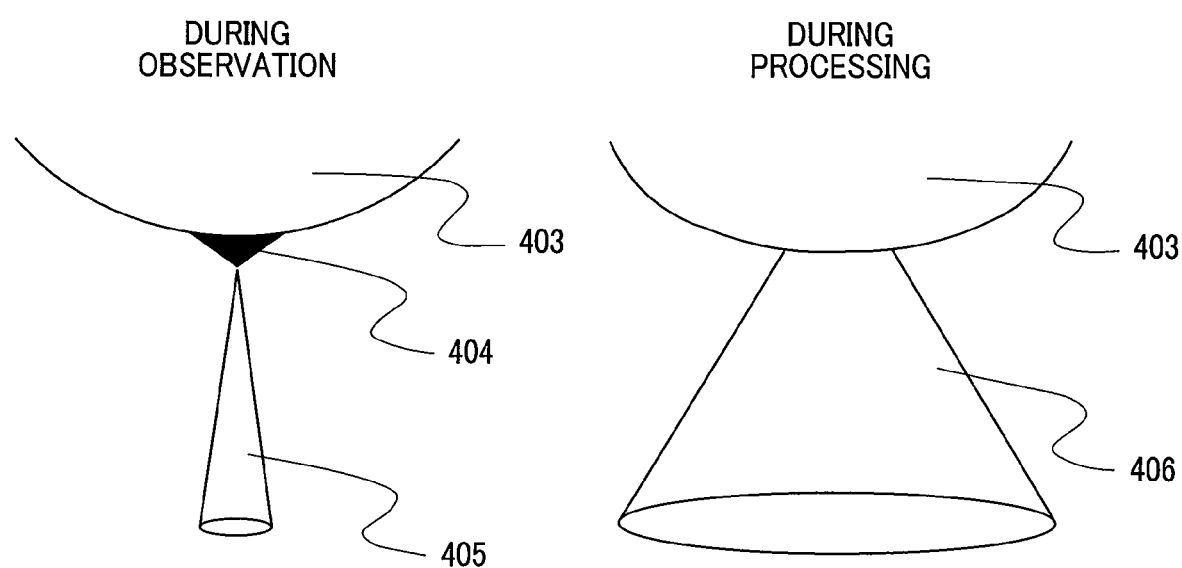
FIG. 10 is a drawing to explain an emitter tip of the gas field ion source, according to a third embodiment of the present invention.

In case of extracting helium ions or hydrogen ions, as shown in FIG. 10, a nano-pyramid structure 404 of an atom is formed at an ion emitter tip apex 403. Since ions are produced only near one through three atoms, an ion source with a very high brightness is realized. That is, an ion beam 405 of 1 nm or less in diameter is obtained on a sample, the sample can be observed at very high spatial resolution.

However, this is not suitable for machining because both helium and hydrogen ions have small mass and small ion beam current. For machining, the kind of gas to be fed to the ion source is thus switched from helium to argon, and the nano-pyramid structure at the ion emitter tip apex should be removed by electrolytic evaporation. In so doing, ions are produced from a comparatively broad area near the ion emitter tip apex, and an argon ion beam 406 of the order of nano-amperes is obtained to enable machining. Next, the nano-pyramid structure of an atom is formed again to extract a micro helium ion beam. The nano-pyramid structure may be formed by depositing palladium or platinum on tungsten and then annealing at high temperature.

In addition to the effects and benefits of Embodiment 1, the ion beam machining and observation device and method, and a micro sample production method of this embodiment have other effects and benefits. That is, an ultra-fine micro helium or hydrogen ion beam, and high-current argon or xenon ion beam obtained from machining make it possible to perform ultra-fine machining or ultra-high-resolution observation.

As has been explained in detail, the present invention provides a device for observing an electronic component cross section, which can be manufactured at lower prices than in the related art. Moreover, the present invention sample cross section observation method can be implemented at lower price than in the related art. Also, the ion beam machining and observation device of the present invention is capable of shortening a cross section forming time by an ion beam.

In addition, the present invention provides a novel inspection and analysis method, through which wafers do not need to be discarded due to testing by using an inert gases, oxygen, or nitrogen ions for the ion beam, and defects are not generated even if wafers from which samples for inspection are taken are returned to the process. By using the electronic component manufacturing method of the present invention, wafers can be tested without being split, new defects are not created and expensive wafers are not going to be wasted. As a result, the manufacturing yield of electronic components is improved.

The ion beam machining and observation device and the sample cross section observation method according to the present invention include the following configuration examples.

(1) An ion beam machining and observation device, including: a sample stage for holding a sample; an ion source for generating ion beams of at least two different kinds of gases; and an irradiation optical system for irradiating an ion beam onto the sample held on the sample stage, wherein the ion beam irradiating optical system is a transmission ion beam irradiation system which irradiates an ion beam onto the sample through a mask having a desired shape aperture and which includes two or more ion beam lenses, and a mask driving mechanism with a variable aperture or an aperture driving mechanism.

(2) An ion beam machining and observation device, including: a sample stage for holding a sample; a gas field ion source for generating ion beams of at least two different kinds of gases; and an irradiating optical system for irradiating an ion beam onto the sample held on the sample stage, wherein the ion beam machining is performed by using any one of neon ion beam, argon ion beam, krypton ion beam, and xenon ion beam, and the observation is performed by using either helium ion or hydrogen ion.

(3) An ion beam machining and observation device, including: a first sample stage for holding a sample; an ion source for generating ion beams of at least two different kinds of gases; an irradiating optical system for irradiating an ion beam onto the sample held on the sample stage, a probe for transporting a micro sample that is extracted from the sample by using a first kind gaseous ion beam machining process, and a second sample stage for holding a sample piece, wherein the probe and the micro sample are observed by a second kind of gaseous ion beam.

(4) A sample cross sectional observation method using an ion beam machining and observation device provided with a sample stage for holding a sample roughly in a horizontal direction; an ion source for generating at least two kinds of gaseous ions with different mass numbers; and an irradiating optical system for irradiating an ion beam onto the sample held on the sample stage, the method including the steps of: irradiating the sample with ions having a relatively large mass number to form a cross section roughly perpendicular to the sample surface; inclining the sample stage around a horizontal axial center; and irradiating gaseous ions with a relatively small mass number onto the cross section and observing the same.

(5) A sample cross sectional observation method using an ion beam machining and observation device provided with a sample stage for holding a sample roughly in a horizontal direction; an ion source for generating at least two kinds of gaseous ions with different mass numbers; and an irradiating optical system for irradiating an ion beam onto the sample held on the sample stage, while being inclined against a vertical axis, the method including the steps of: irradiating the sample with ions having a relatively large mass number to form a cross section roughly perpendicular to the sample surface; rotating the sample stage around a horizontal axial center; and irradiating gaseous ions with a relatively small mass number onto the cross section and observing the same.

(6) An ion beam machining and observation method for sample observation by using an ion beam machining device which includes a sample stage for holding a sample; a gas field ion source for generating at least two kinds of gaseous ions with different mass numbers; and an irradiating optical system for irradiating an ion beam onto the sample held on the sample stage, the method including the steps of: performing a machining process by using any one of neon ion beam, argon ion beam, krypton ion beam, and xenon ion beam; and observing the sample by either helium ion or hydrogen ion.

(7) An ion beam machining and observation method for sample observation by using an ion beam machining and observation device which includes a sample stage for holding a sample; a gas field ion source for generating at least two kinds of gaseous ions with different mass numbers; and an irradiating optical system for irradiating an ion beam onto the sample held on the sample stage, the method including the steps of: performing a machining process by using any one of neon ion beam, argon ion beam, krypton ion beam, and xenon ion beam; forming a nano-pyramid structure of an atom at an ion emitter tip apex; observing the sample by either helium ion or hydrogen ion; and removing the nano-pyramid structure of the atom.

Embodiment 4

Figure 11:
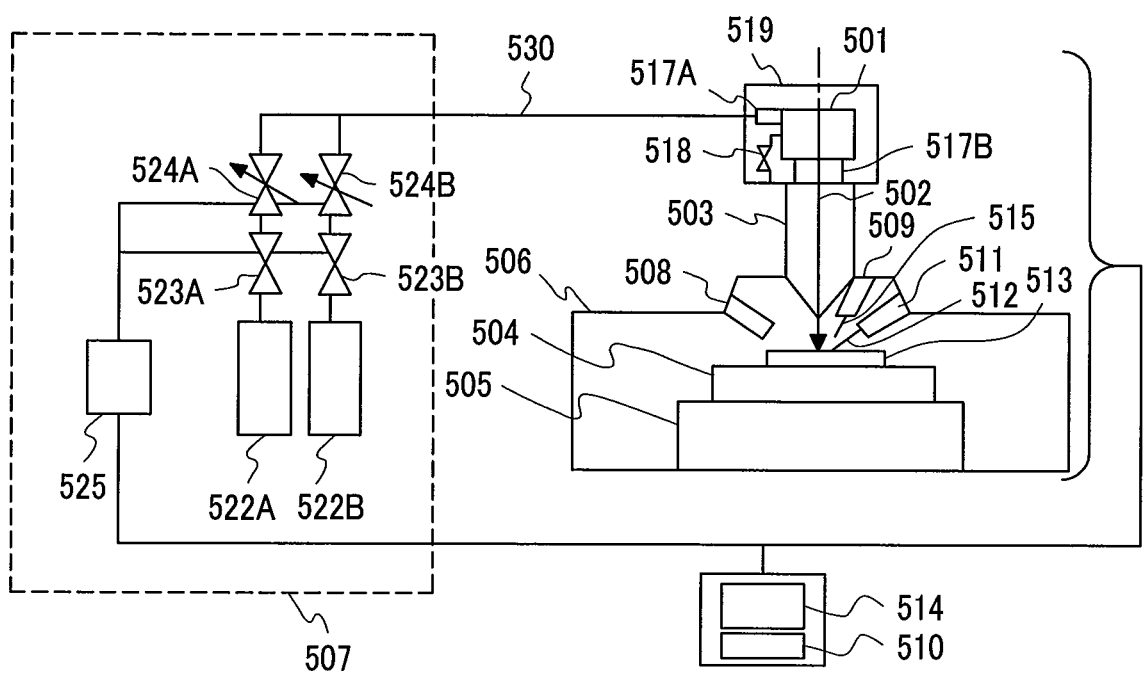
FIG. 11 is a brief schematic view of a charged particle beam processor according to one embodiment of the present invention.

FIG. 11 is a brief schematic view of a charged particle beam processor according to one embodiment of the present invention.

The charged particle beam processor shown in FIG. 11 is constituted by a holder 504 where a sample 13 is mounted and held; an ion source (charged particle beam generating source) 501 for generating an ion beam (charged particle beam) 502; an ion beam column 503 having a machining optical system (charged particle beam optical system) for guiding an ion beam 502 emitted from the ion source 501 to a processed spot; a stage 505 for driving the holder 504 in five-axis directions; a sample chamber 506; an exhaust system (not shown) for exhausting a FOUP (Front Opening Unified Pod), a atmosphere transport unit (not shown), a transport chamber (not shown), the sample chamber 506, etc.; a gas supply system 507 for supplying gas for an ion source (material gas for the charged particle beam, to be described) to the ion beam column 503; a secondary electron detector (SED) 508 for detecting secondary electrons generated from the surface of a sample 513 irradiated with the ion beam 502; a micro sampling unit 509 for extracting a micro sample (micro sample piece) from the sample 513; plural control systems (not shown) for controlling each of the constitutional elements mounted in the charged particle beam processor; a central control unit 510 for controlling the entire charged particle beam processor; a console 514 having a screen such as a GUI (Graphical User Interface); and a gas gun 511 for providing GAD (Gas Assisted Deposition) gas to a beam spot (processed spot) of the ion beam 501 and nearby areas. A GAE (Gas Assisted Etching) gas gun may also be added to perform high-speed hole machining. The sample 513 mentioned here is typically a wafer, but a magnetic head or liquid crystal can be a target sample as well. The following will now explain each unit one after another.

The sample chamber 506 is connected to the exhaust system (not shown) composed of a turbomolecular pump, a dry pump, and an exhaust valve (none of them is shown), and a high vacuum level of 10 to 5 Pa can be obtained with no gas provided thereto. The sample chamber 506 may include a load lock chamber, a atmosphere transport robot (not shown), etc., such that the sample 513 may be taken into or taken out of it.

The stage 505 is designed to be transposed in X and Y-axis directions (horizontal direction) and Z-axis direction (vertical direction), and can also rotate in R direction (rotation direction) or tilt in T direction (tilting direction). The stage 505 is usually tilted when the operator observes a cross section of the sample 513 after sputtering machining by the ion beam 502 is performed, or when a micro sample is extracted from the sample 513. Misalignment due to tilt is calibrated to suppress mismatching of the field of view. The stage 505 can be driven in X and Y-axis directions by means of ball screws/nuts, a DC motor, or an encoder. For instance, in case a φ300 wafer is used as the sample 513, it transposes in the X and Y-axis directions by a certain distance (about 320 mm) for several seconds. The sample 513 is positioned by using laser at a precision on the submicrometer order for example. Meanwhile, a wedge structure is employed to drive the stage 505 in the Z-axis direction, and this positioning also has a precision on the submicrometer order.

The console 514 is composed of a display unit providing a GUI screen, an SEM image, an SIM image, etc., and an input unit such as a keyboard or a mouse.

The secondary electron detector 508 has a built-in scintillator (not shown) to which positive-potential is applied. Reflected electrons or secondary electrons emitted from the surface of the sample 513 when the ion beam 502 is irradiated thereto are pulled by the electric field of the scintillator and accelerated to illuminate the scintillator. Light produced from the scintillator is then guided by a light guide (not shown) to enter a photomultiplier (not shown) and converted to an electric signal therein. The detected electric signal is synchronized with scanning of the ion beam 502 by the machining optical system, and a secondary electron image is thereby generated at the processed spot.

The micro sampling unit 509 has a structure that can be transposed in three (X, Y, and Z-axis) directions. Each axis has a driving transposition distance within a several millimeter range to extract a defect region from the sample 513 and load it onto a mesh 589 (to be described in reference to FIG. 19). The micro sampling unit 509 may be driven by a linear actuator, or a piezoelectric element, and it can manipulate the probe 515 at a positioning precision of submicrometer order. The probe 515 is made out of tungsten for instance, and has a pointed apex portion with a curvature radius of 1 μm or less. If metal contamination due to tungsten is going to be a problem, the probe 515 may be made out of silicon, carbon, or germanium instead.

The gas gun 511 has a gas nozzle 512. At the time of GAD, the gas nozzle 512 moves from its retreated position to near the processed spot of the sample 513 (several hundreds of μm above the processed spot). It takes only several seconds for the gas nozzle 512 to move from its retreated position to near the processed spot. Tungsten carbonyl (W(CO)6) is preferably used as a deposition gas ejected from the gas nozzle 512. Tungsten carbonyl is heated above the temperature of sublimation of a solid to a vapor, and decomposed under the irradiation of a focused ion beam (hereinafter abbreviated to FIB) to form a tungsten layer. If metal contamination due to tungsten is going to be a problem, a carbon based gas such as phenanthrene, or ortho-tetraethyl silicate producing a silicon oxide layer can be another option.

The gas supply system 507 is constituted by plural (e.g., two in this example) gas cylinders 522A and 522B filled with charged particle material gases (X) (charged particle beam material gas) of different kinds from each other to be supplied to the ion source 501; a gas inlet tube 530, via which the charged particle beam material gases from the gas cylinders 522A and 522B are introduced to the ion source 501; stop valves 523A and 523B for circulating/blocking the charged particle beam material gases from the gas cylinders 522A and 522B, respectively; flow control valves 524A and 524B for controlling the flow volume rate of the charged particle beam material gases from the gas cylinders 522A and 522B, respectively; and a valve controller 525 that controls opening/closing of the stop valves 523A and 523B and openness of the flow control valves 524A and 524B.

In case of this embodiment, the gas cylinders 522A and 522B are filled up with oxygen gas and argon gas, respectively. Here, the gas supply system 507 supplies two kinds of charged particle beam material gases to the ion source 501, but three or more kinds of charged particle beam material gases may be supplied to the ion source 501. Besides oxygen gas or argon gas, nitrogen gas, krypton gas, xenon gas, and neon gas can also be utilized. The stop valves 523A and 523B are used provisionally when the flow volume rate cannot be set to 0 by the flow control valves 524A and 524B only. However, if the flow volume rate can be set to 0 by the flow control valves 524A and 524B, the stop valves may be excluded.

Although not shown, the charged particle beam processor has a Z sensor to measure height of the sample 513. With this Z sensor, one can measure the height of the sample 513 at a precision on submicrometer order, and fix the distance between the sample 513 and the ion beam column 503 to a constant value by using the sensing result and by driving the stage 505 in Z direction. Further, the charged particle beam processor includes an optical microscope (not shown) which is used to align the sample 513.

Figure 12:
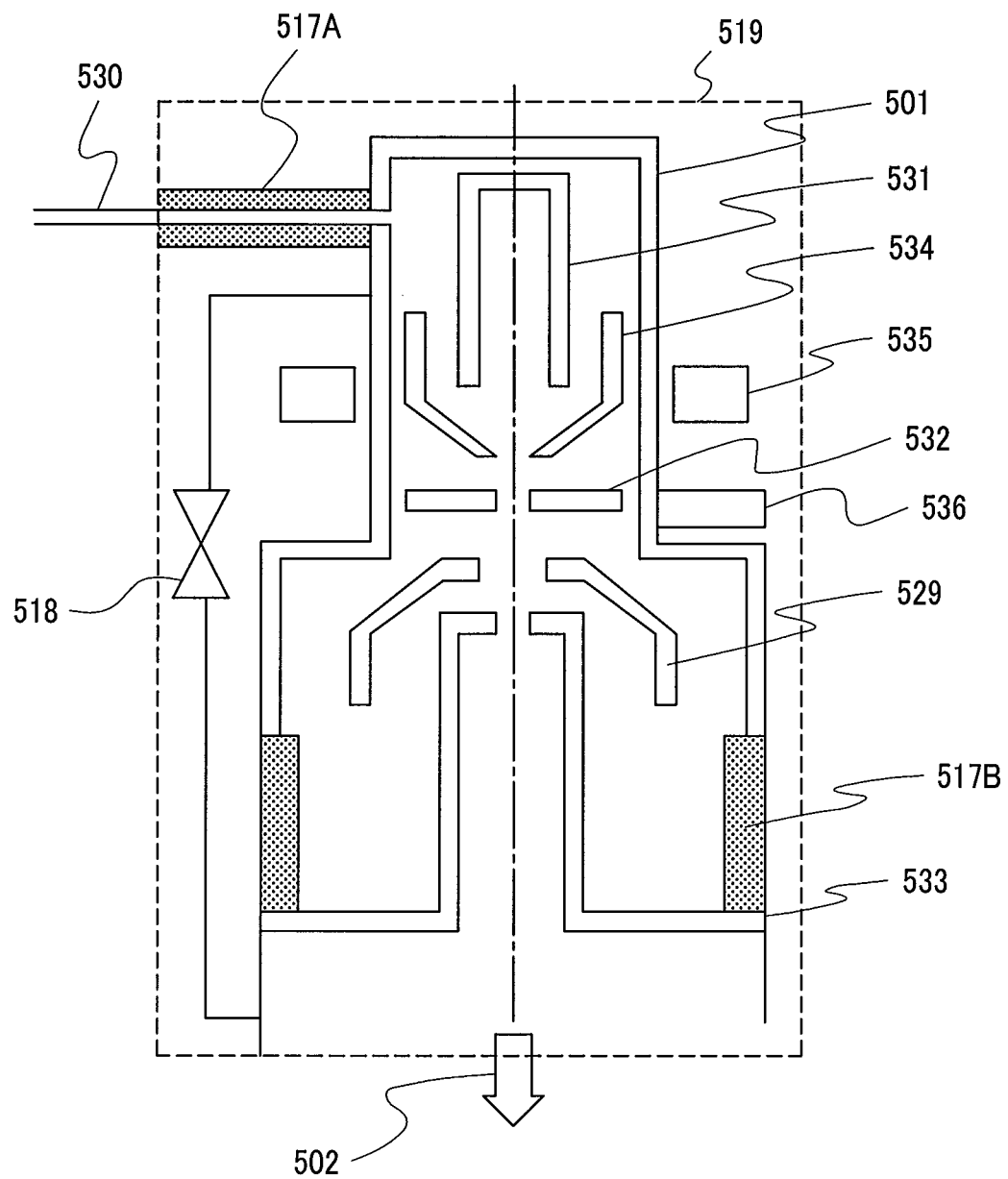
FIG. 12 shows an internal structure of an ion source cover shown in FIG. 11.

The FIG. 12 shows an internal structure of an ion source cover 519 shown in FIG. 11.

Referring to FIG. 12, since an accelerating voltage of about 30 kV is applied to the ion source 501 with respect to the ion source cover 519 having earth potential, at least 40 mm space is interposed between the ion source cover 519 and the ion source 501 for air insulation. The gas supply system 507 is connected to the ion source 501, and a charged particle beam material gas that flows in the gas inlet tube 503 is supplied to the ion source 501. Since the gas supply system 507 is maintained at earth potential, an insulator 517A is interposed between the system and the ion source 501 for insulation from the ion source 501. Likewise, an insulator 517B is interposed between the system and the ion beam column 503 for insulation from the ion beam column 503. A duoplasmatron is preferably used as the ion source 501. Besides the duoplasmatron, a gas field ion source such as helium or argon gas, an inductively coupled plasma ion source, an electron cyclotron resonance plasma ion source, etc., may also be utilized.

When an operator controls the valves 523A, 523B, 524A, and 524B to let the charged particle beam material gases from the gas supply system 507 flow to the ion source 501, and applies a DC voltage between a hollow cathode 531 and an anode 532 while setting the gas pressure inside the ion source 501 to several Torr, a glow charge occurs between the hollow cathode 531 and the anode 532. Then ions are accelerated toward the hallow cathode 531, while the electrons are accelerated toward the anode 532 and collide with the electrode to generate secondary electrons. Prior to the collision with the anode 532, the electrons are ionized as the charged particle beam material gases are electrolytically dissociated. The electrons and the ions are entrapped by an electric field produced by a magnet 535 and generate high density plasma. An ion beam 502 is extracted from this plasma by an electric field around an extractor electrode 533 that is maintained at earth potential. An intermediate electrode 534 is connected to an accelerating power supply (not shown) through a megaohm resistor, and a current value of the ion beam is adjusted mainly by changing bias voltage (voltage that negative potential is added to accelerating voltage) of the bias electrode 529.

A hole in the anode 532 to transmit the ion beam 502 is as small as several hundreds of micrometers and has a small conductance. Because of this, it takes a long period of time to take out the charged particle beam material gas in the ion source 501 toward the ion beam column 503 through the hole in the anode 532. Thus, a bypass flow path having a greater conductance than the anode hole is installed from the ion source 501 to the ion beam column 503 (lower side than the extractor electrode 533), and a bypass valve 518 for opening and closing the bypass flow path is provided midway the bypass flow path. Accordingly, in case of switching a gas supplied from the gas supply system 507 from the charged particle beam material gas of the gas cylinder 522A to the charged particle beam material gas of the gas cylinder 522B (or vice versa), the operator opens the bypass valve 518 having been in closed state and discharges the charged particle beam material gas in the ion source 501 to the ion beam column 503, so that the kind of the charged particle beam material gas in the ion source 501 can be substituted within a short period of time. Vacuum level of the ion source 501 with or without gas being introduced thereto is measured by a vacuum gauge 536. The vacuum gauge 536 is, by its nature, highly resistant against the charged particle beam material gas that is introduced to the ion source 501.

Figure 13:
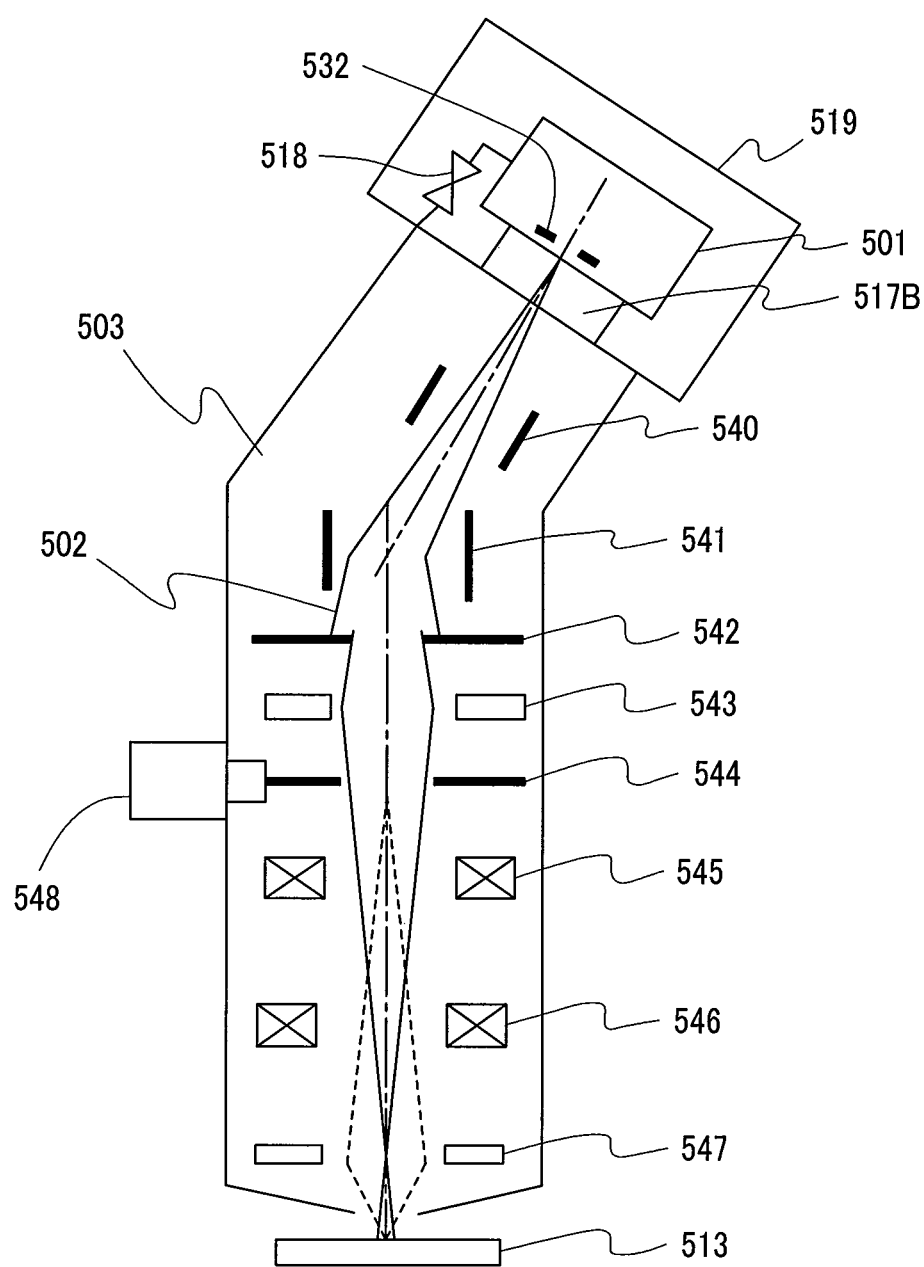
FIG. 13 shows the internal structure of the ion beam column shown in FIG. 11.

FIG. 13 shows an internal structure of the ion beam column 503.

The ion beam column 503 includes a machining optical system constituted by a mass separator 540, a deflector 541, an iris 542, an irradiation lens 543, a projection mask 544, an aberration corrector 545, a projection lens 547, an alignment coil (not shown), a Blanker (not shown), and a Faraday cup (not shown).

The ion beam column 503 is bent by a few degrees in inclined form as shown in FIG. 13, such that neutral particles of metal sputtered materials in the ion source 501 may not directly reach the sample 513. The neutral particles are irradiated onto a damper (not shown). This damper is made of silicon, carbon, or the like to prevent metal contamination due to sputtered particles.

The mass separator takes out only a necessary ion beam out of the ion beams 502 that are extracted from the ion source 501, and the deflector 541 curves the ion beam by a few degrees. Moreover, a gun valve (not shown) is installed to separate the sample chamber 506 where the sample 513 is mounted and part of the ion beam column 531. This gun valve is used, for example, when only the sample chamber 506 leaks during maintenance of the sample chamber 506. A preferable example of the deflector 546 is an eight-pole deflector to scan the sample 513 with an ion beam that passed through the projection mask 544 and has a circular cross section for observation.

Figure 14:
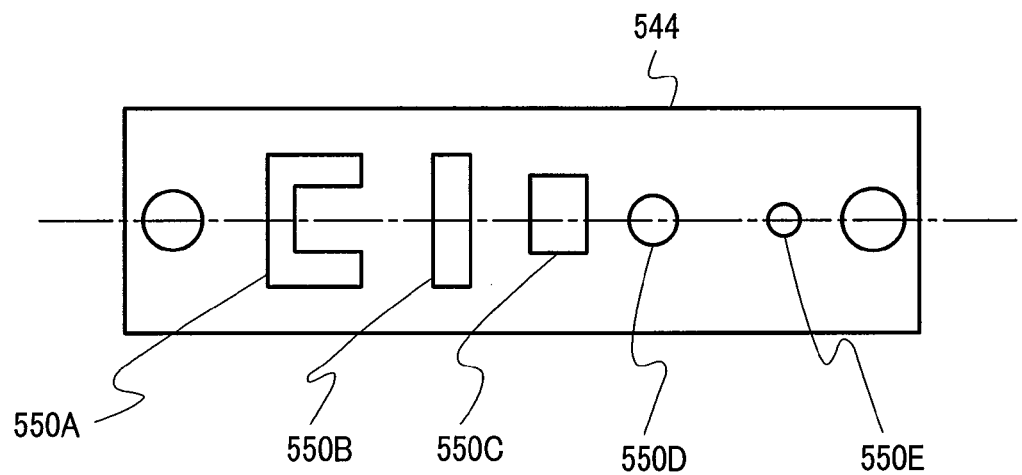
FIG. 14 is a diagram showing diverse apertures formed in the projection mask shown in FIG. 13.

FIG. 14 is a diagram showing diverse apertures formed in the projection mask 544.

As shown in FIG. 14, the projection mask 544 has an angled U-shape aperture 550A for extracting a micro sample, a linear aperture 550B, a rectangular aperture 550C mainly for use in deposition, a relatively large circular aperture 550D mainly for use in probe adhesion, a relatively small aperture 550E mainly for use in observation, and an aperture (not shown) with a comparatively large aspect ratio of height/width for use in membrane machining, and only a beam that has passed through this aperture is converted by the projection lens 547 and irradiated onto the sample 513. The projection mask 544 is made out of silicon to prevent metal contamination. Hereinafter, ion beams that passed through the apertures 550A through 550E will be called O-700, O-500, O-200, O-100, and O-20, respectively.

Figure 15:
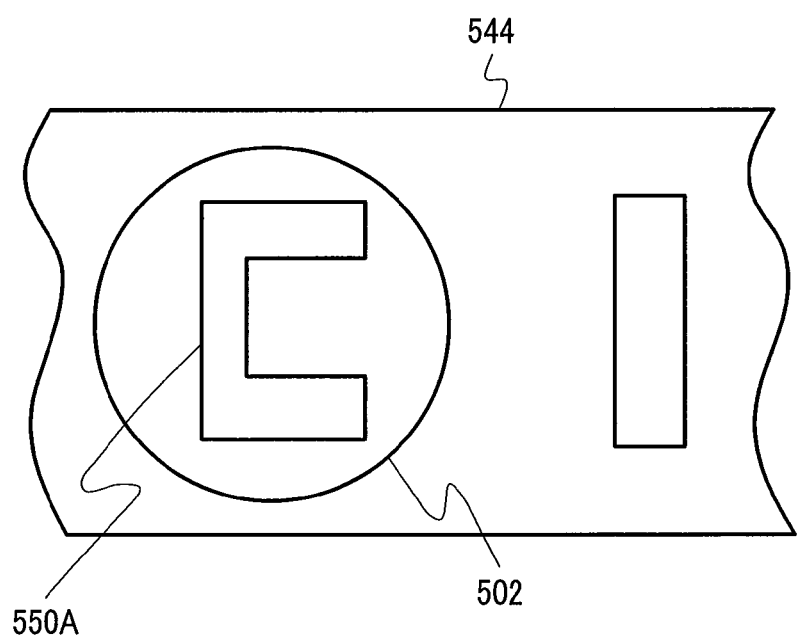
FIG. 15 shows the profile of an ion beam irradiated onto the projection mask shown in FIG. 13.

FIG. 15 shows the profile of an ion beam 502 irradiated onto the projection mask 544.

In case of forming a cross section of the ion beam 502 by using the projection mask 544, it is important to increase a beam current having passed the projection mask 544 to a maximum in order to prevent a beam omission. To this end, size and position of the ion beam 502 are modified to be circumscribed to a target aperture of the projection mask 544. FIG. 15 illustrated a case where the projection mask 544 has one of each kind for the apertures, but a number of apertures of the same shape can also be formed to get a super life span of the projection mask 544.

FIG. 16 schematically shows two kinds of beam modes available by the machining optical system. FIG. 16(*a*) shows an ion beam in projection mode, and FIG. 16(*b*) shows an ion beam in observation mode.

In the projection mode of FIG. 16(*a*), an irradiation lens 543 is adjusted to obtain a sharp machining shape by decreasing aberration, so that an aperture image of an anode 532 can be formed on a projection lens 547. The irradiation lens 543 and the projection lens 547 are respectively composed of three sets of Butler lenses for example, and an image of the projection mask 544 is being formed at a sample 513 by the projection lens 547. Here, voltages of about 9 kV and about 20 kV are applied to the irradiation lens 543 and the projection lens 547, respectively, and the magnification rate is approximately $\frac{1}{16}$ for instance.

In the observation mode of FIG. 16(*b*), image formation is carried out on the side of the ion source 501 of the projection mask 544, and this image is formed again at the sample 513 by the projection lens 547. Therefore, the magnification rate of the image in the projection mode can be reduced to, say, $\frac{1}{30}$, and the diameter of a beam spot can be minimized as small as several tens of nanometers for example. When this beam is scanned by the deflection coil 546, a secondary electron image of high resolution compared with an image in the projection mode, is obtained. In the observation mode, voltages of about 23 kV and about 20 kV are applied to the irradiation lens 543 and the projection lens 547, respectively.

Figure 17:
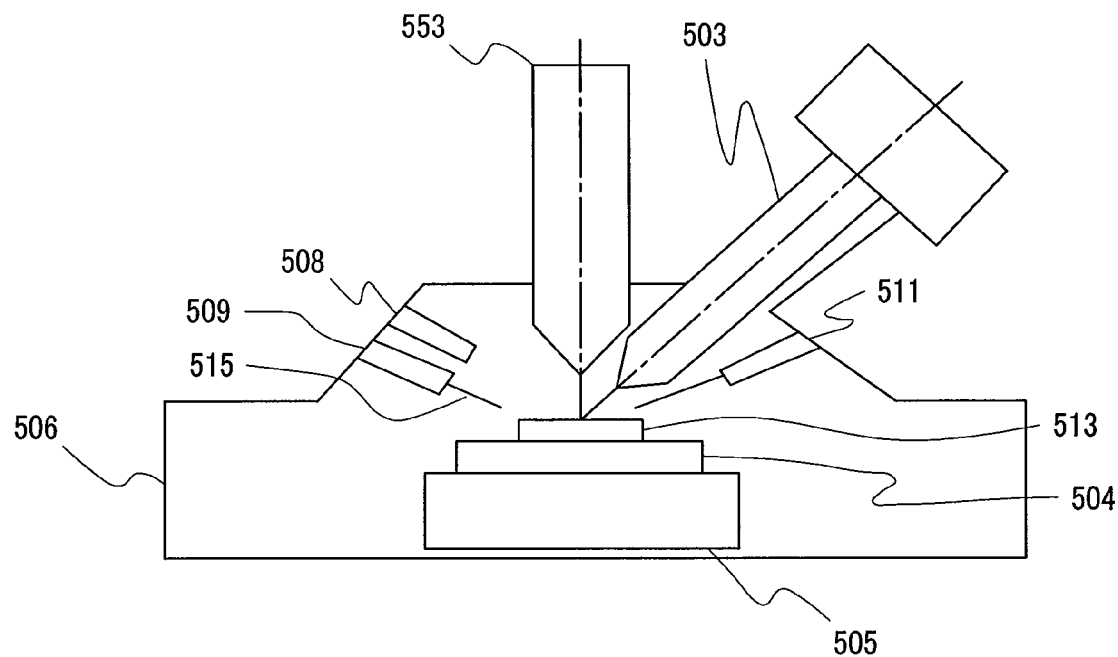
FIG. 17 shows an FIB-SEM device according to an embodiment of the present invention.
Figure 18:
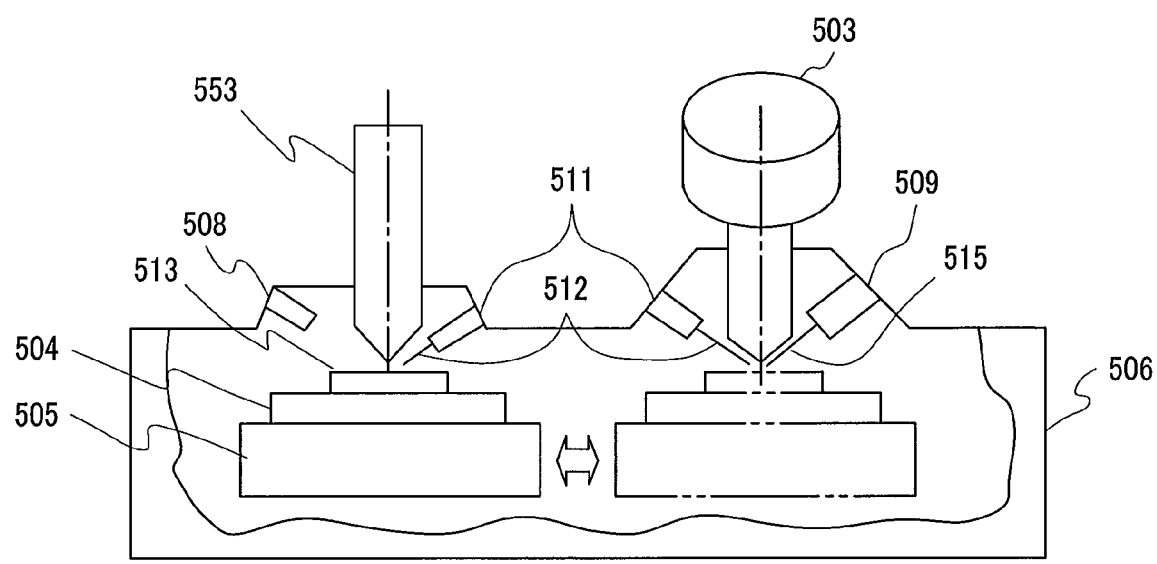
FIG. 18 shows an FIB-SEM device according to another embodiment of the present invention.

The present invention is not limited to the FIB device as shown in FIG. 11, but can be applied to the FIB-SEM device as shown in FIG. 17 or FIG. 18 as well. The charged particle beam processor of the present invention can be configured by installing the gas supply system 507 at the FIB-SEM device shown in FIG. 17 or FIG. 18. The gas supply system 507 is not shown in FIGS. 17 and 18, but all like elements or elements having the same functions to those of FIG. 11 and others are given like reference numerals, and descriptions of them are omitted.

The FIB-SEM device shown in FIG. 17 is substantially identical with the charged particle beam processor shown in FIG. 11, except that a SEM (scanning electron microscope) 553 using a processed spot by the ion beam column 503 as an observation spot is added. In this case, there is a merit that a device operator can machine the sample 513 with an ion beam and clearly observe a machined plane of the sample 513 in real time. On the other hand, in case of the FIB-SEM device shown in FIG. 18, an observation spot of the SEM 553 and a processed spot by the ion beam column 503 are separated, and the stage 505 moves between the observation spot of the SEM 553 and the processed spot by the ion beam column 503. In this case, since installation spaces for both sides are secured without having to worry about the interference between the SEM 553 and the ion beam column 503, the SEM 553 or the ion beam column 503 can approach the sample 513 more easily than in the configuration example of FIG. 17, and a high-resolution observation image is obtained.

Figure 19A:
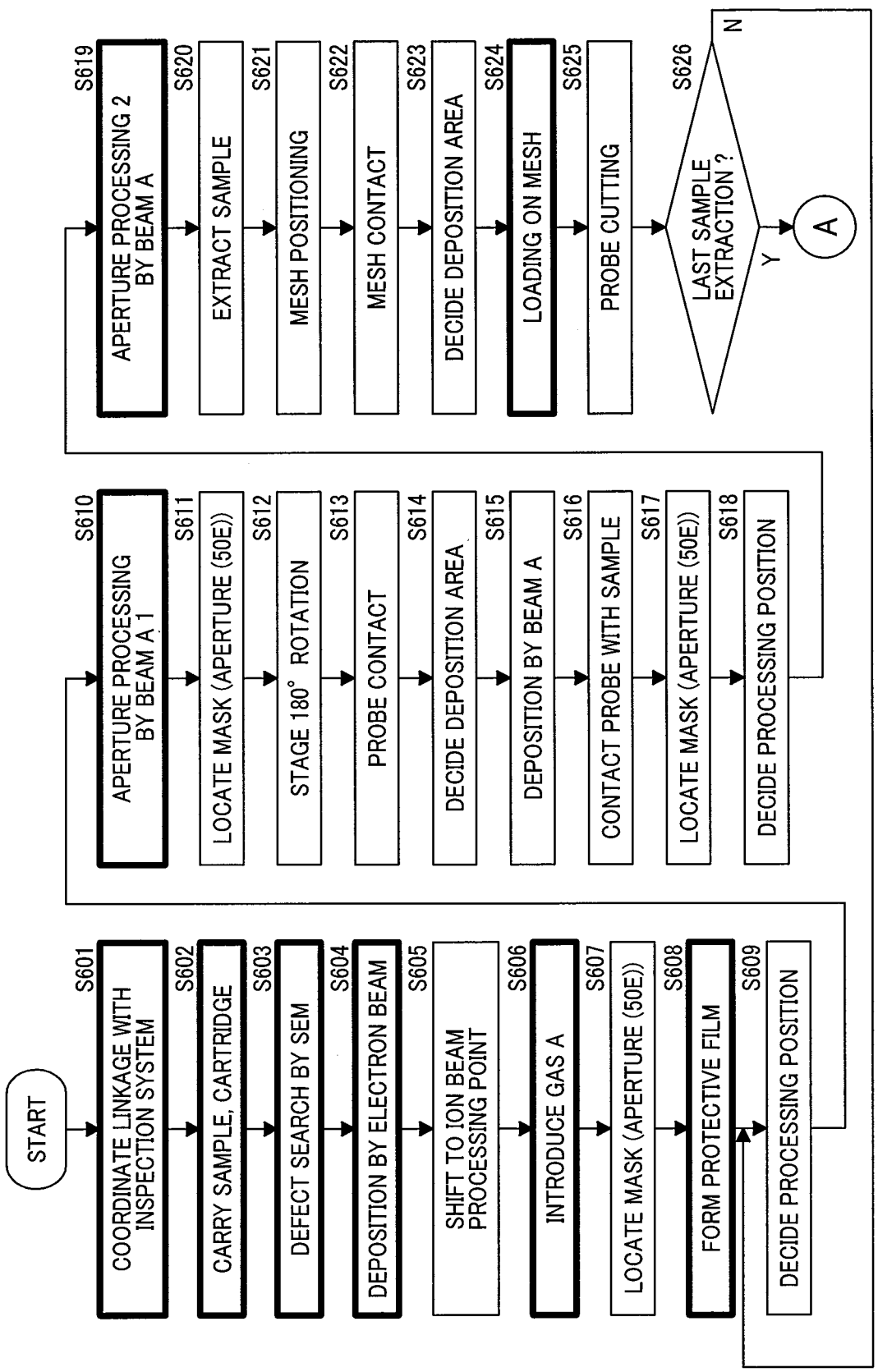

FIGS. 19A and 19B respectively illustrate a flow chart describing a sequence of procedure starting from extracting a defect in a sample by using the charged particle beam processor depicted in FIG. 18 to returning the sample with the defect extracted to the line. In particular, FIGS. 19A and 19B explain a procedure, wherein a defect such as a contact failure in a plug of a chip is discovered by the SEM, a micro sample including the defect is machined and extracted by an ion beam, and a processed hole of the sample after sampling is filled up to be returned to the production line. The following will now explain in detail about principal processes shown in FIG. 19A and FIG. 19B.

(1) Coordinate Linkage with the Detection Device

Before coming to this process, defects of the sample 513 are inspected by an electronic inspection device, a BF (Bright Field) inspection device, a DF (Dark Field) inspection device, or the like, and are classified by the review SEM. At this time, the review SEM first performs ADR (Automatic Defect Review) through low-resolution observation (review mode), and then performs ACD (Automatic Defect Classification). The review SEM classifies the defects into different kinds, i.e. separation, foreign matter, flaw, and dust, and further classified them into short, open, convex defect, concave defect, and VC (voltage contrast) defect. Defect information includes coordinate values where a defect lies, kind of a defect, SEM image of a defect, and so on.

Based on the inspection information obtained by the review SEM, the charged particle beam processor of FIG. 18 conducts microsampling of a defect region, observes and analyzes the defect. Therefore, in step S101, the defect region of the sample 513 should be matched precisely with the machined spot of the ion beam 502, and another device (review SEM) that obtained the defect information should be matched with an origin of the coordinates. Here, an operation called coordinate linkage is performed and as a result, coordinate position-matching within an error of several micrometers can be possible.

(2) Sample, Cartridge Carrying

φ300 silicon is used as the sample 513, and the cartridge is for carrying out a micro sample extracted from the sample 513 outside the charged particle beam processor.

Figure 20:
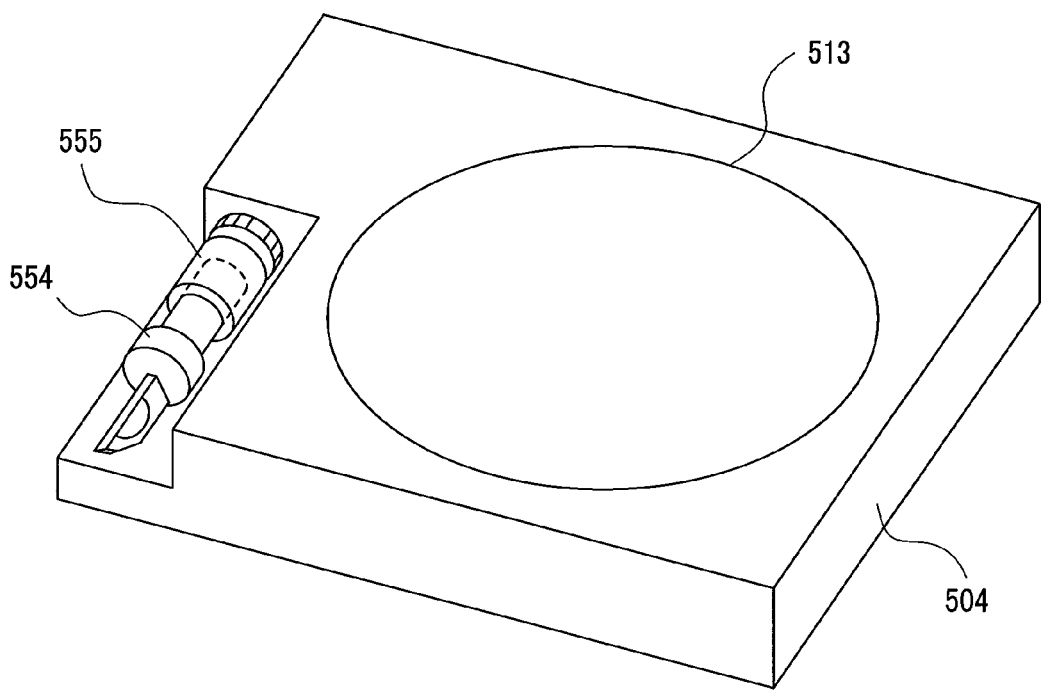
FIG. 20 is a perspective view of a holder shown in FIGS. 17 and 18.

FIG. 20 is a perspective view of the holder 504.

Referring to FIG. 20, a cartridge holder 555 is attached to the holder 504, and the cartridge 554 is detachable from the cartridge holder 555. The cartridge holder 555 is designed to be able to rotate around the axial direction by a rotation mechanism (not shown). The sample 513 and the cartridge 554 are loaded onto the holder 504 disposed at a load lock chamber by a sample mounting unit (not shown) and a cartridge mounting unit (not shown). The load lock chamber is exhausted by an exhausting system (not shown) to a vacuum. After the sample 513 and the cartridge 554 are mounted, the holder 504 standing by in the load lock chamber is transposed by the stage 505 to an observation spot by the SEM 553 inside the sample chamber 506 (S102).

(3) Defect Searching by SEM

In step S103, the defect region is transposed into the field of view of the SEM 553 within a position error of several micrometers by coordinate linkage with the review SEM. Accurate position matching can be done by finding, by the naked eye, a feature point indicating the location of the defect region.

(4) Deposition by Electron Beam

Figure 21:
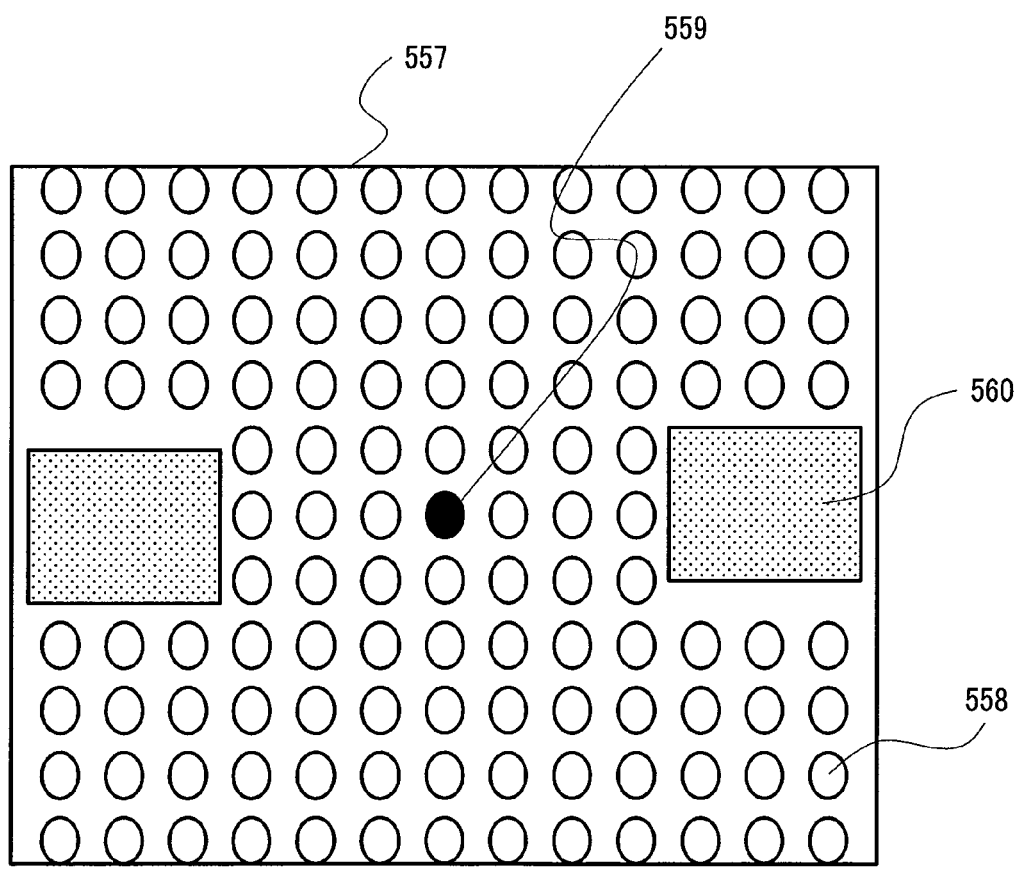
FIG. 21 shows an SEM image of a defect region.

FIG. 21 shows an SEM image 557 of the defect region.

Like the SEM image 557 illustrated in FIG. 21, the defect region such as the plug 558 looks relatively dark compared with a normal region when observed by VC (Voltage Contrast) (defect region 559).

In general, brightness of a plasma source of the gas ion beam is considerably low compared with a gallium ion source which is a liquid metal ion source being widely used in FIB devices. Meanwhile, because a sufficient amount of secondary electrons is required to get a clear image with a large S/N ratio, it is necessary to set a minimum beam diameter for the gas ion beam to be relatively large, and therefore a low-resolution image is obtained. Normally, a gas ion beam is at least several tens of nanometers in diameter, so it is very difficult to obtain a clear, high-magnification image of the plug 558 having a diameter of several nanometers at the most.

Therefore, in step S104, after identifying the defect region by the SEM 553, a mark 560 of several micrometers in size is formed nearby the defect region by electron beam deposition, so that the position of the defect region can easily be detected also by a gas ion beam. FIG. 21 shows a state where the mark 560 is formed on both sides of the defect region 559. To increase the deposition speed to a maximum, an electron beam accelerating voltage is set to a relatively low accelerating voltage (about 1 kV), and an electron beam of several tens of pA is irradiated for several minutes to form a rectangular mark with a side being several micrometers long. When this step is over, the operator drives the stage 505 and moves the holder 504 to an ion beam machined spot (S105).

(5) Introduction of Gas A

In step S106, a charged particle beam material gas A (oxygen gas) in the gas cylinder 522A is introduced to the ion source 501. At this time, openness of the flow control valve 524A is adjusted in advance to be able to take out the oxygen ion beam with a high current stably. When the operator opens the stop valve 523 from its closed state, oxygen gas flows into the ion source 501 through the gas inlet tube 530.

Following the introduction of gas A, an accelerating voltage of 30 kV is applied, and a predetermined voltage is applied to the hallow cathode 531 as well as the bias electrode 529. Here, voltage of the anode 532 equals to the accelerating voltage. The extractor electrode 533 is maintained at earth potential, and an ion beam 502 is extracted by an electric field with the accelerating voltage. And the projection mask 544 is position matched to let the aperture 550E fit into the beam size (diameter) of the ion beam 502 (S107). The ion beam 502 on the surface of the sample 513 has a diameter of about 100 nm. The deflection coil 546 scans this beam onto the sample to obtain an SIM observation image.

(6) Formation of Protective Layer

In step S108, a protective layer is formed on the upper surface of each defect region 559 of the sample 513 to prevent the defect region(s) from being cut out by sputtering during the observation of the SIM image.

Figure 22:
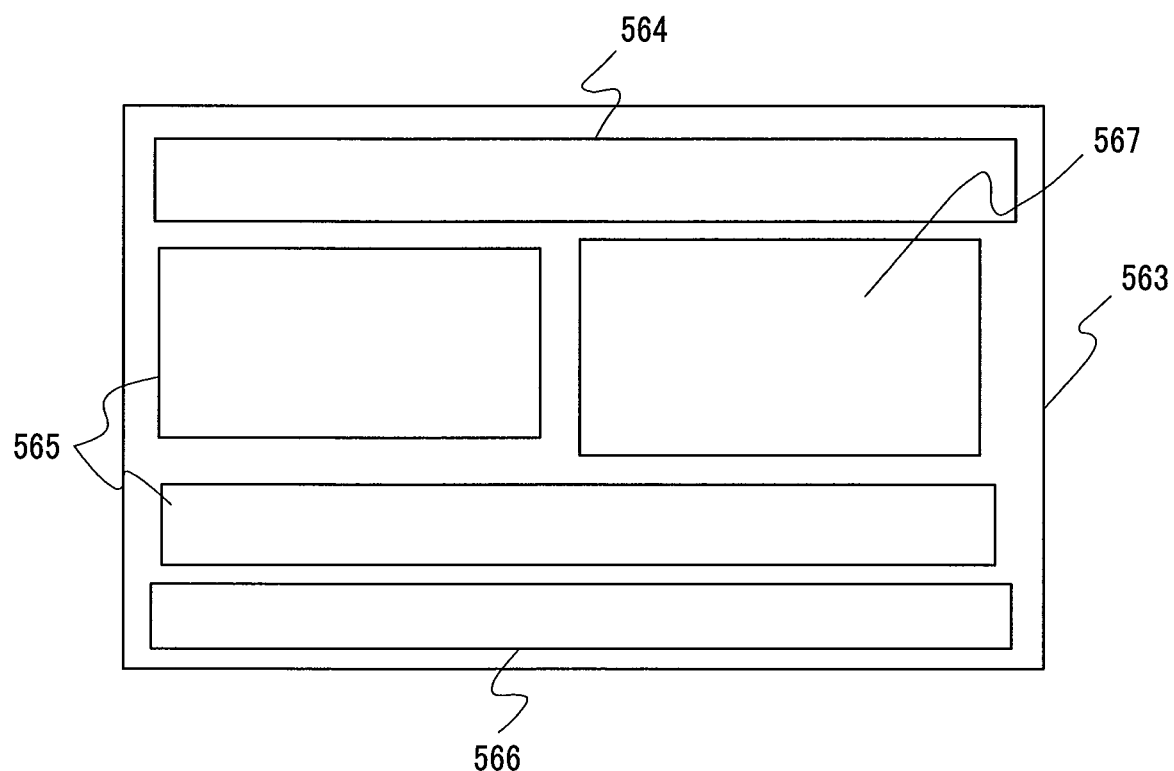
FIG. 22 shows a display screen of a console.

FIG. 22 shows a display screen of the console 514.

The display screen 536 in FIG. 22 presents an alarm display section 564, a beam parameter display screen section 565 which displays current of a beam of which beam focus contrast brightness is being machined, machining time and the like, a navigation screen section 566 which allows the operator to select an operation such as a job system recipe dialogue, and a machining manipulation screen section 567 for designating a machining process.

Figure 23:
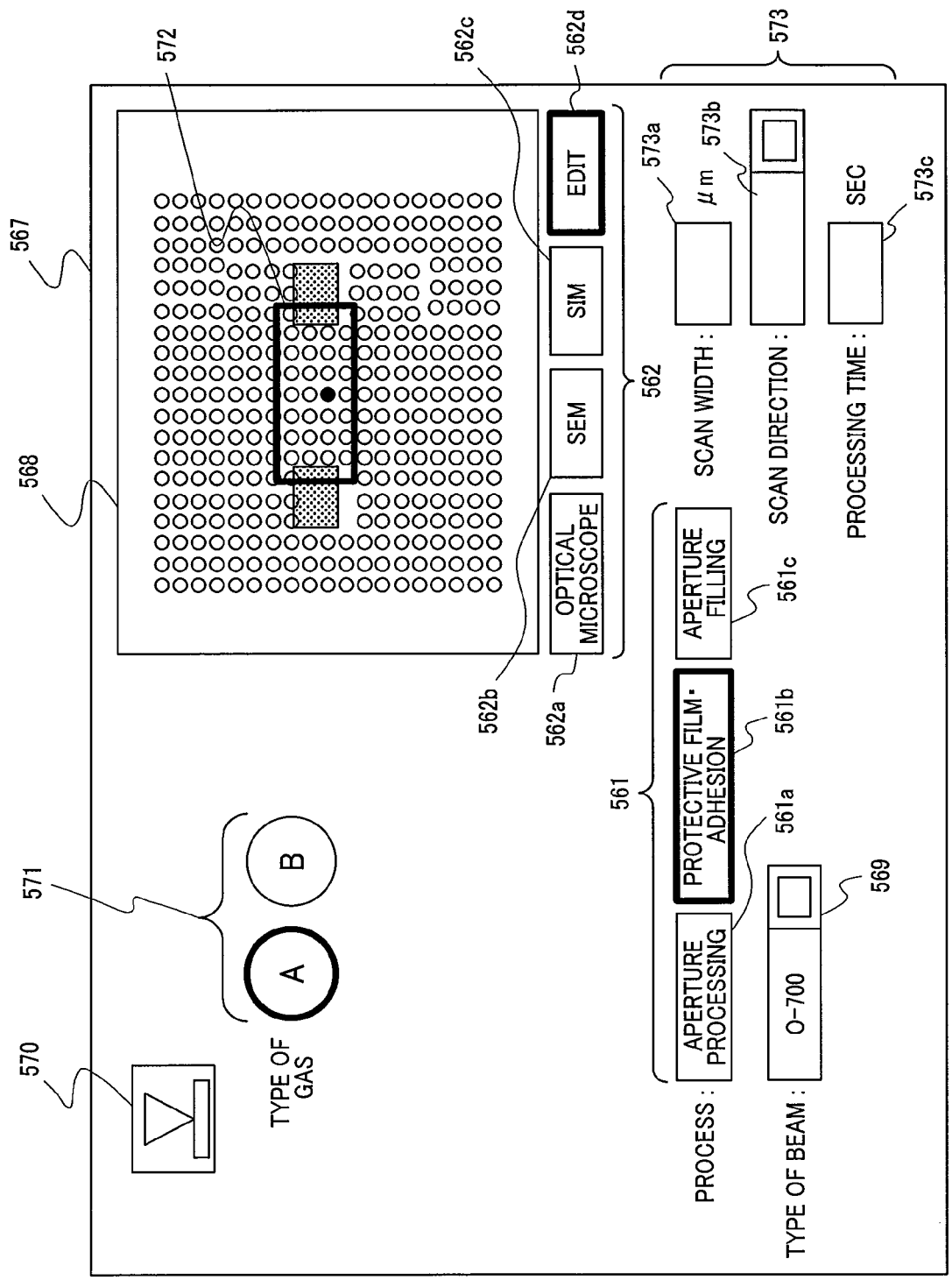
FIG. 23 shows a machining manipulation screen section for designating a protective layer forming area.

FIG. 23 shows the machining manipulation screen section 567 used for designating a protective layer forming area.

As shown in FIG. 23, the machining manipulation screen section 567 displays a machining start button 570, a gas kind display lamp 571 for informing the kind of a charged particle beam material gas being currently used, a process selection area 561 for selecting a process, a monitor screen 568 for displaying a sample observation image, a button 569 for designating the kind of a beam, a display selection area 562 for switching the display of the monitor screen 568, and a machining condition input unit 573 through which the operator inputs desired machining conditions.

The process selection area 561 displays a hole machining button 561a used for commanding hole machining, a protective layer/adhesive button 561b used for commanding the projective layer formation/adhesion jobs, and a hole filling button 561c used for commanding a hole filling operation. The display selection area 562 displays an optical microscope button 562a used for switching the display of the monitor screen 568 to an optical microscopy image, an SEM button 562b used for switching the display to an SEM image, an SIM button 562c used for switching the display to a SIM image, and an edit button 562d. The machining condition input unit 573 displays a hole machining beam scan width designation blank portion 573a, a scan direction designation blank portion 573b, and a machining time designation blank portion 573c. As such, the operator may input numbers required for the hole machining process for example to those designation blank portions 73a through 73c.

FIG. 23 illustrates a case where the operator selected A (oxygen gas) as the kind of a charged particle beam material gas, "Protective layer/adhesion" for the process, and switched the display of the monitor screen 568 to the edit screen. The monitor screen 568 displays a rectangle that indicates a perspective protective layer forming area 572. This protective layer film forming area 572 appears on the monitor screen 568 when the operator presses the protective layer/adhesion button 561b in the process. In result, the operator can form a protective layer, while adjusting the position of the displayed protective layer forming area 572.

At this time, to make the protective layer forming area 572 of the monitor screen 568 coincide with an actual deposition area, positions of an ion beam by the aperture 550E and the aperture 550C of the projection mask 44 are adjusted in advance by the deflection coil 546. In like manner, ion beam positions by other apertures are all adjusted in advance with respect to the position of the ion beam 502 by the aperture 550E in advance.

Tungsten carbonyl (W(CO)6) is preferably used as GAD gas for forming a protective layer. To prevent metal contamination, TEOS producing a silicon oxide layer, or a carbon based gas such as phenanthrene can be used as another option.

Figure 24:
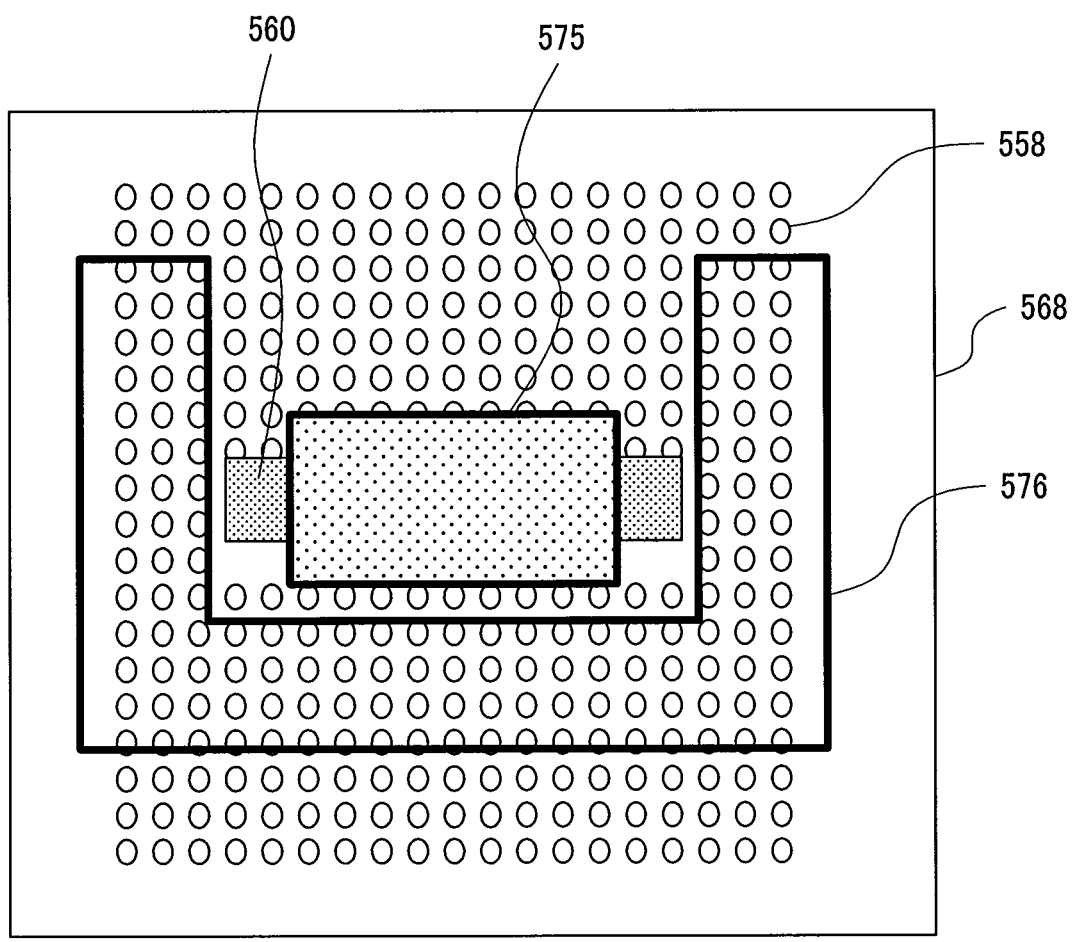
FIG. 24 shows an SIM image after the deposition layer is formed.

When the operator presses the button 570, the gas nozzle 512 of the gas gun 511 approaches the processed spot from its retreated position, and GAD gas is sprayed from the nozzle 512. Next, the projection mask 544 is switched from the aperture 550E to the aperture 550C, the ion beam (projection beam) 502 passed the aperture 550C is projected onto the sample 513, and a deposition layer is accumulated at the projective layer forming area 572 by a reaction with the GAD gas. The ion beam 502 is not scanned but halts at the same position all the time during the deposition. For instance, a 1 μm thick deposition layer is formed every 1 minute. FIG. 24 shows an SIM image after the deposition layer is formed. Reference numeral 575 in FIG. 24 indicates the protective layer.

Apart from the sample machining (processing) by a projection beam having a cross section formed by the projection mask 504, it is possible to scan the ion beam 502 onto the protective layer forming area 572 to accumulate the projective layer.

(7) Hole Machining 1 by Beam A

When the operator manipulates the hole machining button 561a of the process selection area 561, an angled U-shape machining area 576 as shown in FIG. 24 appears. Then the operator determines a machining position (S109) by transposing the machining area 576 to a predetermined position in the monitor screen 568, and executes an angled U-shape hole machining (S110) by the ion beam 502 (beam A) by a charged particle beam material gas A. During the angled U-shape hole machining, the projection mask 544 is position matched to make the aperture 550A fit into the beam diameter of the ion beam 502.

Figure 25:
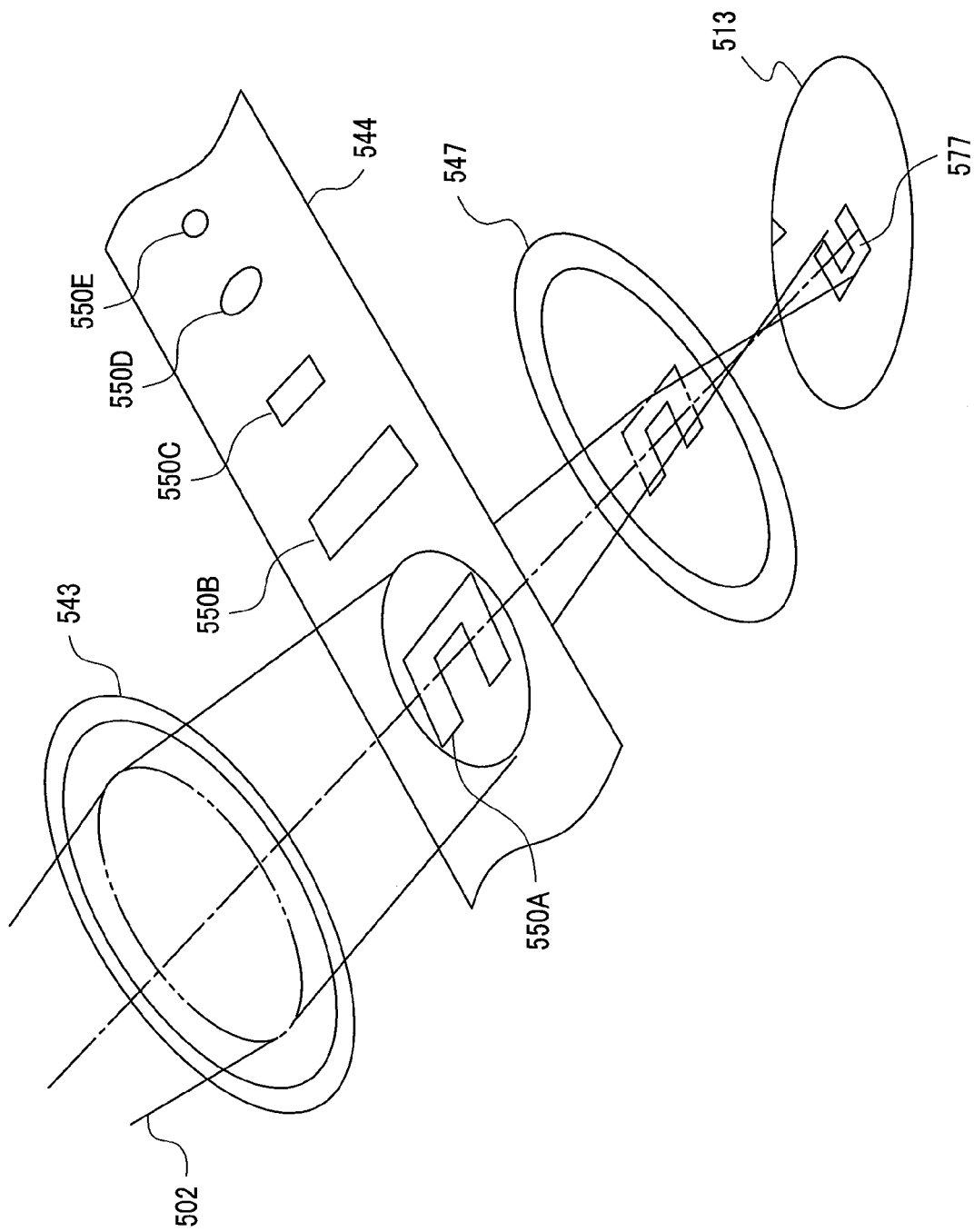
FIG. 25 shows an angled U-shaped projection beam and part of the machining optical system shown in FIG. 13.

FIG. 25 shows a state where an angled U-shape projection beam is extracted by matching the projection mask 544 with the aperture 550A, and the sample 513 is being machined. FIG. 25 shows part of the machining optical system shown in FIG. 13.

For example, the angled U-shape hole machining is performed for several minutes at the beam current of 100 nA and at the machining speed of 1 μm/min. The ion beam 502 is converged by the irradiation lens 543 and irradiated to the projection mask 544. Only the ion beam passed through the aperture 550A of the projection mask 544 forms an image on the sample 513 by the projection lens 547. At this time, the ion beam 502 is inclined at about 45 degrees with respect to the horizontal direction (the stage 505 is tilted around the T axis to make the sample 513 tilted by 45 degrees with respect to the ion beam column 503).

Following the machining process, the projection mask 544 is position matched (S111) to cause the aperture 550E to fit within the beam diameter of the ion beam 502, and the sample 513 is rotated by 180 degrees (S112).

Figure 26:
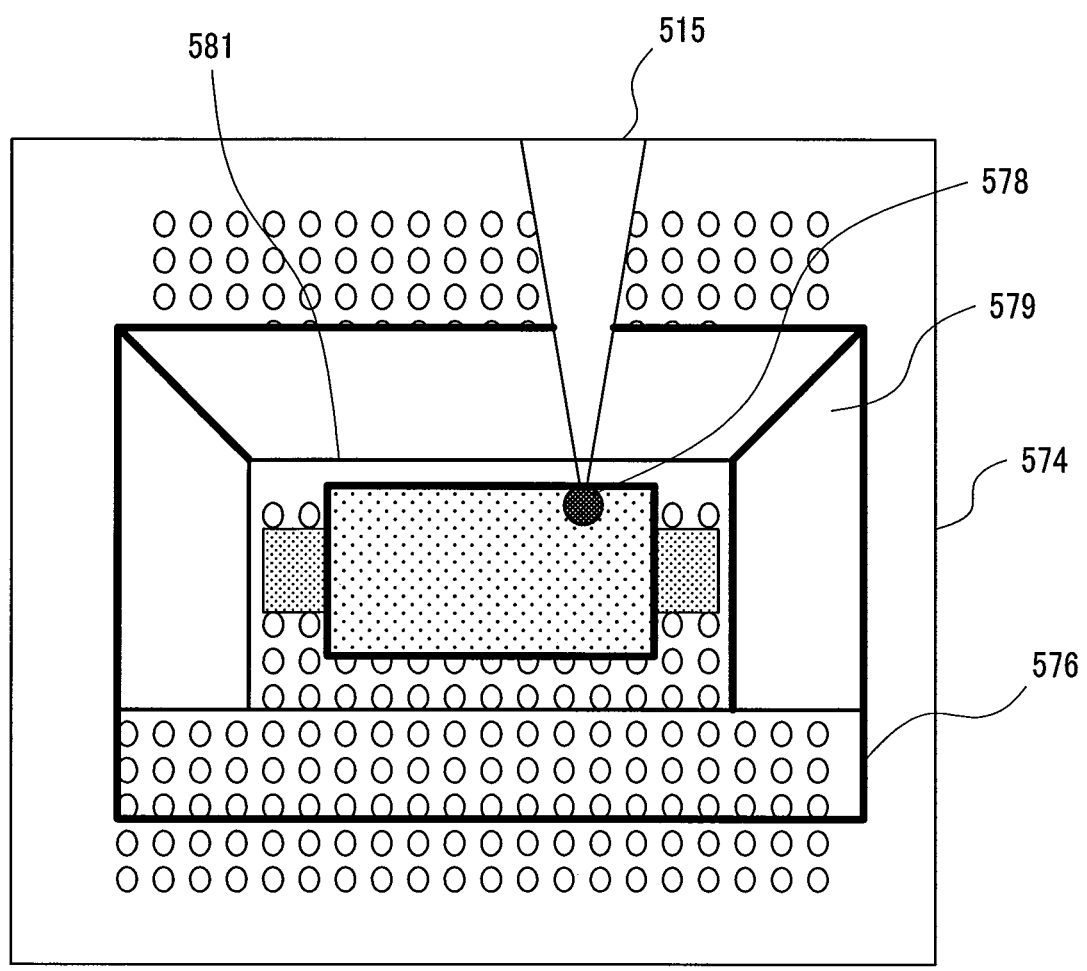
FIG. 26 shows an observation image of the monitor screen after the angled U-shaped hole is machined.

FIG. 26 shows an observation image of the monitor screen 568 after the angled U-shape hole is machined. In particular, FIG. 26 is a screen that appears after the operator manipulates the edit button 562d in the display selection area 562. After the angled U-shape hole machining is completed and the stage 505 is rotated, the operator, while watching the screen of FIG. 26, moves the probe 515 into the field of view to bring it into contact with the inner area (micro sample 581) of the angled U-shape processed hole 579 of the sample 513 (S113), and defines a contact region as a deposition area by beam A (S114). In other words, the operator brings the probe 515 into contact with a suitable position in the deposition area. While the gas gun 511 is ejecting the GAD gas near the contact region between the probe 515 and the sample 513, the ion beam 502 (beam A) is irradiated to form a deposition layer 578 (S115) and the probe 515 and the micro sample 581 are adhered by the deposition layer 578 (S116). The ion beam 502 having passed through the aperture 550D of the projection mask 544 was used to form the deposition layer 578. In this example, the probe 515 is made out of silicon materials to prevent metal contamination.

After the adhering step of the probe 515, the operator carries out position-matching (S117) of the projection mask 544 to cause the aperture 550E to fit within the beam diameter of the ion beam 502. Next, the operator manipulates the hole machining button 561a of the process selection area 561 to display a linear shaped machining area 576 on the monitor screen 568. While watching an SIM image by the ion beam 502 having passed the aperture 550E, the operator transposes, within the monitor screen 568, the machining area 576 to a position surrounding the angled U-shape processed hole 579 together with the adhesion portion of the probe 515, so as to determine a machining position (S118). Later, the projection mask 544 is position matched to cause the aperture 550B to fit within the beam diameter of the ion beam 502.

(8) Hole Machining 2 by Beam A

FIG. 27 shows a state where a linear projection beam is extracted by matching the projection mask 544 with the aperture 550B, and the sample 513 is being machined. FIG. 27 shows part of the machining optical system shown in FIG. 13.

In this process, a micro sample 581 is cut out and extracted (S102) by machining a hole with the linear ion beam 502 (beam A) (S119). The linear hole machining lasted several minutes at the beam current of about 60 nA.

Figure 28A:
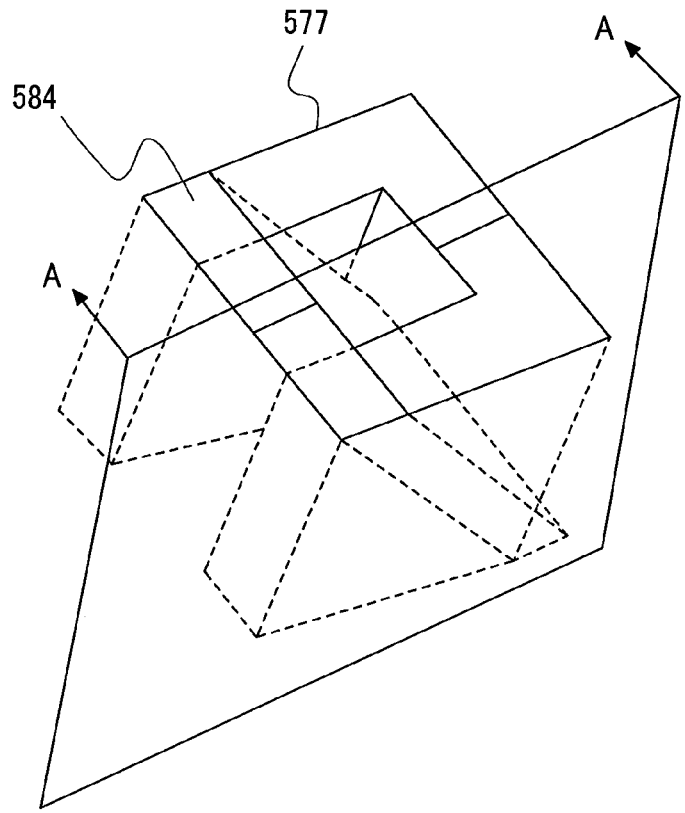
FIG. 28A shows projected images of an ion beam at the state where the micro sample is extracted and machined.
Figure 28B:
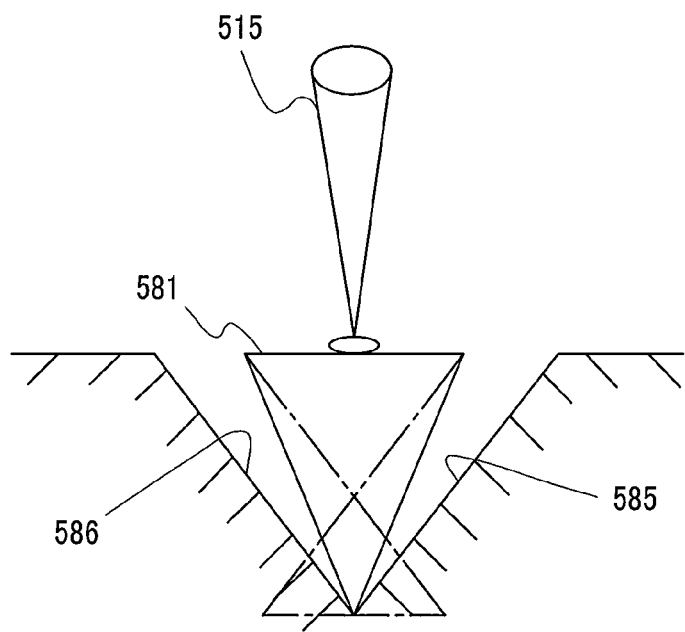
FIG. 28B shows a cross-section view taken along lines A-A in FIG. 28A.

FIG. 28 shows a state where the micro sample of this embodiment is extracted and machined. In particular, FIG. 28(a) shows projected images 577 and 584 of the ion beam 502 that has passed through the apertures 550A and 550B, respectively, and FIG. 28(b) shows an A-A cross section in FIG. 28(a).

In fact, the processed hole by the projection beam that passed through the apertures 550A and 550B becomes gradually narrower in a hole depth direction by reattachment at the hole portion. Thus, as shown in FIG. 18(b), the processed trenches 585 and 586 have a triangular shape. For instance, the micro sample 581 to be extracted becomes approximately 10×10×11 (size in micrometers) for width×length×height.

In the course of hole machining by the projection beam that passed the apertures 550A and 550B, contrast of the micro sample 581 is degraded. Because of this phenomenon, separation of the micro sample 581 from the sample 513 can be recognized. This change in contrast occurs because the micro sample 581 being separated from the sample 513 has a floating potential, and the amount of secondary electrons generated from the micro sample 581 during the ion beam irradiation is reduced. If it is difficult to judge on the observation image by the naked eye, a contact sensor may be used for separate detection.

(9) Loading into Mesh

Figure 29:
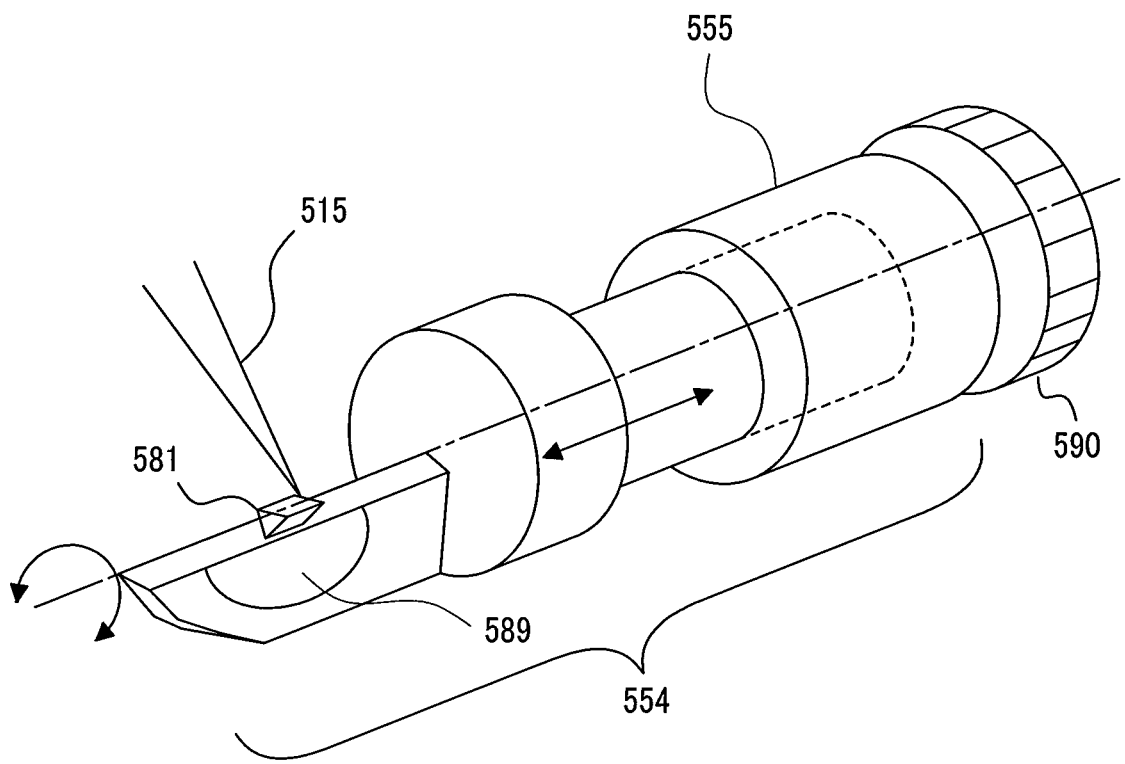
FIG. 29 shows a micro sample loaded to a cartridge.

FIG. 29 shows a state where the micro sample 581 is loaded to the cartridge 554.

When the micro sample 581 is separated from the sample 513, the operator drives the stage 505 and creates a mesh position so that a mesh 589 of the cartridge 554 becomes near the ion beam processed spot (S121). Then the operator drives the probe 515 to bring the micro sample 581 into contact with the mesh 589 (S122), and determines a deposition area (S123) where a deposition layer used to adhere the mash 589 and the micro sample 581 is formed. While the gas gun 511 is ejecting GAD gas, the ion beam 502 is irradiated to form a deposition layer, and the micro sample 581 is adhered and loaded to the mesh 589 (S124). Next, the tip of the probe 515 is cut by the ion beam 502 (S125). The ion beam 502 that passed through the aperture 550D is used for cutting the probe 515.

Figure 30:
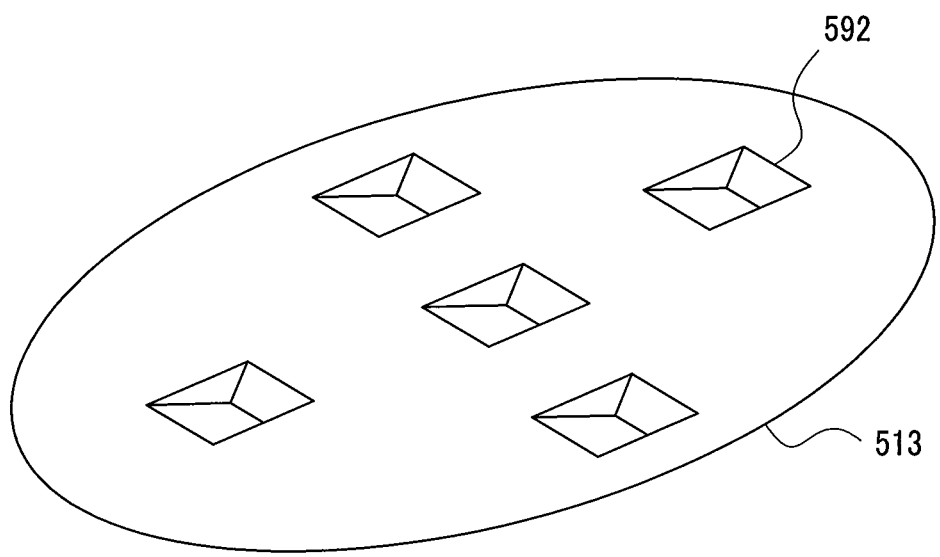
FIG. 30 illustrates a sample having five processed holes formed as a result of extracting a micro sample.

After the probe 515 is cut, it is decided whether the extracted micro sample 581 is a final sample of the present current sample 513, based on the inspection information obtained in advance by the review SEM (S126). That is, it is decided whether there are more defect regions to be extracted from the sample 513 being currently microsampled. If there is still a defect region to be sampled, the operator drives the stage 505, transposes a next sampling spot to an ion beam processed spot, and repeats the step (S109) in "Hole machining 1 by beam A". Meanwhile, if there is no more defect region to be sampled, the sample extraction sequence of FIG. 19A ends, and the processed hole filling step (S201) of FIG. 19B is executed. FIG. 30 illustrates a sample 513 having five processed holes 592 formed in result of extracting a micro sample.

The sample extraction sequence of FIG. 19A was done by sampling a defect region for inspection and analysis of the defect, but the same sequence of FIG. 19A can be applied equally to a method called 'Fixed point observation' that carries out microsampling of a predetermined inspection spot on the sample 513 and inspects quality of the sample 513.

The extracted micro sample 581 is then taken out to the outside of this charged particle beam processor, and observed/analyzed by an STEM (Scanning Transmission Electron Microscope) with higher resolution or a TEM (Transmission Electron Microscope). In this way, the cause of defects can be discovered more accurately at high speed, and measures can be taken immediately to deal with the defects.

In case of observing a sample by a TEM or an STEM, both being a transmission type, the micro sample 581 should be made into a membrane. Although not shown particularly, the charged particle beam processor can make the micro sample 581 into a membrane. This membrane machining (or processing) of the micro sample 581 is carried out without scanning a beam but in the projection mode shown in FIG. 16(a). To obtain a sharp processed plane out of a cross section to be formed into a membrane, the projection mask 544 needs to be arranged in such a manner that the major axis direction of a membrane machining slit and the membrane machining direction of the micro sample 581 are at right angles (about 90 degrees) with each other. This is because aberration such as spherical aberration decrease as it gets nearer the beam center, and as a result, the machined plane becomes sharper.

In projection mode, however, the resolution is not high enough to designate an area to perform the membrane machining as described in FIG. 16. Thus, the membrane machining position is determined in observation mode of FIG. 16(b) where a sufficiently high resolution is provided. Optical conditions are different for the beam in observation mode and for the beam in projection mode, and position misalignment of beam due to axial misalignment occurs. Therefore, when a machining position needs to be designated in observation mode, its misalignment amount should be observed in advance and the offset is calibrated to designate a machining area. Here, a gear 590 is installed at the cartridge holder 555. Since the cartridge holder 555 can be rotated by driving a motor engaged with the gear 590, the operator can randomly change the observation direction of the micro sample 581 or the membrane machining direction.

The micro sample extraction procedure ends here. Proceeding to FIG. 19B, the following will now explain the work flow on processed hole-filling.

(10) Introduction of Gas B by Closing the Bypass Valve from its Open Position

Figure 31:
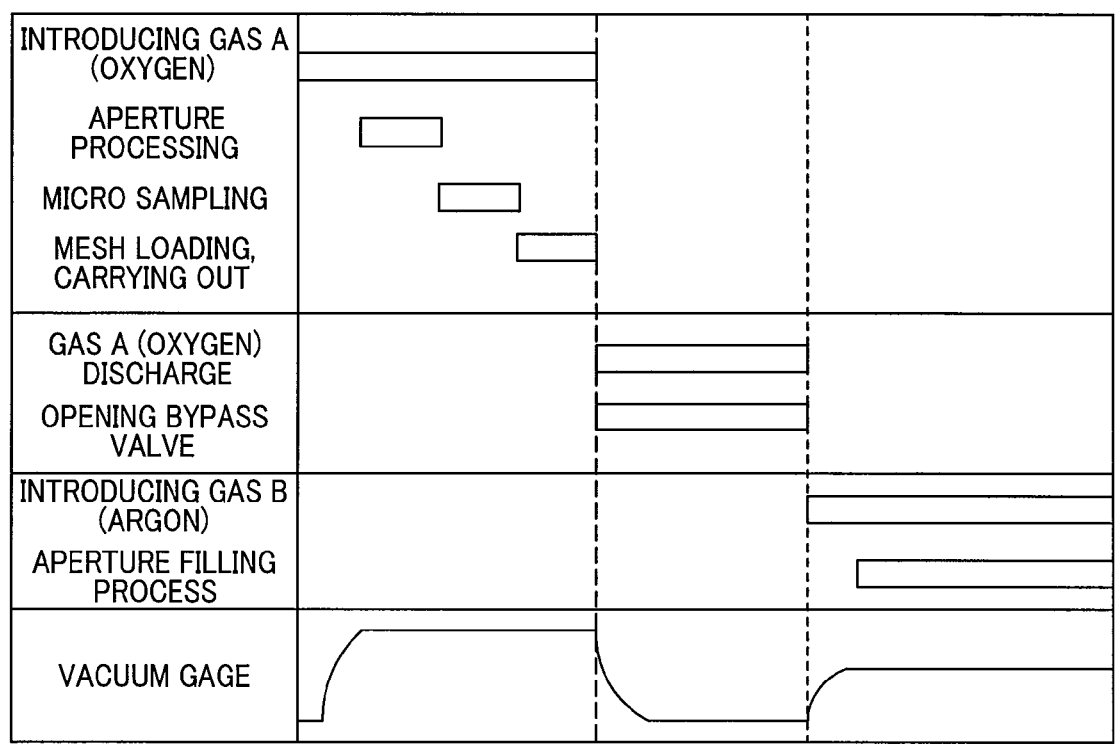
FIG. 31 is a timing chart showing the timing of the principle steps in the work flow performed according to the flow chart of FIGS. 19A and 19B.

FIG. 31 is a timing chart of principal steps in the work flow shown in FIGS. 19A and 19B.

As shown in FIG. 31, in the sample extraction procedure of FIG. 19A, the charged particle beam material gas A (oxygen gas) was introduced to the ion source 501 to extract an oxygen ion beam, and the steps of hole machining at a defect region, micro sampling, and mesh loading were then performed in sequence. Next, the operator opens the bypass valve 518 (S201) to discharge the charged particle beam material gas A (oxygen gas) from the ion source 501 at high speed, and makes it close at a certain vacuum level (if the vacuum level falls below a set threshold) (S202), thereby introducing a charged particle beam material gas B (argon gas) (S203). Thus, the hole filling work is done by using the argon ion beam.

To execute the hole filling work, the kind of a charged particle beam material gas to be introduced to the ion source 501 is switched to a gas kind B (argon gas). Before switching to the charged particle beam material gas kind B (argon gas), any remaining charged particle beam material gas A (oxygen gas) in the ion source 501 has to be removed. To this end, the operator opens the bypass valve 519 connected to the ion source 501 that was in its closed position, and allows the charged particle beam material gas A to be discharged from the ion source 501 at high speed. In detail, to stop the introduction of the charged particle beam material gas A (oxygen gas), the operator manipulates the valve controller 525 to close the stop valve 523A that was in its open position and, at the same time, opens the bypass valve 518 that was in its closed position. In result, the vacuum level of the ion source 501 that was around several hundreds of Pa under the introduction of beam A (oxygen gas) gradually decreases until it reaches a previously set threshold (e.g., around 1 E-3 Pa) or less, the operator closes the bypass valve 518 that was in its open position. Next, the operator opens the stop valve 523B that was in its closed position and introduces the charged particle beam material gas B (argon gas) to the ion source 501. Meanwhile, the flow control valve 524B is adjusted in advance to be able to get an ion beam current and stability required to realize the high-speed hole machining.

(11) Deposition by Beam B

Following the introduction of the charged particle beam material gas B (argon gas) to the ion source 501 by using the same method in the introduction of the charged particle beam material gas A (oxygen gas), plasma was ignited (S204), an acceleration voltage was applied, and an argon ion beam (beam B) 502 was extracted. Since the kind of a charged particle beam material gas and the ion beam current required for hole machining are different from those for hole filling, conditions for generating an ion beam, such as, accelerating voltage, cathode application voltage, bias voltage, and gas volume flow rate, are different from each other. However, the central processing unit 510 may automatically change the ion beam generating conditions to previously set conditions according to the kind of a charged particle beam material gas. And the projection mask 544 is position matched to cause the aperture 550E to fit within the beam diameter of the ion beam 502 (S205).

Figure 32:
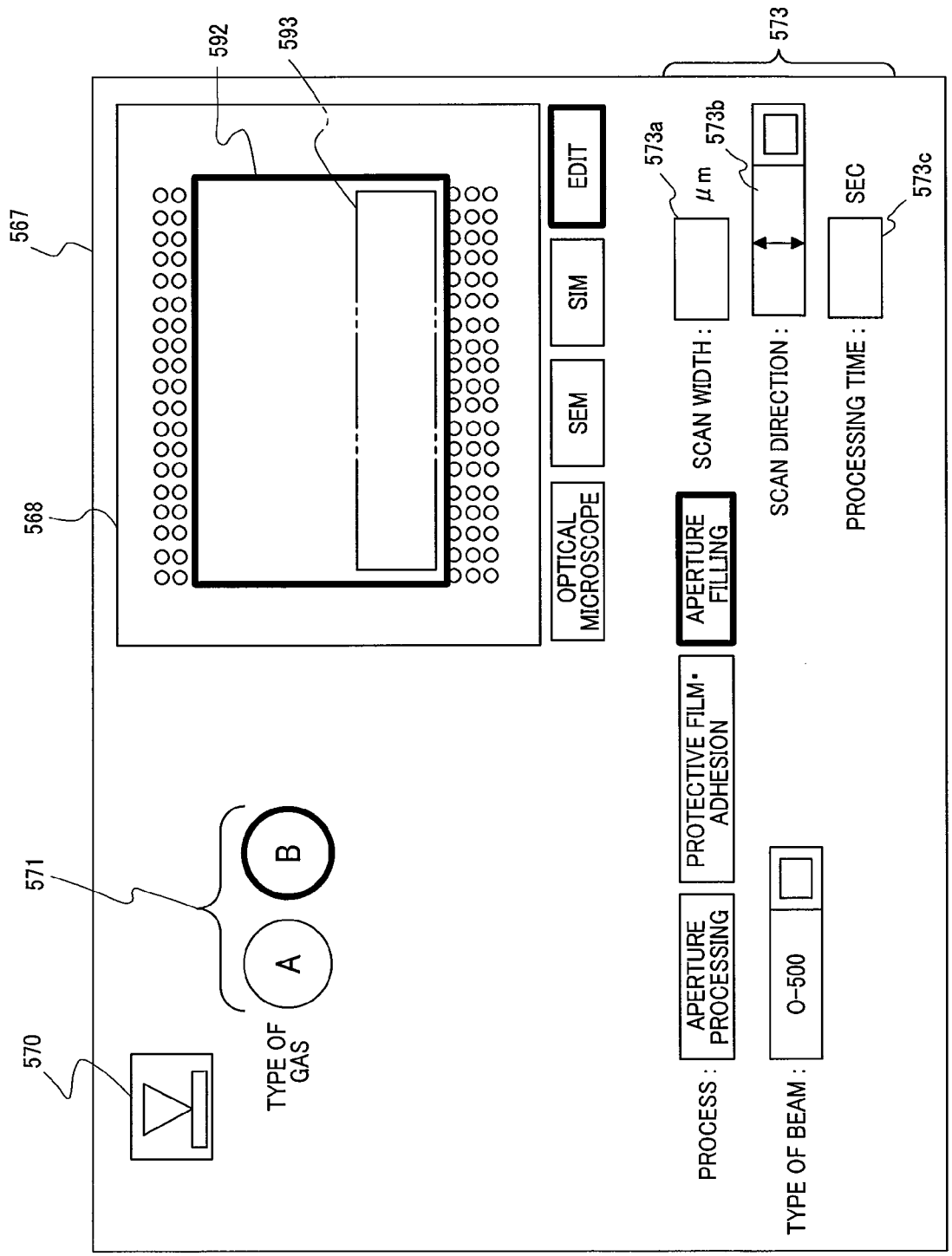
FIG. 32 shows a machining manipulation screen section used for designating a hole filling process area.

FIG. 32 shows the machining manipulation screen section 567 used for designating a hole filling process area.

FIG. 32 illustrates a hole filling process where gas B (argon gas) is used as the charged particle beam material gas and the O-500 is selected as the kind of the beam. When the processed hole 592 of the sample 513 is formed as deep as the lower portion of the monitor screen 568, a formed image is dark as much as the lower portion. The operator designates scan direction and scan width by inputting corresponding information to the designation blank portions 573a and 573b in a manner that the O-500 ion beam 93 passed through the aperture 550B of the projection mask 544 is scanned onto the entire area of the processed hole 592. For example, the scan direction is set to be a vertical direction seen on the drawing, and the scan width is set to several tens of micrometers. While watching the SIM image by the ion beam that passed through the aperture 550E, the operator transposes the stage 505 (S206) to bring the processed hole 592 to the ion beam processed spot, and determines a deposition area (S207). Later, the projection mask 544 is position matched (S208) to make the linear aperture 550B fit into the beam diameter of the ion beam 502.

Figure 33:
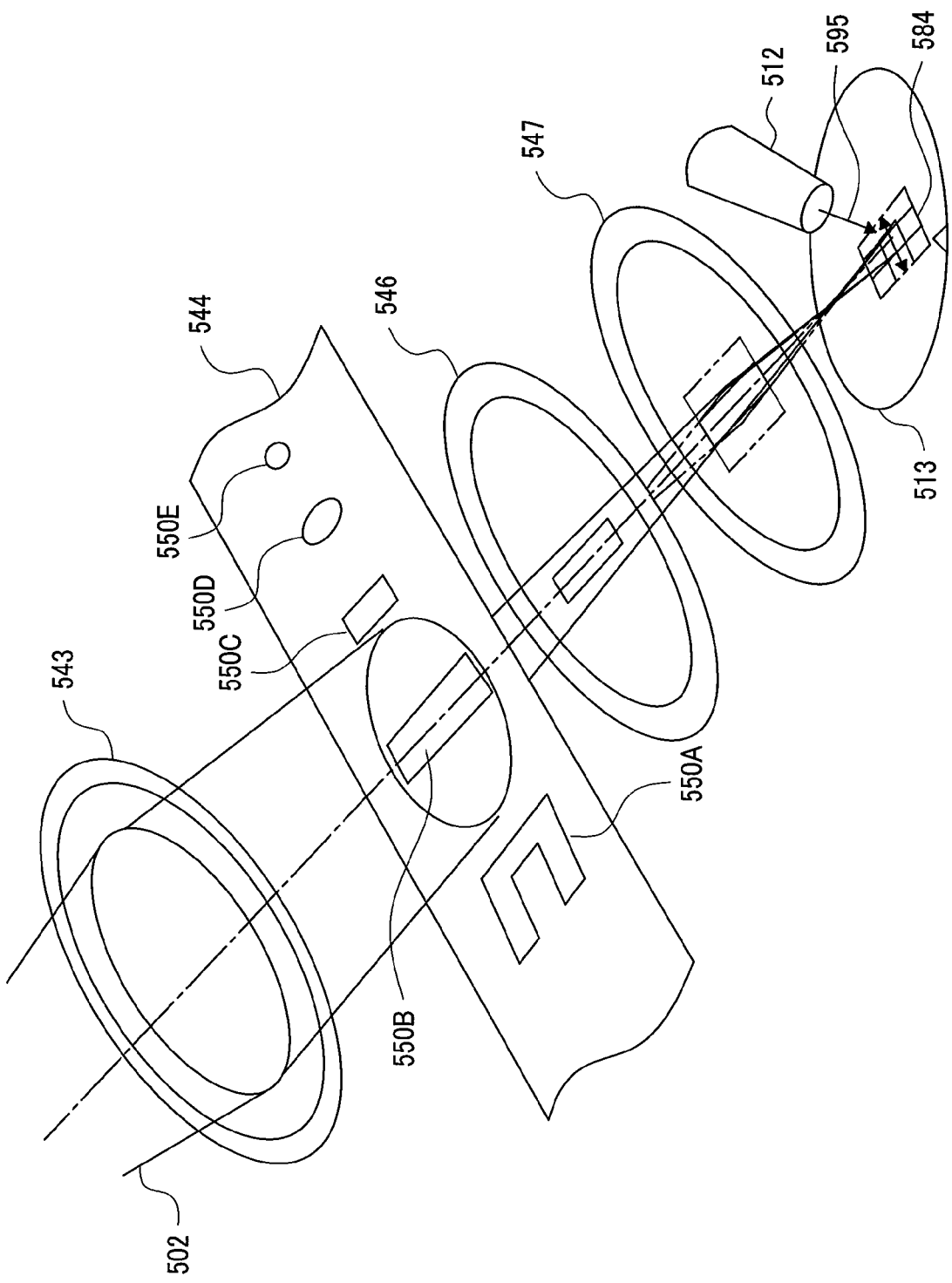
FIG. 33 is a schematic diagram of a projection beam used for the hole filling process.

FIG. 33 is a schematic diagram of a projection beam being used for the hole filling process.

In FIG. 33, the projection mask 544 is position matched to let the linear aperture 550B fit into the beam diameter of the ion beam 502, and the ion beam 502 having a rectangular cross section is irradiated onto the sample 513. The ion beam 502 then reacts with GAD gas 595 from the gas nozzle 512, and a deposition layer is accumulated at the processed hole 592 as the ion beam 502 is scanned thereon (S209). Deposition speed and ion beam current are predetermined to proper values, according to acceleration voltage.

Figure 34:
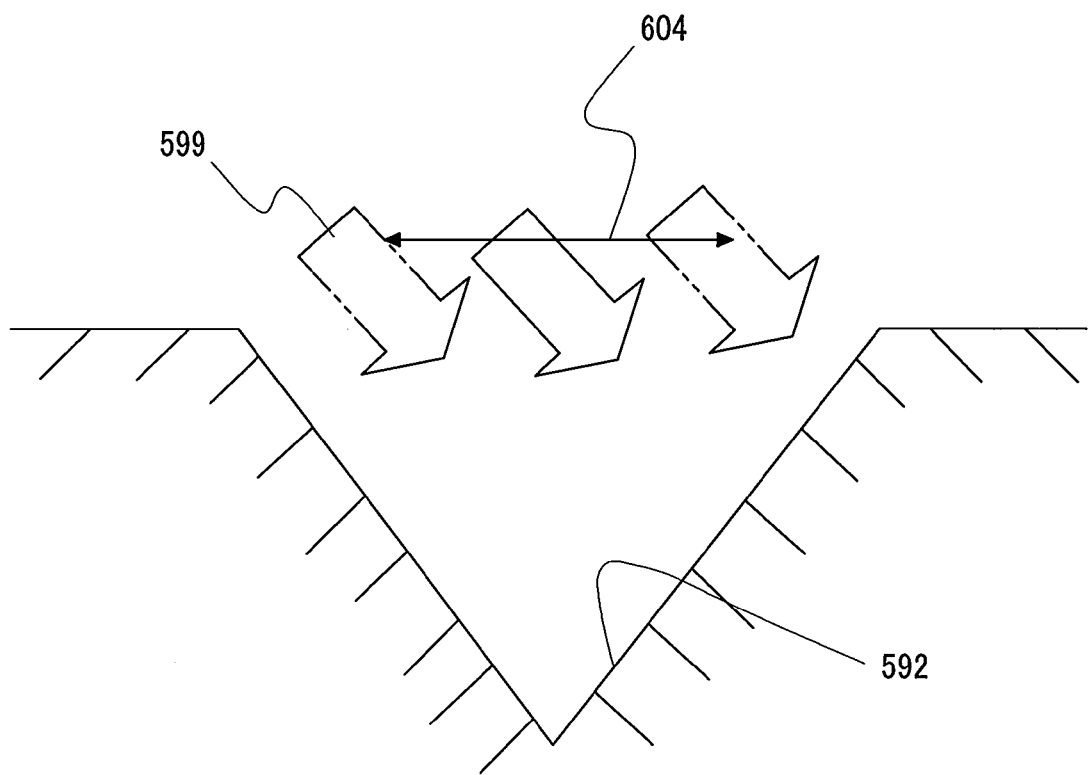
FIG. 34 shows a state where the beam is irradiated at scan intervals onto a processed hole after the micro sample has been extracted.
Figure 35A:
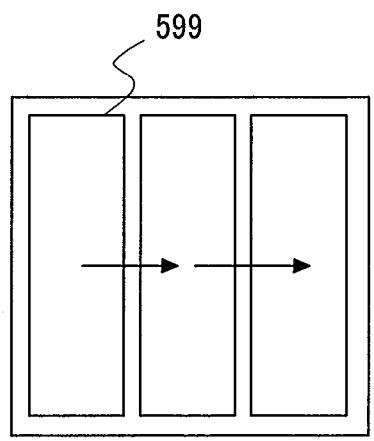
FIG. 35A shows another example of an irradiation method used in the course of hole fill processing.
Figure 35B:
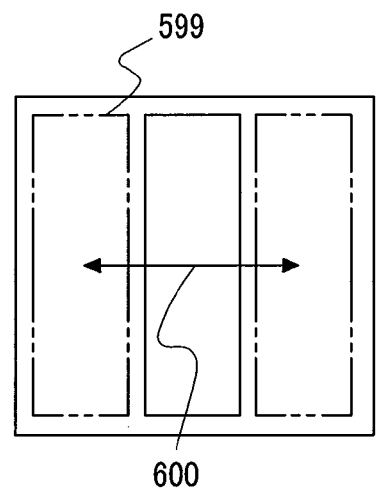
FIG. 35B illustrates a method of accumulating a deposition layer evenly at the processed hole by scanning the ion beam.

FIG. 34 shows a state where the O-500 beam 599 is irradiated at scan intervals 604 onto the processed hole 592 after the micro sample shown in FIG. 28(b) has been extracted. FIG. 35 shows another example of irradiation method of the ion beam 502 in course of hole fill processing. The example shown in FIG. 35(a) illustrates a method of sequentially forming a deposition layer one after another by retaining the ion beam 599 for a certain period of time, transposing it as much as the beam width, and repeating them. This method is called a beam retainment method. Meanwhile, the example shown in FIG. 35(b) illustrates a method of accumulating a deposition layer evenly at the processed hole 592 by scanning the ion beam 599. This method is called a scan method.

Figure 36A:
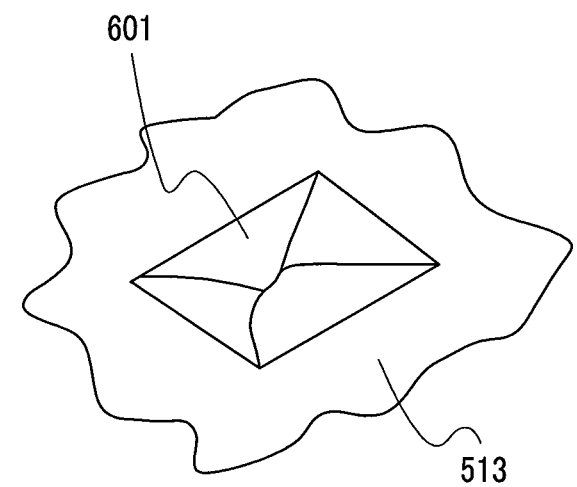
FIGS. 36A, 36B and 36C, shows the deposition progress as the accumulation of deposition layers progresses.
Figure 36B:
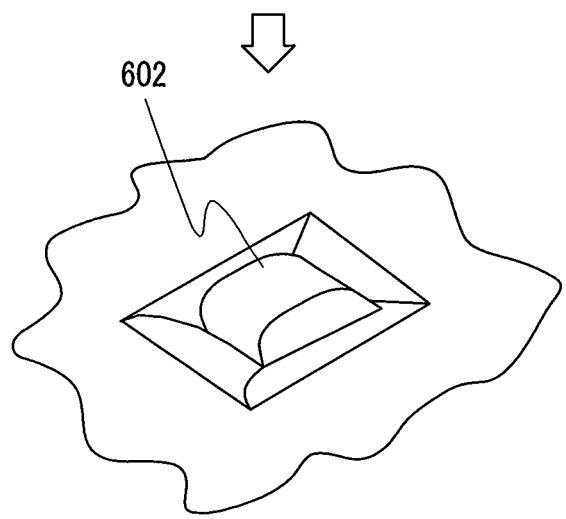
Figure 36C:
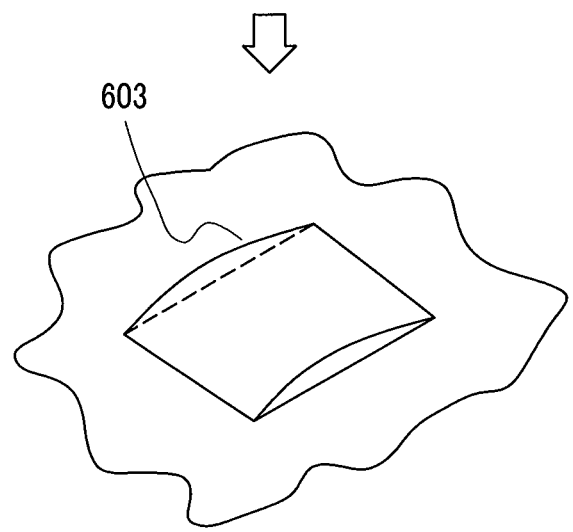
Figure 37A:
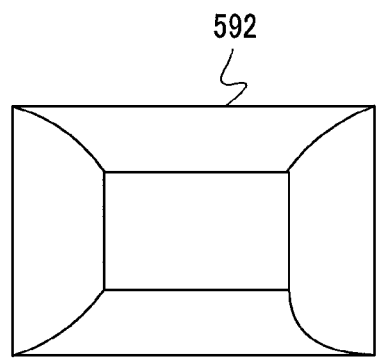
FIGS. 37A-37D, shows one example of techniques for measuring a height of the surface roughness of the fill deposition layer of the processed hole.
Figure 37C:
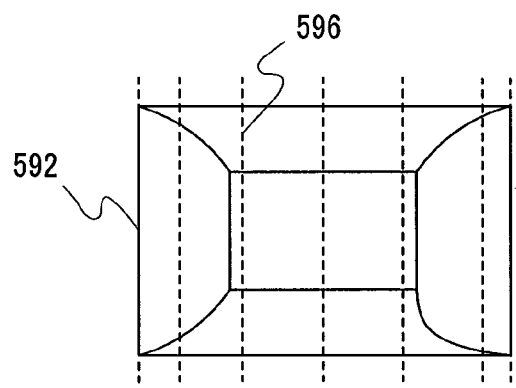
Figure 37B:
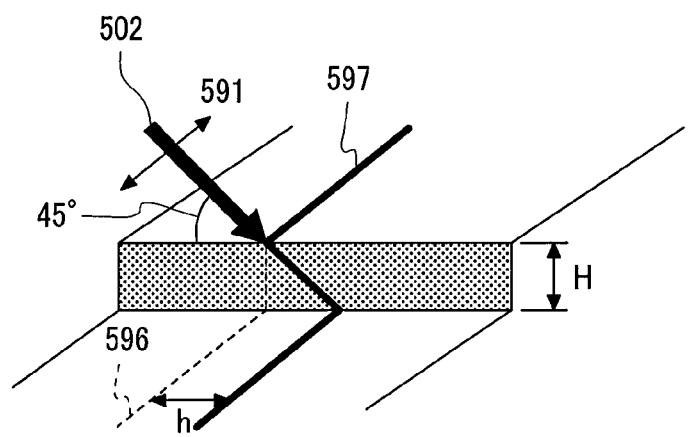
Figure 37D:
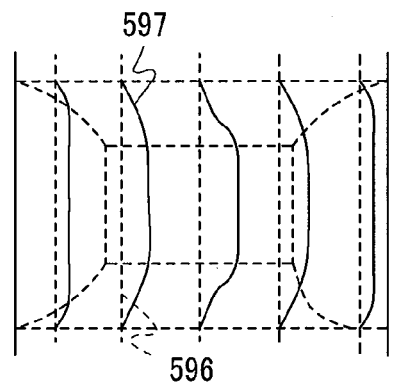

FIG. 36 shows the deposition progress time-variantly, and the accumulation of deposition layers progresses in order of FIG. 36(a)→FIG. 36(b)→FIG. 36(c).

FIG. 36(a) shows a state where the O-500 beam having passed through the aperture 550B via the step S209 is scanned (Deposition 1 by beam B), and a deposition layer 601 is formed at the processed hole 592. At this point, the center of the processed hole 592 is recessed. FIG. 36(b) shows a state where the ion beam having passed through the aperture 550C via the steps S210 through S213 is retained for several minutes (Deposition 2 by beam B) to superimpose the deposition layer 602 at the recessed part. Although a deeply recessed part was filled, a shallow part still remained. FIG. 36(c) shows a state where the circular ion beam having passed through the aperture 550D via the steps of S214 through S217 is scanned onto the recessed area (Deposition 3 by beam B), and a deposition layer 603 is superimposed at the recessed part. Therefore, according to this embodiment, the apertures of the projection mask 544 are switched so as to change the shape of an ion beam into a proper one as accumulation of the deposition layer proceeds. The deposition layer 603 has high flatness on the subnanometer order. Before the depositions 1, 2, and 3 by beam B, the projection mask 544 is position matched (S205, S210, and S214) to make the aperture 550E to fit within the beam diameter of the ion beam 502, respectively. While watching the SIM image by the ion beam 502 having passed through the aperture 550E, the operator determines the deposition area in the monitor screen 568 (S207, S211, and S215).

(12) Measurement of Flatness of Deposition Layer

FIG. 37 shows one example of techniques for measuring height of surface roughness of the filled deposition layer of the processed hole 592, which is executed in the step S218. In detail, FIG. 37(a) is a top plan view of a state after the processed hole 592 is filled by deposition. FIG. 37(b) shows a state where a circular beam 502 that is sufficiently thin with respect to the processed hole 592 is irradiated from the left hand side of the drawing onto the processed hole 592 at an incidence angle of about 45 degrees with respect to the surface of the sample 513, and scanned in the direction of an arrow 591. FIG. 37(c) shows a state that a scan line 596 of the ion beam 502 is matched with FIG. 37(a) and superimposed on the plan view of the processed hole 592. FIG. 37(d) shows a state where a machining (or processing) line 597 is further superimposed on the plan view of the processed hole 592 after the hole fill processing.

As can be seen from FIG. 37(*a*), the center of the processed hole 592 with a membrane being deposited thereon is swollen, and a minute step height is formed on the deposition layer. For instance, as shown in FIG. 37(*b*), suppose that there is a bump with a height (H) on the deposition layer. In this case, if the ion beam 502 is irradiated at an incidence angle of 45 degrees, a misalignment (h) of an approximately equivalent amount to the height (H) of the bump is created at the processing line 597 with respect to the bump. In other words, when a misalignment amount (h) is detected between the processing line 597 and the scan line 596, the amount of the step height (H) of the deposition layer can be calculated from the incidence angle of the ion beam 502 onto the sample surface. Meanwhile, the misalignment amount (h) is given automatically by image processing at an image recognition apparatus. Through the recognition of the misalignment amount (h), it becomes possible to detect the recessed area, recessed location, and recessed depth of the deposition layer. Using this detection information, the operator decides proper deposition conditions from a prestored database in the central processing unit 510, and carries out deposition. Deposition conditions mentioned here include the kind of a beam used, shape or size of an ion beam (kind of aperture in the mask 544), ion beam current value (accelerating voltage, bias voltage, etc.), scan direction, scan area, machining time, beam residence time, scan interval, and so on.

Besides the above, one may consider installing a measuring instrument to measure surface roughness of the deposition layer. Examples of such measuring instrument include a laser microscope with submicrometer resolution, an atomic force microscope with resolution of several nanometers, and so forth. These microscopes scan a laser beam and a cantilever, respectively, to give a three-dimensional measurement on the surface roughness of the deposition layer.

Following the flatness measurement of the deposition layer, it is decided whether the flatness being measured is below a predetermined threshold range (S219). If it is within the range, the step S214 is repeated to execute "Deposition 3 by beam B" (the flow B in FIG. 19B). However, if it is below the threshold range, it is decided from the sample extraction work history whether this is going to be the last hole fill processing (S220). That is, it is decided whether the sample 513 currently being in course of the hole fill processing has any additional holes to be filled up. If there are more holes to be filled up, the step of hole fill processing is repeated (the flow C in FIG. 19B). In this case, the procedure starts from the step S205 to execute "Deposition 1 by beam B". On the contrary, if there are no more holes to be filled up, the hole fill processing procedure of FIG. 19B ends.

The following will now explain the application effects of this embodiment.

Figure 38A:
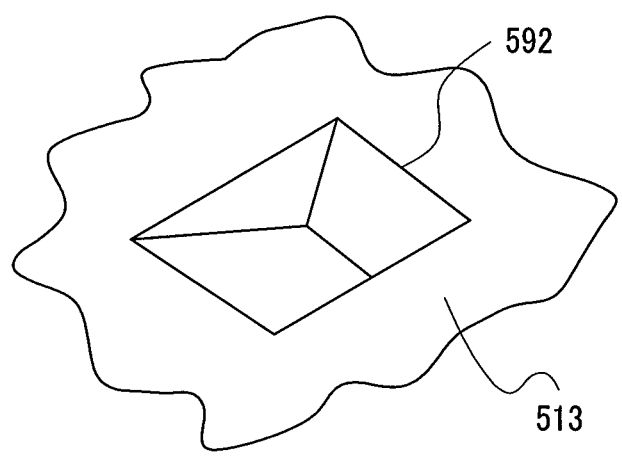
FIGS. 38A-38C, shows the processed hole being filled up by an oxygen ion beam.
Figure 38B:
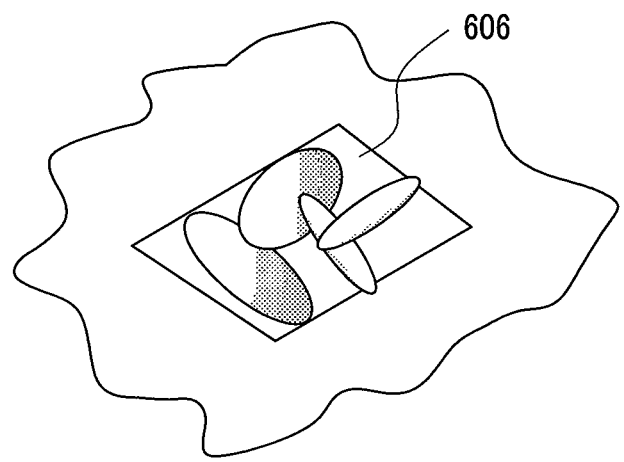
Figure 38C:
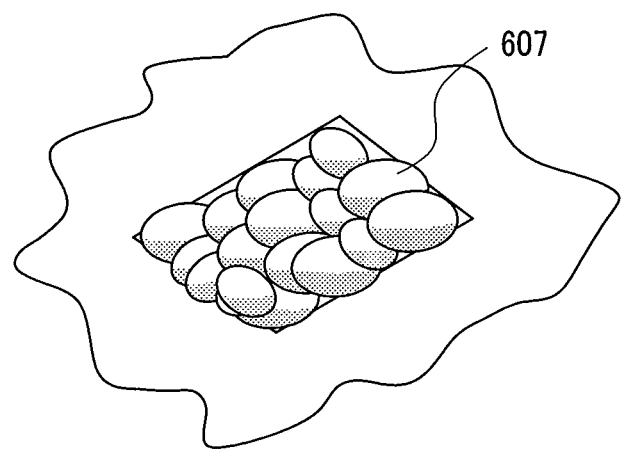

FIG. 38 is a schematic view of a processed hole being filled up by an oxygen ion beam (beam A). In detail, FIG. 38(*a*) shows a processed hole 592 prior to the hole fill processing, FIG. 38(*b*) shows the mark of a filled hole that is deposited by ion beam retainment, and FIG. 38(*c*) shows the mark of a filled hole that is deposited by scanning.

The ion beam retainment produces a lump deposition 606 of several micrometers on the sample surface (FIG. 38(*b*)), while the scanning produces a globular deposition 607 of several micrometers on the sample surface (FIG. 38(*c*)). Neither method failed to achieve submicrometer flatness. From this result, the inventors of this patent application assumed that flatness of the deposition layer is attributed to the kind of a beam, rather than to a deposition method (ion beam retainment method or scanning method), so they formed a deposition layer by using a different kind of a beam and conducted a composition analysis on the deposition layer by Auger electron spectroscopy.

Figure 39A:
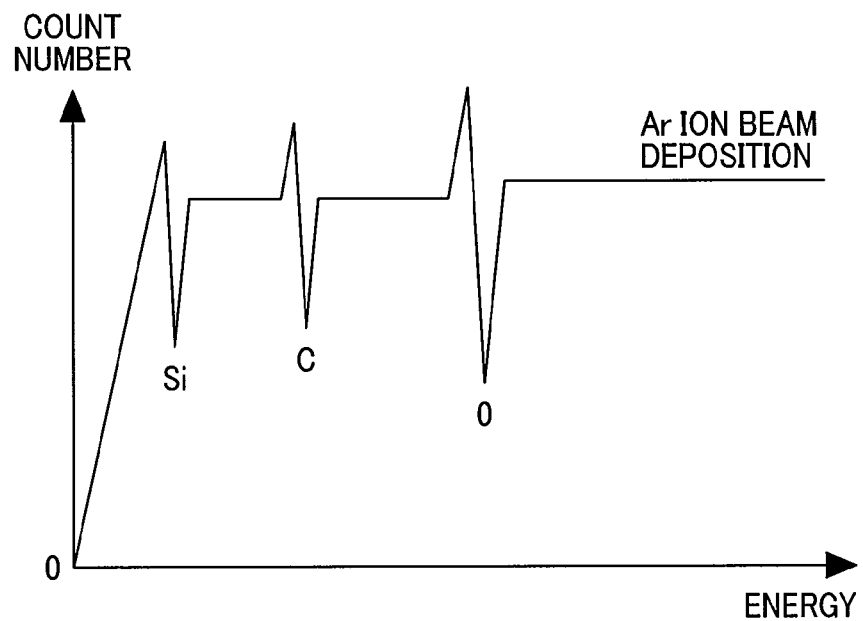
FIGS. 39A, 39B shows a comparison between Auger electron spectroscopy analysis results between a deposition layer by an oxygen ion beam (FIG. 39B) and a deposition layer by an argon ion beam (FIG. 39A)
Figure 39B:
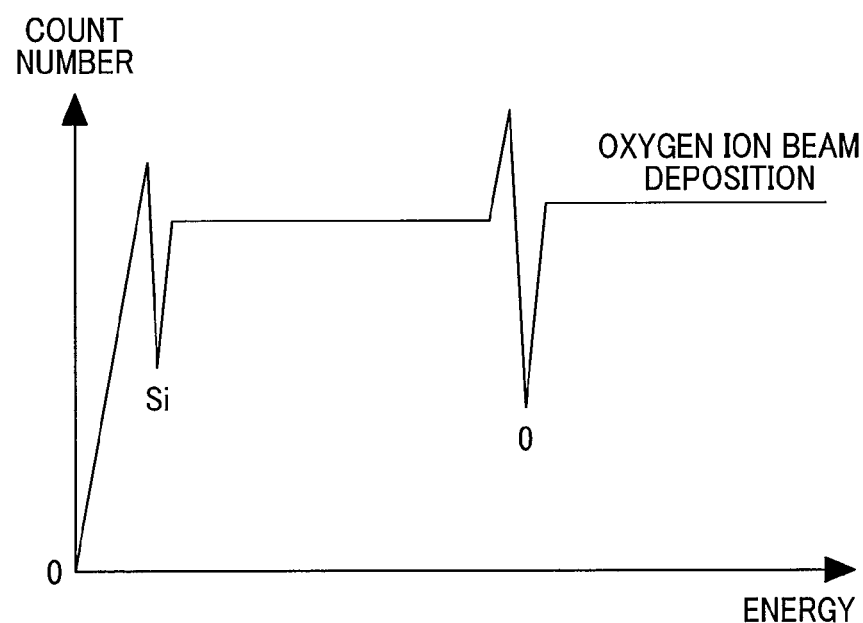

FIG. 39 graphically compares Auger electron spectroscopy analysis results between a deposition layer by an oxygen ion beam and a deposition layer by an argon ion beam.

For a test, ortho-tetraethyl silicate (TEOS) was commonly used as GAD gas, and an oxygen ion beam and an argon ion beam were selected as beam kinds to be compared. It turned out that the deposition layer formed by using the oxygen ion beam has a flatness on the order of several micrometers, which is not good. Meanwhile, the deposition layer formed by using the argon ion beam achieved an improved flatness of a satisfactory level. As shown in FIG. 39, two disposition layers had a similar composition, but carbon was detected only from the deposition layer with an excellent flatness formed by using an argon ion beam.

From this result, the inventors of this patent application discovered that there is a certain relationship between composition and shape of a deposition layer, and that a deposition layer with a desired flatness level can be obtained by forming the deposition layer with a properly selected kind of an ion beam.

However, the aforesaid composition analysis test also revealed that the processing on the deposition layer formed by using the oxygen ion beam was done at high speed although the deposition layer did not achieve a sufficient flatness level. On the other hand, in case of forming a deposition layer by using the argon ion beam, a beam current value was lowered and thereby the processing speed was reduced compared with the oxygen ion beam. From this, comparing the oxygen ion beam with the argon ion beam, the inventors believed that the argon ion beam is suitable for the hole fill processing where the flatness of a deposition layer is appreciated, while the oxygen ion beam featuring a high processing speed is suitable for the hole machining where the processing speed is valued over the flatness level.

Based on this discovery, the inventors thought of installing a gas supply system 507, and stop valves 523A and 523B as switching means of charged particle beam material gases from the gas supply system 507, whereby the kind of a charged particle beam material gas to be introduced to an ion source 501 for the hole machining operation on a sample 513, the operation including the extraction of a micro sample 581, can be switched with the kind of a charged particle beam material gas to be introduced to the ion source 501 for the layer deposition operation including the hole fill processing. Therefore, according to this embodiment, in a sequential procedure of extracting a defect region of a sample and returning the sample from which the defect region has been extracted to the (production) line, since the high-speed hole processing is compatible with the high flatness of the surface of a deposition layer in the hole fill processing is done, the manufacturing yield can be improved.

Moreover, the bypass valve 518 facilitates gas discharge from the ion source 501, so the kind of a charged particle beam material gas as the ion beam generating source can be switched within short time. Also, by installing the vacuum gauge 536 measuring pressure inside the ion source 501, the operator can see that the measurement result is below the predetermined threshold and verifies the end of gas discharge from the ion source 501. Thus, as the charged particle beam material gas to be used next is introduced to the ion source 501, the influence of the remaining, previously used charged particle beam material gas on the processing (or machining) performance can be suppressed.

Suitable plasma generating conditions (e.g., accelerating voltage, discharge voltage, bias voltage, vacuum level, etc.) according to the kind of charged particle beam material gas, or suitable processing optical conditions (e.g., applied voltage to each lens, etc.) are prestored in the database, and the central processing unit 510 changes them automatically based on the database whenever the gas kind is to be switched. Accordingly, even if the kind of the charged particle beam material gas is set to change depending on work, since it takes no time to set the plasma generating conditions or the processing optical conditions, high work efficiency can be ensured.

By installing the means for measuring surface roughness (height) of the deposition layer while the processed hole is being filled, it becomes possible to measure the surface roughness of the deposition layer in the course of the hole fill processing, and recognize whether there is any area (insufficient portion) short of a predetermined deposition height. If so, its height is measured, and, based on the height measurement result, the central processing unit 510 selects proper deposition conditions (for example, beam shape, scan method, beam irradiation condition, etc.) from the prestored database, to cause a deposition layer to be superimposed at the insufficient portion under the proper deposition conditions. As such, compared to the case where the operator decides to superimpose the deposition layer after he watches an observation image by the naked eye, good flatness of the deposition layer is ensured, irrespective of the operator's ability.

In particular, this embodiment uses the projection mask 544 to perform the machining by the ion beam 502, high-speed hole machining or high-speed hole fill processing can be achieved. Traditionally, when a sample cross section was machined by using the FIB device, an ion beam being converged on the submicron order was electrostatically deflected and scanned onto a target position of the sample. Meanwhile, according to this embodiment, a projection ion beam that passed through a mask aperture of a suitable shape corresponding to the machining purpose is irradiated to process a sample.

The machining (or processing) speed by an ion beam is roughly determined by beam charges irradiated onto a target processing area. That is to say, although the target processing area may be large, PJIB, compared to FIB, can be machined within a short period of time. In general, the processed hole is several micrometers in size, so if the ion beam used for PJIB has brightness below a certain, fixed value, PJIB can be machined or processed at high speed.

However, it is also possible to scan FIB and perform the hole machining and the hole fill processing while the projection mask 544 is being retreated.

Embodiment 5

Another embodiment of the present invention will be described below.

Figure 40:
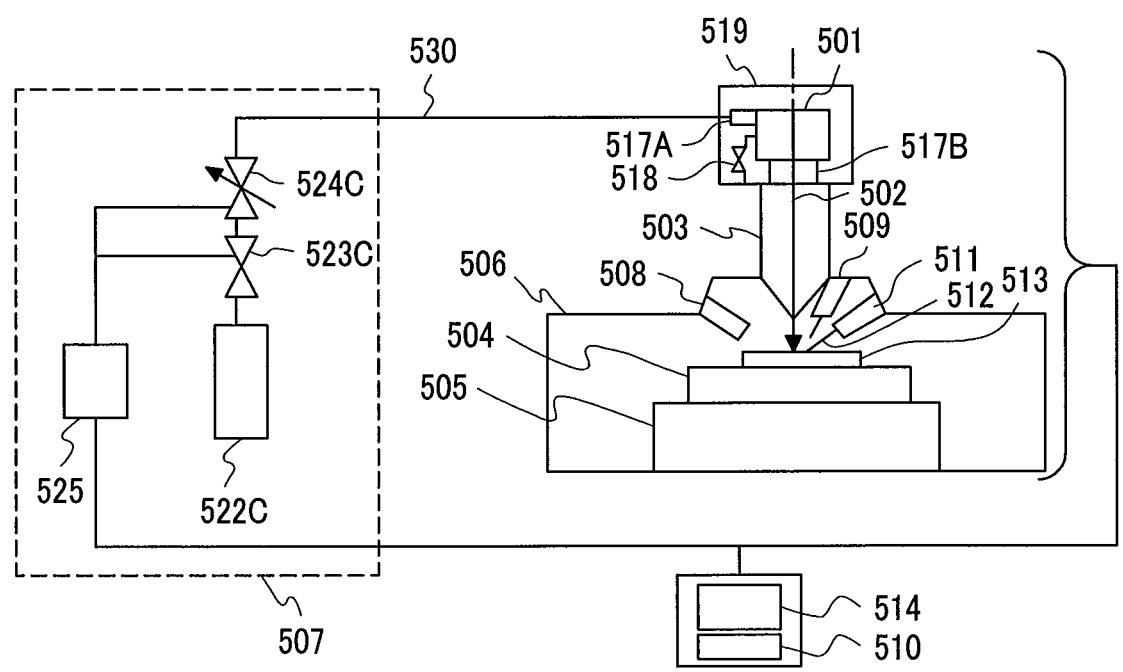
FIG. 40 is a schematic view of a charged particle beam processor according to another embodiment of the present invention.

FIG. 40 is a schematic view of a charged particle beam processor according to another embodiment of the present invention. In FIG. 40, like components or the components with the same roles as those of the previous drawing are designated by the same reference numerals, and therefore the explanation of those components will be omitted hereafter.

In this embodiment, the kind of a charged particle beam material gas is not switched by work, but charged particle beam material gases of different kinds according to work nature are introduced to an ion source 501 at the same time. To be more specific, a charged particle beam material gas kind (e.g., oxygen gas) suitable for hole machining of a sample 513 including the extraction of a micro sample 581, and a charged particle beam material gas kind (e.g., argon gas) suitable for layer deposition including sample 513 hole fill processing are introduced to the ion source 501 through a gas inlet tube 530 at the time of hole machining and layer deposition, so ion beams 502 are generated based on the plural kinds of charged particle beam material gases. That is, for example, oxygen gas and argon gas are introduced simultaneously to the ion source 501, and a mixed gas of both is used as an ion beam generating source. Consequently, an ion beam with intermediate natures of both oxygen ion beam and argon ion beam is produced.

Here, plural gas cylinders filled with different kinds of charged particle beam material gases respectively may be prepared to introduce the plural kinds of charged particle beam material gases to the ion source 501 at the same time, or a gas cylinder filed with a mixed gas prepared in advance by mixing different kinds of charged particle beam material gases may be prepared to introduce the mixed gas to the ion source 501. FIG. 40 illustrates a case where the ion source 501 receives a mixed gas from a gas cylinder 522C that is filled with a gas for high-speed machining (e.g., oxygen gas, etc.) and a homogeneous gas for the deposition layer (e.g., argon gas, etc.) mixed at a certain ratio. The mixed gas from the gas cylinder 522C is either cut off or circulated by a stop valve 523C, and its flow volume rate is controlled by a flow control valve 524C. Here, the stop valve 523C or the flow control valve 524C have the same roles or control functions as the stop valves 523A and 523B and the flow control valves 524A and 524B of the previous embodiments.

Also, the mixture ratio of different kinds of charged particle beam material gases is given by previous experiments to a condition for optimizing (proper balance) the ion beam stability, hole machining performance, hole fill performance, and the like.

In the previous embodiments, when the job is switched from hole machining to hole fill processing for example, the charged particle beam material gas in the ion source 501 had to be substituted and replaced. In this embodiment, however, a mixed gas of the charged particle beam material gas used for hole machining and the charged particle beam material gas used for hole fill processing is used for both hole machining and hole fill processing, so there is no need to substitute the charged particle beam material gas. Therefore, the amount of time it takes to fulfill the work can be shortened as much as the amount of time it takes to substitute the charged particle beam material gas.

Figure 41:
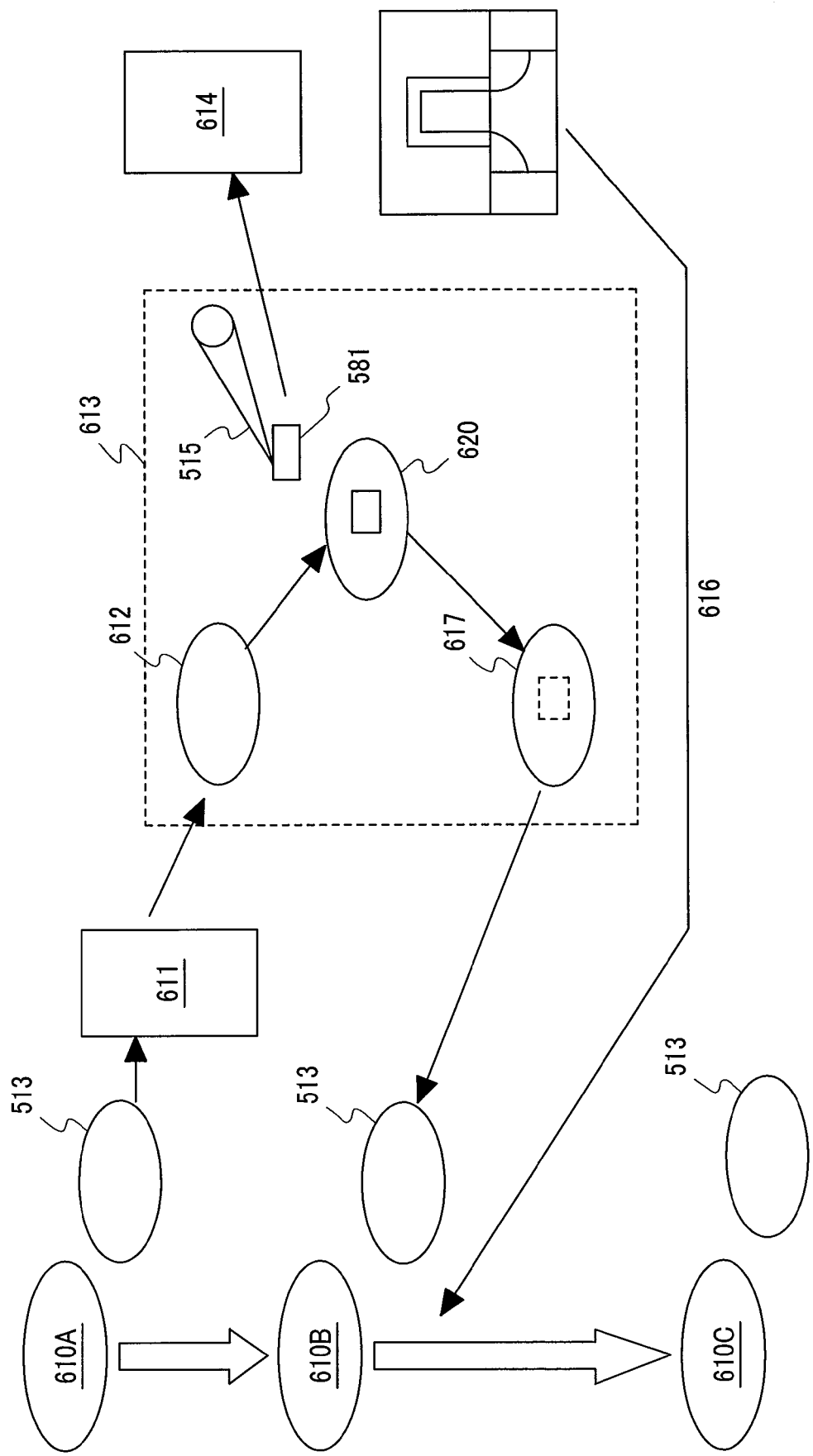
FIG. 41 is a schematic view showing one example of an in-line defect analysis procedure diagram using a charged particle beam processor of the present invention.

FIG. 41 is a schematic view showing one example of the in-line defect analysis flow by using a charged particle beam processor of the present invention explained so far.

In FIG. 41, reference numeral 613 designates a charged particle beam processor of the present invention, and the processing 110A, 110B, and 110C are part of the semiconductor production line. For instance, starting from the processing 110A, part of the sample 513 is taken out, and an optical or electron beam type inspection device (review SEM) 611 inspects defects and classify extracted defects. Next, the sample 612 including a defect region is brought into the charged particle beam processor 613. As aforementioned, the SEM built in the charged particle beam processor 613 locates the defect region through coordinate linkage with the inspection device 611, and a micro sample 581 having the defect region is extracted by the probe 515. The micro sample 581 is processed to a membrane by FIB, and taken out of the charged particle beam processor in form of cartridge. This micro sample 581 is then observed and analyzed by another inspection device (STEM or TEM) 614, and the analysis result (i.e. estimation of the causes of defects) is fed backed to the semiconductor production line (refer to an arrow 616). Meanwhile, a sample 620 having a processed hole through which the micro sample 518 has been extracted undergoes the hole fill processing, and a hole-filled sample 617 is returned to the processing 110B after the sample 513 extraction processing 110A. Therefore, by returning the sample after the hole fill processing back to the production line, waste in resources can be reduced.

While the present invention has been described with respect to the specific embodiments, it will be apparent to those skilled in the art that various changes and modifications may be made without departing from the spirit and scope of the invention as defined in the following claims.

What is claimed is:

1. A sample cross section observation method, where a gas ion beam emitted from an ion source capable of generating at least two or more kinds of gas ions with different mass numbers is irradiated onto a sample, comprising the steps of:
    irradiating a gas ion having a relatively large mass number among at least the two or more kinds of gas ions, so as to form a roughly vertical cross section to the surface of a sample; and
    irradiating a gas ion having a relatively small mass number onto the cross section to be observed.

2. The method of claim 1, wherein, for cross sectional observation, the ion with a relatively small mass number is irradiated at a lower current than a maximum current used for irradiating the ion with a relatively large mass number.

3. The method of claim 1, further comprising the steps of:
    simultaneously generating at least two kinds of gas ions by the ion source;
    mass-separating at least the two kinds of gas ions with different mass number from each other and irradiating a gas ion beam having a relatively large mass number onto a sample to process a roughly vertical cross section to the sample surface; and
    changing mass-separating conditions to irradiate a gas ion beam having a relatively small mass number onto the cross section to be observed.

4. The method of claim 1, wherein the ion having a relatively large mass number is a gas ion containing at least any one of argon, xenon, krypton, neon, oxygen, and nitrogen, while the ion having a relatively small mass number is either a hydrogen gas ion or a helium gas ion, or a mixed gas ion.

5. An ion beam machining and observation method, where a gas ion beam emitted from a gas field ion source having a vacuum chamber and a gas supply mechanism to introduce gas into the vacuum chamber and generating gas ions in the vacuum chamber is irradiated onto a sample, and where the gas supply mechanism includes at least two gas introduction systems, each system having a gas cylinder, a gas volume control valve, and a stop valve, and a gas switching control unit, comprising:
    switching, by the gas switching control unit, a kind of gas introduced into the vacuum chamber by the stop valve of each system and setting gas pressure conditions for the vacuum chamber by the gas volume control valve of each system; and
    forming a pyramid structure of atoms at an apex of an emitter tip of the gas field ion source when the gas switching control unit switches a kind of gas being introduced into the vacuum chamber by the stop valve of each system.

6. The ion beam machining and observation method according to claim 5,
    wherein the gas switching control unit can switch between a gas ion beam used for machining the sample and a gas ion beam used for observing the sample, and the gas ion beam of neon, argon, krypton or xenon is used for machining the sample.

7. The ion beam machining and observation method according to claim 5,
    wherein the gas switching control unit can switch between the kind of a gas ion beam used for machining the sample and the kind of a gas ion beam used for observing the sample, and the gas ion beam of neon, argon, krypton or xenon is used for machining the sample.

8. The ion beam machining and observation method according to claim 7,
    wherein the gas switching control unit switches to a hydrogen or helium ion beam on observing the sample.

9. The ion beam machining and observation method according to claim 5, further comprising:
    setting conditions of the amount of gas volume introduced into the vacuum chamber by a needle valve of each system; and
    regulating, by a needle valve of the gas introduction system, an amount of gas volume flowing into the vacuum chamber.

10. The ion beam machining and observation method according to claim 9, wherein the gas supply mechanism includes a first gas introduction system which has a first gas tube connected between the vacuum chamber and a first needle valve and which introduces the kind of gas ion beam used for machining the sample, and a second gas introduction system which has a second gas tube connected between the vacuum chamber and a second needle valve and which introduces the kind of gas ion beam used for observing the sample.

11. An ion beam machining and observation method, where a gas ion beam emitted from a gas field ion source having a vacuum chamber and a gas supply mechanism to introduce gas into the vacuum chamber and generate gas ions in the vacuum chamber is irradiated onto a sample, and where the gas supply mechanism includes at least two gas introduction systems, each system having a gas cylinder, a gas volume control valve, and a stop valve, and a gas switching control unit, comprising:
    forming a pyramid structure of atoms at an apex of an emitter tip of the gas field ion source; and
    evaporating the pyramid structure at the apex of the emitter tip of the gas field ion source when the gas switching control unit switches the kind of gas being introduced into the vacuum chamber by the stop valve of each system.

* * * * *